(12) United States Patent
Hatakeyama et al.

(10) Patent No.: US 7,459,261 B2
(45) Date of Patent: Dec. 2, 2008

(54) RESIST COMPOSITION AND PATTERNING PROCESS USING THE SAME

(75) Inventors: Jun Hatakeyama, Niigata (JP); Youichi Ohsawa, Niigata (JP); Seiichiro Tachibana, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 245 days.

(21) Appl. No.: 11/305,118

(22) Filed: Dec. 19, 2005

(65) Prior Publication Data

US 2006/0147836 A1    Jul. 6, 2006

(30) Foreign Application Priority Data

Jan. 6, 2005    (JP) .............................. 2005-001426

(51) Int. Cl.
*G03F 7/039* (2006.01)
(52) U.S. Cl. ..................... 430/270.1; 430/311; 430/319; 430/325; 430/326; 430/905; 430/910; 430/914; 430/921; 430/925
(58) Field of Classification Search .............. 430/270.1, 430/281.1, 285.1, 286.1, 913, 914, 921, 925, 430/942, 311, 319, 325, 326, 905, 910
See application file for complete search history.

(56) References Cited

U.S. PATENT DOCUMENTS

| | | | | |
|---|---|---|---|---|
| 5,130,392 | A | * | 7/1992 | Schwalm et al. ............. 526/288 |
| 6,673,511 | B1 | * | 1/2004 | Hatakeyama et al. .... 430/270.1 |
| 2002/0182541 | A1 | * | 12/2002 | Gonsalves ............... 430/287.1 |
| 2005/0014090 | A1 | * | 1/2005 | Hirayama et al. ......... 430/270.1 |

FOREIGN PATENT DOCUMENTS

| | | |
|---|---|---|
| JP | A 4-230645 | 8/1992 |
| JP | A 2000-34272 | 2/2000 |
| JP | A 2002-6481 | 1/2002 |
| JP | 2003-171363 * | 6/2003 |
| JP | A 2005-84365 | 3/2005 |
| WO | WO 2004/074242 A2 | 9/2004 |

OTHER PUBLICATIONS

Dammel et al; "193 nm Immersion Lithograph—Taking the Plunge"; Journal of Photopolymer Science and Technology; vol. 17; No. 4 (2004); pp. 587-601.

Gonsalves et al.; "High Resolution Resists for Next Generation Lithography: The Nanocomposite Approach"; Mat. Res. Sco. Symp. Prov.; vol. 636; 2001 Materials Research Society; 12 pp.

* cited by examiner

*Primary Examiner*—Sin J. Lee
*Assistant Examiner*—Anca Eoff
(74) *Attorney, Agent, or Firm*—Oliff & Berridge, PLC

(57) ABSTRACT

There is disclosed a resist composition which comprises, at least, a polymer in which a sulfonium salt having a polymerizable unsaturated bond, a (meth)acrylate having a lactone or a hydroxyl group as an adhesion group, and a (meth)acrylate having an ester substituted with an acid labile group are copolymerized. There can be provided a resist composition with high resolution which has high sensitivity and high resolution to high energy beam, especially to ArF excimer laser, $F_2$ excimer laser, EUV, X-ray, EB, etc., has reduced line edge roughness, and comprises a polymeric acid generator which has insolubility in water, and sufficient thermal stability and preservation stability.

12 Claims, No Drawings

RESIST COMPOSITION AND PATTERNING PROCESS USING THE SAME

BACKGROUND OF THE INVENTION

1. Field of the Invention

The present invention relates to
(1) a polymeric sulfonium salt as an acid generator,
(2) a resist composition comprising (1), used in exposure to high energy beam, preferably with a wavelength of 300 nm or 200 nm or less, especially to ArF excimer laser, $F_2$ excimer laser, EUV, X-ray or EB, and
(3) a patterning process using this resist composition.

2. Description of the Related Art

In recent years, higher integration and higher speed of LSI have been developed, and finer pattern rule has been demanded. Then, Deep-ultraviolet lithography and vacuum ultraviolet lithography are regarded as possible micropatterning technique of next generation. Especially, photolithography using ArF excimer laser light as a light source is an indispensable technique for ultra micropatterning of 0.13 μm or less.

In the photolithography using ArF excimer laser light as a light source, in order to prevent deterioration of delicate and expensive optical equipment, a resist composition with high sensitivity that realizes sufficient resolution with low exposure dose has been demanded. The most common way to realize such a resist composition with high sensitivity is to select respective constituents that has high transparency at the wavelength of 193 nm. For example, as for a base resin, polyacrylic acid and derivatives thereof, norbornene-maleic anhydride alternating copolymer, polynorbornene, metathesis ring-opening polymer, etc. are suggested. And the suggestion has achieved some results in respect to increasing transparency of a resin itself.

ArF lithography has begun to be used partially since device fabrication at 130 nm node, and has become the main lithography technique since 90 nm node device. 157 nm lithography using $F_2$ laser was originally regarded as possible lithography technique of next 45 nm node. However, delay of development was pointed out due to problems like the quality of a $CaF_2$ single crystal used for a projection lens, design change of optical system owing to indispensable use of hard pellicle, and deterioration of etch resistance of a resist. Therefore, the ArF liquid immersion lithography has suddenly gathered attention (for example, see Journal of photopolymer Science and Technology Vol. 17, No. 4, p587 (2004)).

The more numerical aperture (NA) of a projection lens projecting image of pattern onto a substrate grows, the more resolution thereof increases. In the liquid immersion lithography, a gap between a projection lens and a wafer is filled with a liquid with a higher index of refraction than that of air to design NA of the projection lens to be 1.0 or more, thus high resolution can be achieved. As for the liquid, water with an index of refraction of 1.4366 has been under review.

However, there are problems that resist pattern obtained through the liquid immersion exposure and development is collapsed or becomes T-top profile. Therefore, a patterning process that can obtain an excellent resist pattern after development in the liquid immersion lithography has been demanded.

SUMMARY OF THE INVENTION

The present invention has been accomplished to solve the above-mentioned problems, and a main object of the present invention is to provide a resist composition with high resolution which has high sensitivity and high resolution to high energy beam, especially to ArF excimer laser, $F_2$ excimer laser, EUV, X-ray, EB, etc., has reduced line edge roughness, and comprises a polymeric acid generator suitable for the liquid immersion lithography because of insolubility in water, and a patterning process using the resist composition.

To achieve the above object, the present invention provides a resist composition which comprises, at least, a polymer in which a sulfonium salt having a polymerizable unsaturated bond, a (meth)acrylate having a lactone or a hydroxyl group as an adhesion group, and a (meth)acrylate having an ester substituted with an acid labile group are copolymerized.

In this case, it is preferable that the repeating unit which is formed by polymerizing the sulfonium salt having a polymerizable unsaturated bond is represented by the following general formula (1),

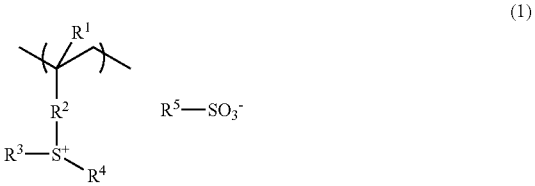

wherein $R^1$ represents a hydrogen atom or a methyl group, $R^2$ represents any one of a phenylene group, —O—$R^6$—, —C(=O)—$X^1$—$R^6$—, —C(=O)—O—$C_2H_4$—O—$Y^1$—, —C(=O)—O-$Z^1$-C(=O)—$CH_2$—, -$Z^1$-C(=O)—$CH_2$—, —C(=O)—O-$Z^1$-$CH_2$—, —C(=O)—O—$CH_2$—C(=O)—O-$Z^1$- and —C(=O)—O—$C_2H_4$—C(=O)—O-$Z^1$-, $X^1$ represents an oxygen atom or NH, $R^6$ represents a linear, branched or cyclic alkylene group having 1-6 carbon atoms or a phenylene group which may contain a carbonyl group, an ester group or an ether group, $Y^1$ represents any one of a phenylene group, a naphthylene group, and an anthrylene group, $Z^1$ represents a phenylene group, $R^3$ and $R^4$ each independently represents a linear, branched or cyclic alkyl group having 1-12 carbon atoms which may contain a carbonyl group, an ester group or an ether group, an aryl group having 6-12 carbon atoms, an aralkyl group having 7-20 carbon atoms or a thiophenyl group, or $R^3$ and $R^4$ may bond each other to form a ring, $R^5$ represents a linear, branched, cyclic or cyclic-structure-containing alkyl group or alkenyl group having 4-20 carbon atoms in which some or all of hydrogen atoms are substituted with a fluorine atom and in which may contain one or more of a benzene ring or an ether group, or an aryl group having 4-20 carbon atoms in which some or all of hydrogen atoms are substituted with a fluorine atom.

Such a resist composition comprising the polymer according to the present invention has high sensitivity and high resolution to high energy beam, especially to ArF excimer laser, $F_2$ excimer laser, EUV, X-ray, EB, etc., has reduced line edge roughness, and comprises a polymeric acid generator with insolubility in water, sufficient thermal stability and preservation stability. Moreover, the resist composition has a high adhesion property with substrate because a (meth)acrylate having a lactone or a hydroxyl group as an adhesion group is copolymerized. Furthermore, a (meth)acrylate having an ester substituted with an acid labile group is copolymerized, and a system in which acid generated from an acid generator upon exposure deprotects an acid deprotection group is utilized to form a pattern with high precision. Therefore, the resist composition is suitable as a micropatterning material for the VLSI manufacture etc. using high energy beam, especially it is preferably used as a resist composition used for the ArF liquid immersion lithography.

In these cases, it is preferable that the resist composition according to the present invention is a chemically amplified positive resist composition.

As described above, the resist composition comprising the polymer contains a polymeric acid generator, and acid generated from the acid generator upon exposure deprotects an acid deprotection group to change an exposed area of resist to dissolve in a developer. Thus, a chemically amplified positive resist composition that can form pattern with extremely high precision can be obtained.

In these cases, the resist composition according to the present invention can further contain any one of or more of an organic solvent, a basic compound and a dissolution inhibitor.

As described above, by further adding an organic solvent, for example, an application property of the resist composition to a substrate etc. can be improved. A diffusion rate of acid in a resist film can be suppressed and resolution can be further improved by adding a basic compound. Difference of a dissolution-rate between an exposed area and a non-exposed area can be further increased and resolution can be further improved by adding a dissolution inhibitor.

Such a resist composition of the present invention can be used in a patterning process comprising, at least, a step of applying the resist composition on a substrate, a step of exposing the applied resist composition to high energy beam after heat-treatment, and a step of developing the exposed resist composition by using a developer.

It is natural that development may be conducted after heat treatment following exposure, and other various processes, such as an etching process, a resist removing process, a washing process, etc. may be performed.

In these cases, it is possible that in the step of exposing the applied resist composition to high energy beam, an ArF excimer laser with a wavelength of 193 nm is used as a light source, a gap between the substrate on which the resist composition is applied and a projection lens is filled with a liquid, and liquid immersion exposure in which the substrate is exposed through the liquid is performed.

The resist composition of the present invention has high sensitivity and high resolution to ArF excimer laser light, has reduced line edge roughness, and contains a polymeric acid generator with insolubility in water, sufficient thermal stability and preservation stability. Accordingly, if the resist composition is used as a patterning material in the ArF liquid immersion lithography, a resist pattern with high precision can be obtained without deterioration of pattern formation.

As described above, the present invention provides a resist composition which has high sensitivity to high energy beam, especially to ArF excimer laser, $F_2$ excimer laser, EUV, X-ray, EB, etc., and which has high resolution, a reduced size difference between isolated pattern and congested pattern, and a reduced line edge roughness. And also, because generated acid is entirely insoluble in water, deformation of pattern formation is hardly observed even in immersed exposure (liquid immersion exposure). Thereby, a resist composition which is extremely useful for a precise ultra-fine processing can be obtained.

DESCRIPTION OF THE INVENTION AND A PREFERRED EMBODIMENT

Hereafter, an embodiment of the present invention will be explained, but the present invention is not limited thereto.

In recent years, higher integration and higher speed of LSI have been developed, and finer pattern rule has been demanded. Then, deep-ultraviolet lithography and vacuum ultraviolet lithography are regarded as possible micropatterning technique of next generation. Especially, photolithography using ArF excimer laser light as a light source is an indispensable technique for ultra micropatterning of 0.13 μm or less.

Among the photolithography using ArF excimer laser light as a light source, the ArF liquid immersion lithography has gathered attention. The liquid immersion lithography achieves high resolution by exposing with filling a gap between a projection optical system and a substrate with a liquid. However, there are problems that resist pattern obtained through the liquid immersion exposure and development is collapsed or becomes T-top profile.

Then, the immersion liquid was analyzed and it was confirmed that anion generated by an acid generator or photolysis of an acid generator dissolved into water. Against this cause, applying an overcoat for resist has been suggested to prevent dissolution of anion generated by an acid generator or photolysis of an acid generator into water. The process using the overcoat has come to be viable due to development of an overcoat for resist with which development can be performed. However, some device makers are reluctant to add the process step for attaching the overcoat, thus improvement of resist has been demanded not to use an overcoat. Therefore, development of an acid generator and anionic type that don't dissolve into water has been demanded.

Meanwhile, a resist with high sensitivity and high resolution has been demanded in EB or EUV lithography. It is effective to add a large amount of an acid generator with high efficiency of acid generation to a resist with high sensitivity. However, addition of a large amount of a monomeric acid generator leads to decrease of rigidity of the film, thus a diffusion distance of acid increases and a problem of deterioration of resolution occurs. Accordingly, an acid generator of which addition to a resist with high sensitivity doesn't lead to deterioration of resolution has been demanded.

Here, a bilayer resist containing silicone which was formed by copolymerizing a sulfonium salt with pendant methacryl groups is suggested in Mat. Res. Soc. Symp. Proc. Vol. 636, D6. 5. 1 (2001).

Furthermore, a polymerizable onium salt is proposed in Japanese Patent Application Laid-open (KOKAI) No. 4-230645 and Japanese Patent Application Laid-open (KOKAI) No. 2005-084365.

Then, the present inventors have studied thoroughly based on the suggestion to achieve the above mentioned object. As a result, they have found that an acid generator obtained by polymerizing a sulfonium salt having a polymerizable unsaturated bond, especially a polymer comprising a repeating unit obtained by polymerizing a sulfonium salt represented by the following general formula (1) is highly sensitive to ArF excimer laser light and entirely insoluble in water, thus it is applicable to the ArF liquid immersion exposure, and that it has sufficient thermal stability and preservation stability. And also, they have found that a resist composition comprising the acid generator has high resolution, can improve line edge roughness and proximity bias of isolated and dense pattern, and is extremely useful for a precise ultra-fine processing.

Namely, a resist composition according to the present invention comprises, at least, a polymer in which a sulfonium salt having a polymerizable unsaturated bond, a (meth)acrylate having a lactone or a hydroxyl group as an adhesion group, and a (meth)acrylate having an ester substituted with an acid labile group are copolymerized.

And in this case, it is preferable that a repeating unit which is formed by polymerizing the sulfonium salt having a polymerizable unsaturated bond is represented by the following general formula (1),

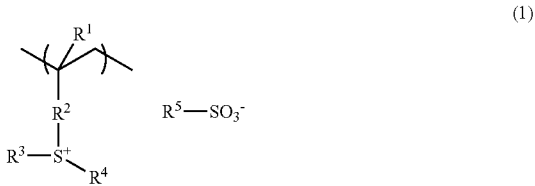

(1)

wherein $R^1$ represents a hydrogen atom or a methyl group, $R^2$ represents any one of a phenylene group, —O—$R^6$—, —C(=O)—$X^1$—$R^6$—, —C(=O)—O—$C_2H_4$—O—$Y^1$—, —C(=O)—O-$Z^1$-C(=O)—$CH_2$—, -$Z^1$-C(=O)—$CH_2$—, —C(=O)—O-$Z^1$-$CH_2$—, —C(=O)—O—$CH_2$—C(=O)—O-$Z^1$- and —C(=O)—O—$C_2H_4$—C(=O)—O-$Z^1$-, $X^1$ represents an oxygen atom or NH, $R^6$ represents a linear, branched or cyclic alkylene group having 1-6 carbon atoms or a phenylene group which may contain a carbonyl group, an ester group or an ether group, $Y^1$ represents any one of a phenylene group, a naphthylene group, and an anthrylene group, $Z^1$ represents a phenylene group, $R^3$ and $R^4$ each independently represents a linear, branched or cyclic alkyl group having 1-12 carbon atoms which may contain a carbonyl group, an ester group or an ether group, an aryl group having 6-12 carbon atoms, an aralkyl group having 7-20 carbon atoms or a thiophenyl group, or $R^3$ and $R^4$ may bond each other to form a ring, $R^5$ represents a linear, branched, cyclic or cyclic-structure-containing alkyl group or alkenyl group having 4-20 carbon atoms in which some or all of hydrogen atoms are substituted with a fluorine atom and in which may contain one or more of a benzene ring or an ether group, or an aryl group having 4-20 carbon atoms in which some or all of hydrogen atoms are substituted with a fluorine atom.

Such a polymer copolymerized by a sulfonium salt having a polymerizable unsaturated bond, a (meth)acrylate having a lactone or a hydroxyl group as an adhesion group, and a (meth)acrylate having an ester substituted with an acid labile group, especially a polymer comprising a repeating unit represented by the above-mentioned general formula (1) as the repeating unit which is formed by polymerizing the sulfonium salt having a polymerizable unsaturated bond, is highly sensitive to high energy beam with a wavelength of 300 nm or 200 nm or less in particular, especially to ArF excimer laser, $F_2$ excimer laser, EUV, X-ray, EB, etc. And also, because such a polymeric acid generator is entirely insoluble in water, it is applicable to the liquid immersion exposure (especially to the liquid immersion exposure using ArF excimer laser light), and the acid generator has sufficient thermal stability and preservation stability.

And such a resist composition containing a copolymer of a sulfonium salt has high resolution, can improve line edge roughness and proximity bias of isolated and dense pattern, and is extremely useful for a precise ultra-fine processing.

Namely, when using such a resist composition containing the polymeric acid generator, anion of the acid generator doesn't dissolve into immersion water, thus there is little possibility that resist pattern after development is collapsed or becomes T-top profile. Therefore, the resist composition can be preferably applicable to the liquid immersion lithography, especially to the ArF liquid immersion lithography, and a pattern with high precision can be obtained.

Furthermore, when the resist composition is added to a resist with high sensitivity in EB or EUV lithography, deterioration of resolution can be effectively prevented, thus a pattern with high precision can be obtained.

As for a sulfonium salt having a polymerizable double bond necessary to obtain the above-mentioned polymer according to the present invention, a sulfonium salt represented by the following general formula (2) is given as an example.

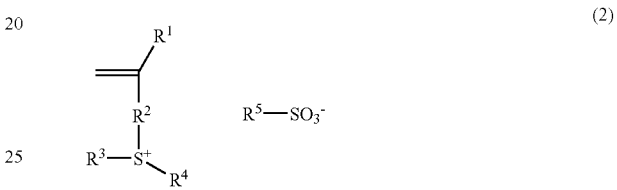

(2)

In the formula, $R^1$ represents a hydrogen atom or a methyl group, $R^2$ represents any one of a phenylene group, —O—$R^6$—, —C(=O)—$X^1$-$R^6$-, —C(=O)—O—$C_2H_4$—O—$Y^1$—, —C(=O)—O-$Z^1$-C(=O)—$CH_2$—, -$Z^1$-C(=O)—$CH_2$—, —C(=O)—O-$Z^1$-$CH_2$—, —C(=O)—O—$CH_2$—C(=O)—O-$Z^1$- and —C(=O)—O—$C_2H_4$—C(=O)—O-$Z^1$-, $X^1$ represents an oxygen atom or NH, $R^6$ represents a linear, branched or cyclic alkylene group having 1-6 carbon atoms or a phenylene group which may contain a carbonyl group, an ester group or an ether group, $Y^1$ represents any one of a phenylene group, a naphthylene group, and an anthrylene group, $Z^1$ represents a phenylene group, $R^3$ and $R^4$ each independently represents a linear, branched or cyclic alkyl group having 1-12 carbon atoms which may contain a carbonyl group, an ester group or an ether group, an aryl group having 6-12 carbon atoms, an aralkyl group having 7-20 carbon atoms or a thiophenyl group, or $R^3$ and $R^4$ may bond each other to form a ring, and $R^5$ represents a linear, branched, cyclic or cyclic-structure-containing alkyl group or alkenyl group having 4-20 carbon atoms in which some or all of hydrogen atoms are substituted with a fluorine atom and in which may contain one or more of a benzene ring or an ether group, or an aryl group having 4-20 carbon atoms in which some or all of hydrogen atoms are substituted with a fluorine atom.

$R^3$ and $R^4$ each independently represents a linear, branched or cyclic alkyl group having 1-12 carbon atoms which may contain a carbonyl group(=C=O), an ester group (—COO—) or an ether group (—O—). And $R^3$ and $R^4$ may each independently represent an aryl group having 6-12 carbon atoms, especially 6-10 carbon atoms, like a phenyl group, a xylyl group, a tolyl group or a naphthyl group, an aralkyl group having 7-20 carbon atoms, especially 7-12 carbon atoms, like a benzyl group, a phenylethyl group, a phenylpropyl group, a thiophenyl group like thiophene-2-yl or thiophene-3-yl, or 2-substituted-2-oxoethyl group.

Specific examples of the sulfonium salt in the above general formula (2) are shown as below.
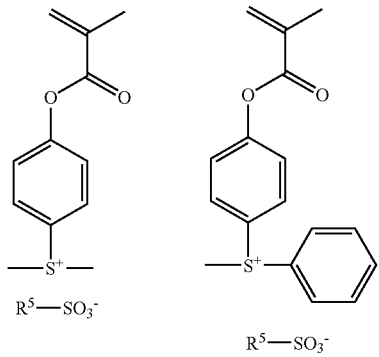
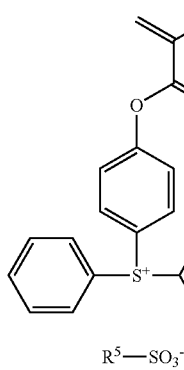
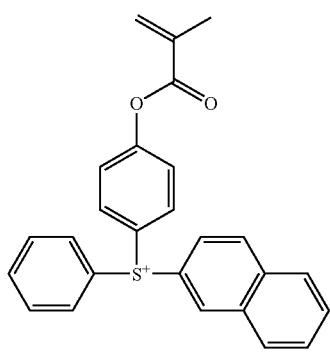
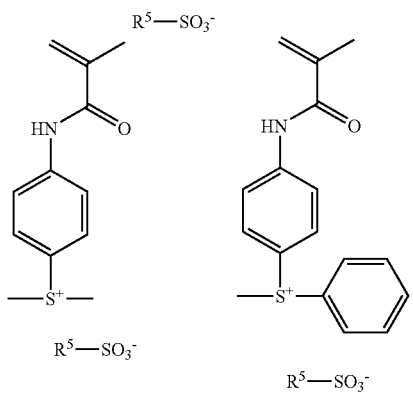
-continued
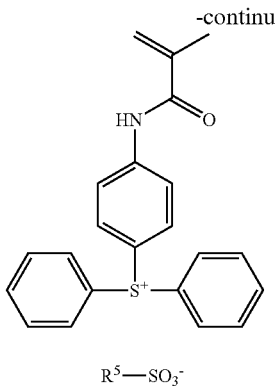
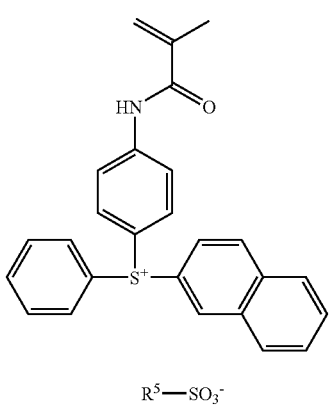
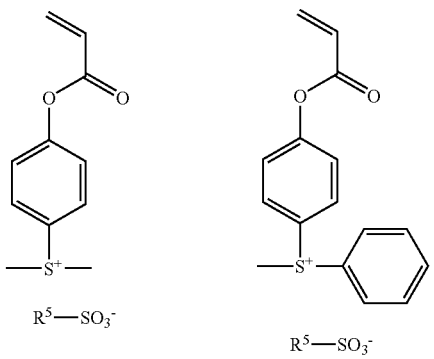
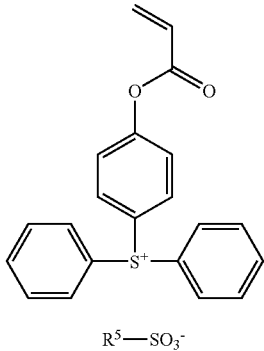

-continued
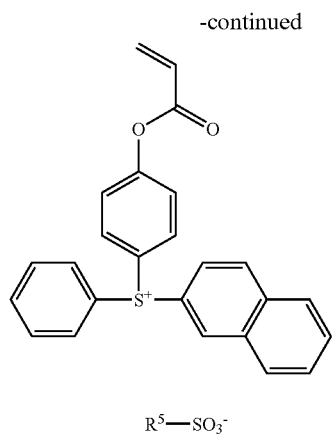
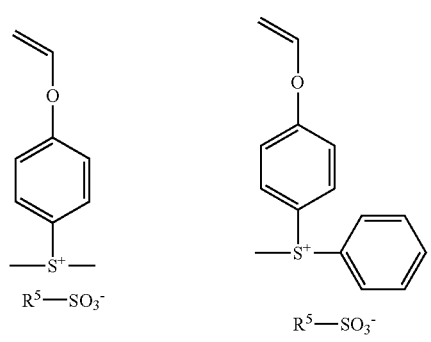
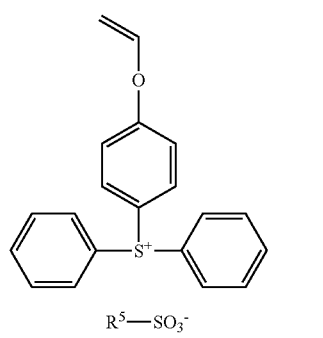
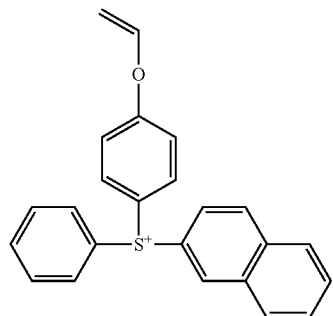
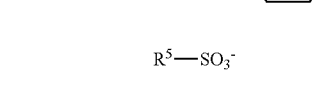
-continued
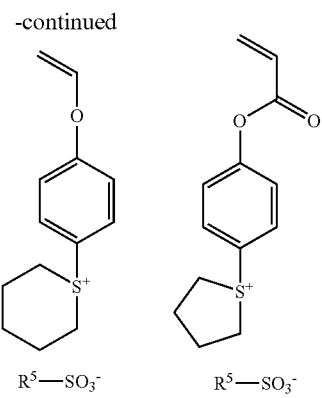
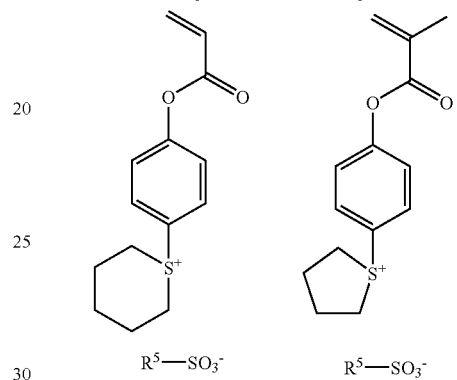
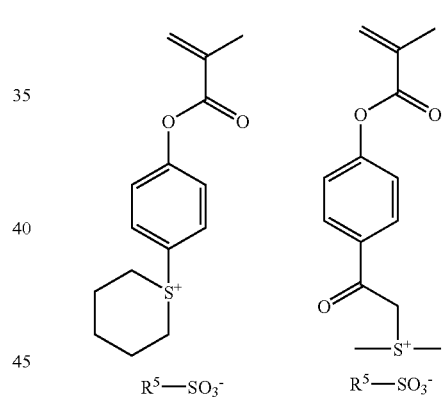
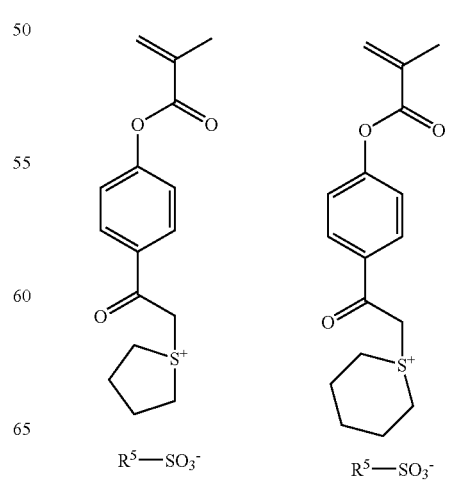

-continued
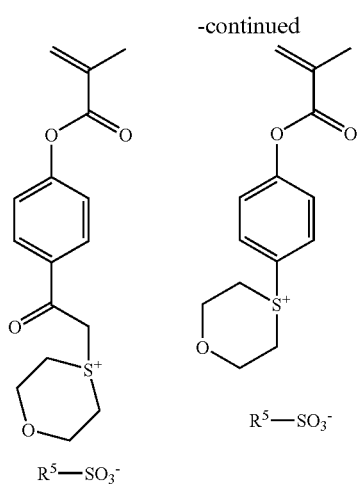
R⁵—SO₃⁻
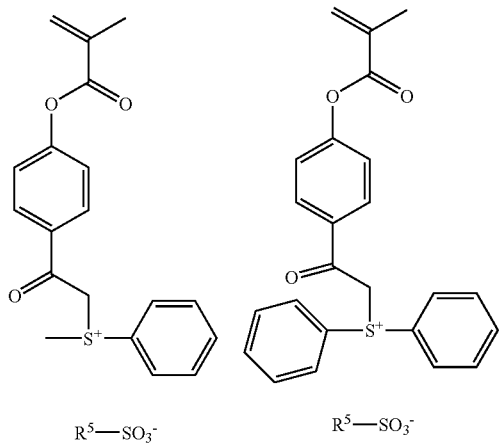
R⁵—SO₃⁻
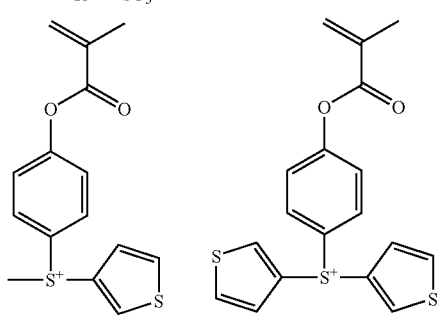
R⁵—SO₃⁻
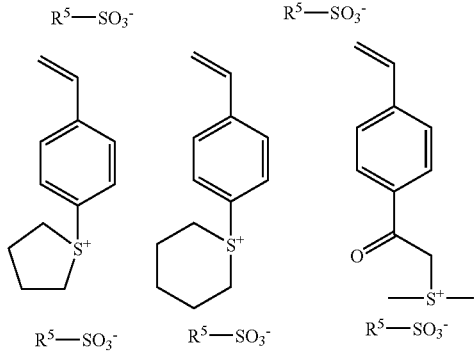
R⁵—SO₃⁻
-continued
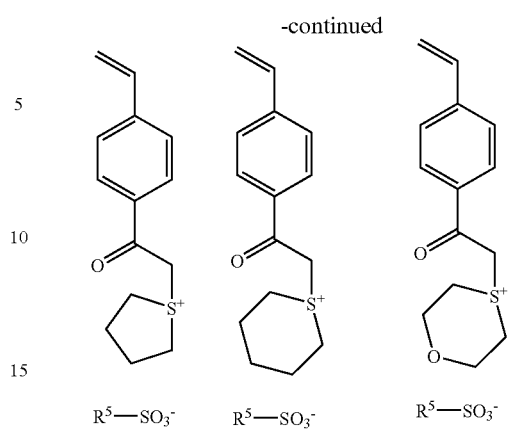
R⁵—SO₃⁻
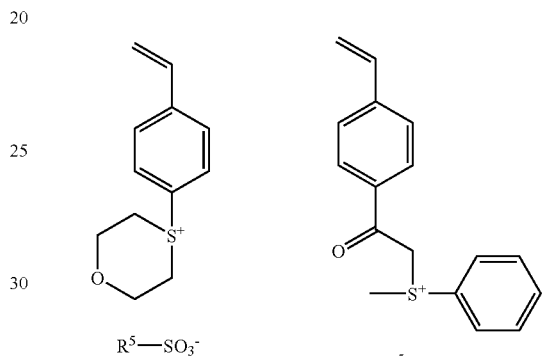
R⁵—SO₃⁻
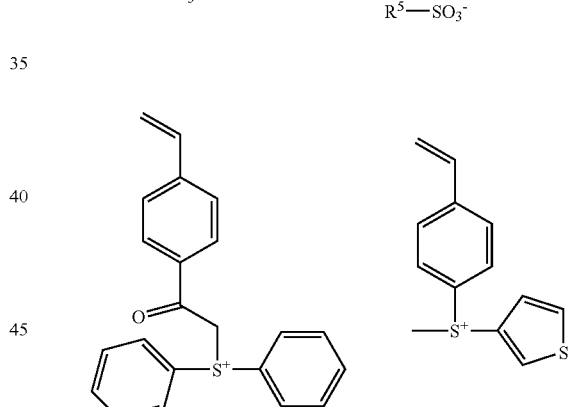
R⁵—SO₃⁻
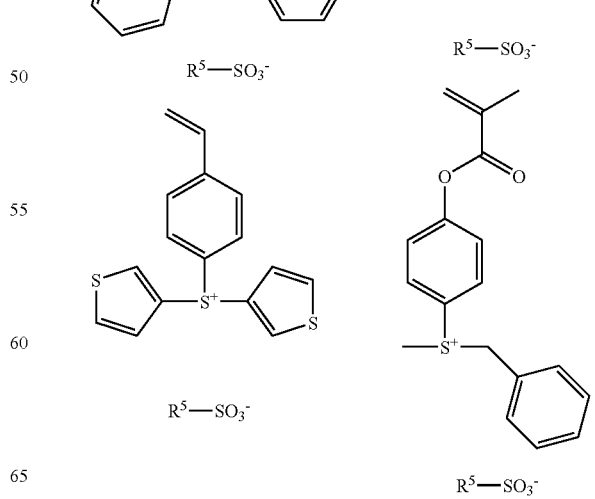
R⁵—SO₃⁻

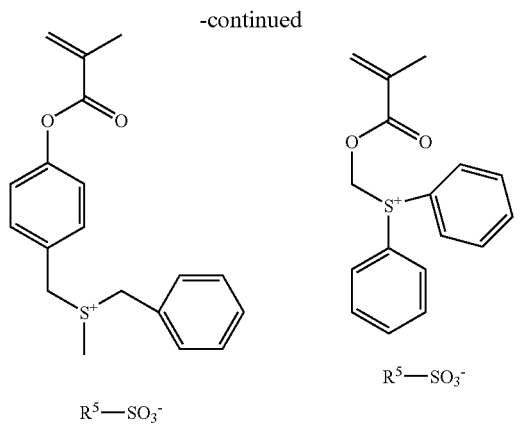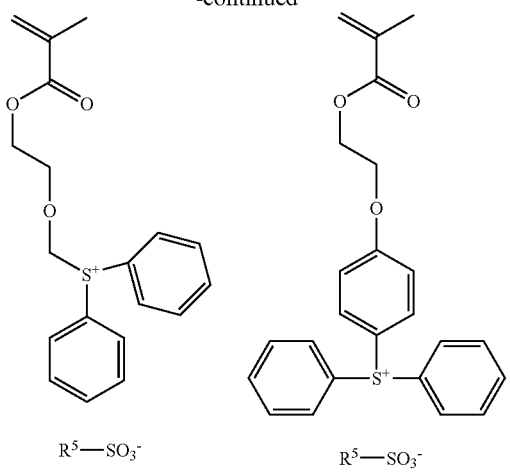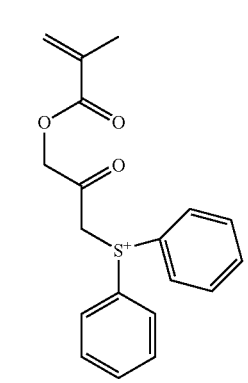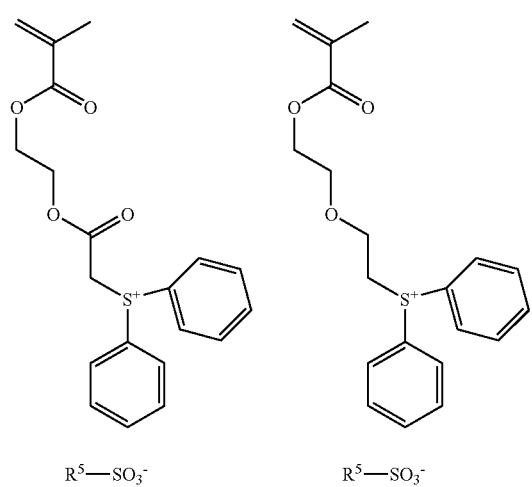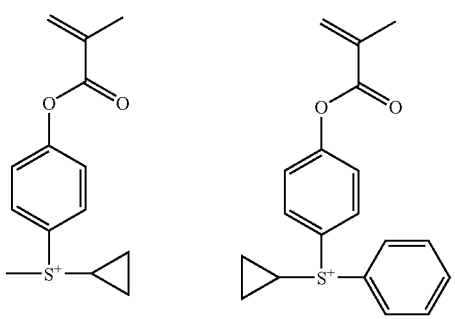

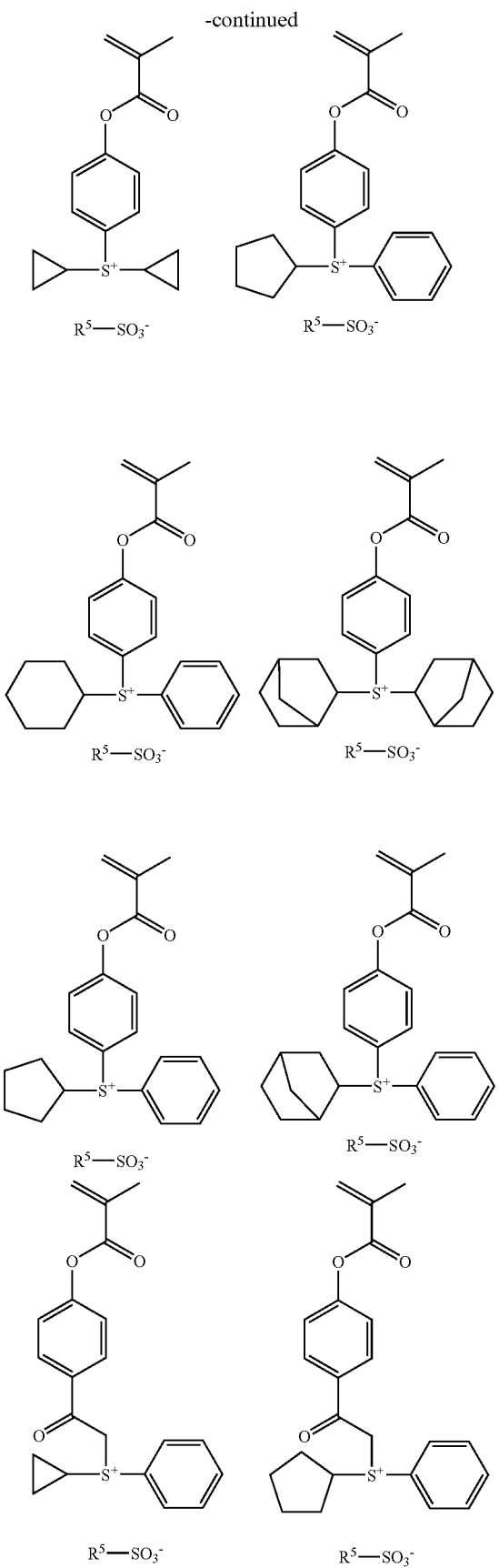

In the formulae, $R^5$ is the same as explained above.

The anion end of a sulfonium salt in the above general formulae (1) and (2) may contain one or more of a benzene ring or an ether group, and represents a linear, branched, cyclic or cyclic-structure-containing alkyl group or alkenyl group of sulfonic acid having 4-20 carbon atoms in which some or all of hydrogen atoms are substituted with a fluorine atom, or an aryl group of sulfonic acid having 4-20 carbon atoms in which some or all of hydrogen atoms are substituted with a fluorine atom. The specific examples thereof can be shown below.

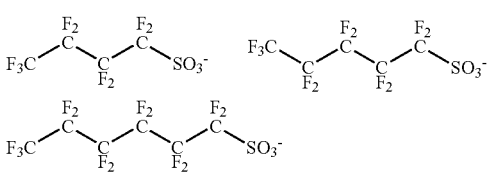

-continued
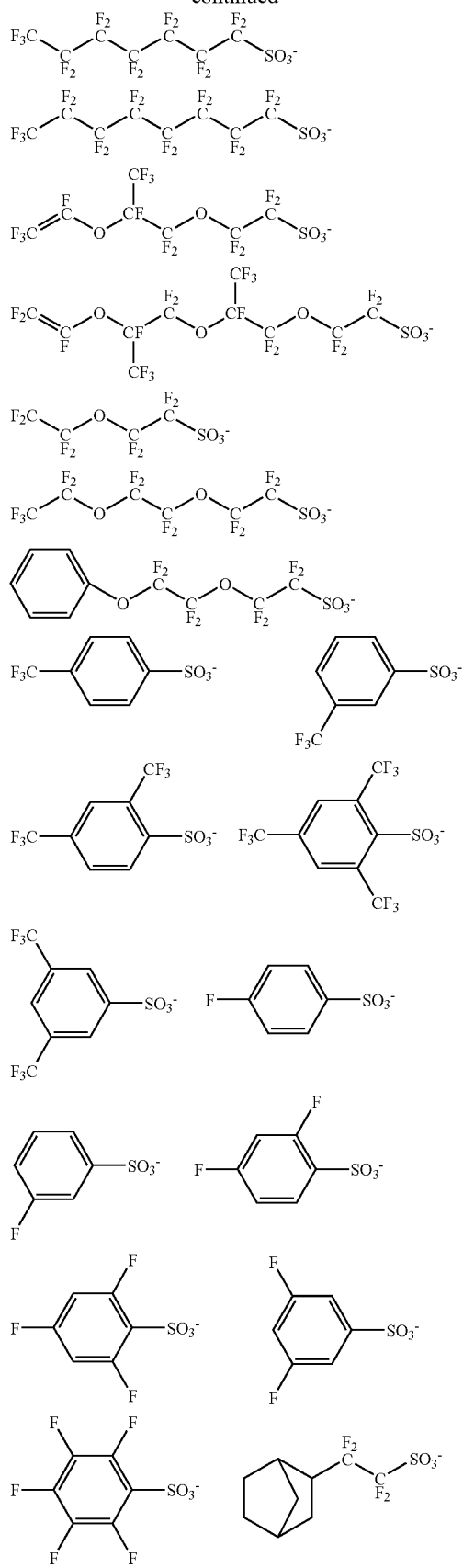
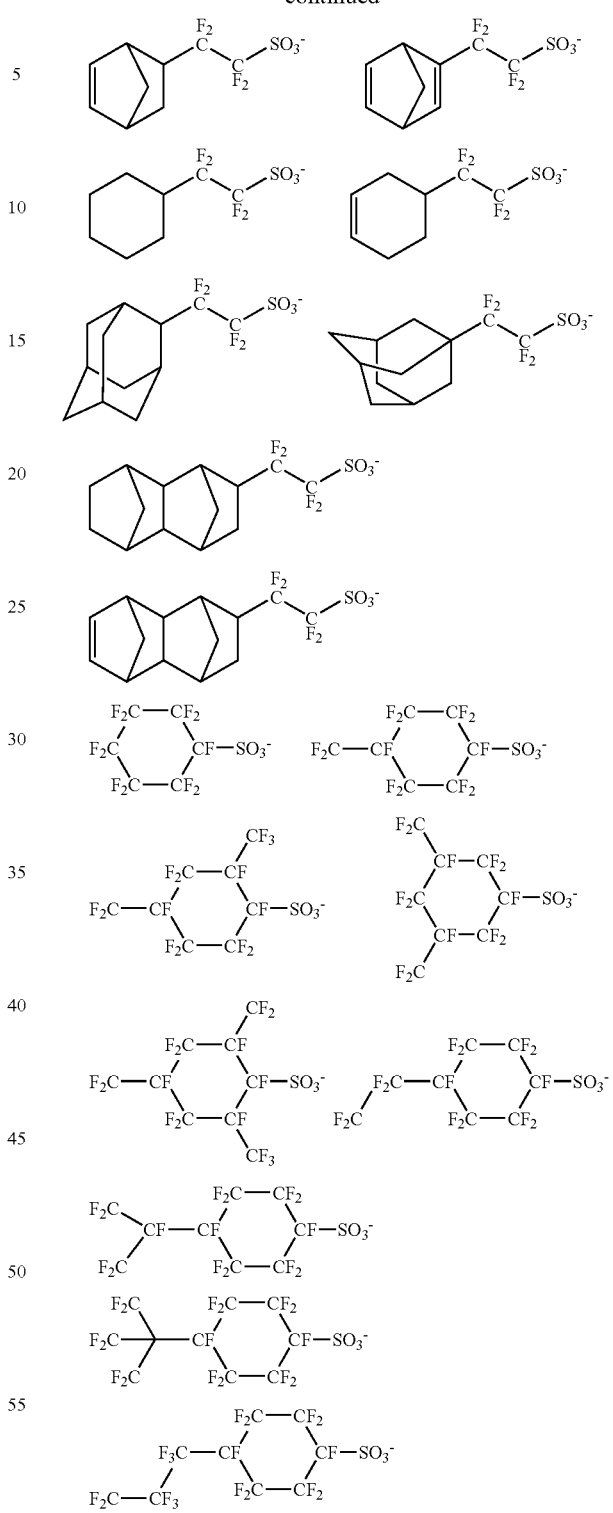
Although the synthetic process of a sulfonium salt with pendant methacryl groups as shown in the above examples is not restricted, for example, the following method in which a sulfonium salt having a phenol group is reacted with chloride methacrylate as shown in Mat. Res. Soc. Symp. Proc. Vol. 636, D6. 5. 1 (2001) can be given.

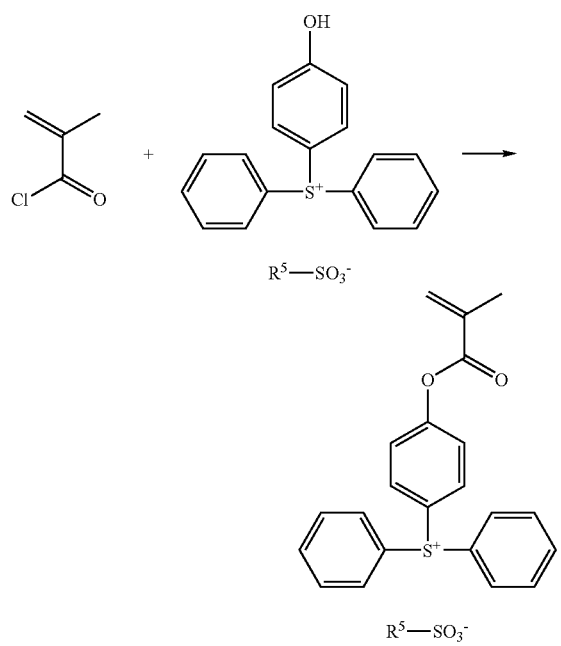

In the formulae, $R^5$ is the same as explained above.

As described above, a sulfonium salt having a polymerizable unsaturated bond can be obtained.

The resist composition according to the present invention comprises, at least, a polymer in which a sulfonium salt having a polymerizable unsaturated bond, a (meth)acrylate having a lactone or a hydroxyl group as an adhesion group, and a (meth)acrylate having an ester substituted with an acid labile group are copolymerized. And such a polymer can be preferably used as a base resin.

Although the synthetic process of such a polymer according to the present invention is not restricted, for example, a radical initiator is added to an organic solvent including a sulfonium salt having a polymerizable unsaturated bond obtained above, a (meth)acrylate having a lactone or a hydroxyl group as an adhesion group, and a (meth)acrylate having an ester substituted with an acid labile group, or further monomers which can copolymerize therewith, to perform heating polymerization, and thereby, the polymer can be obtained. Examples of the organic solvent used in the polymerization may include: toluene, benzene, tetrahydrofuran, diethyl ether, dioxane, etc. Examples of the polymerization initiator may include: 2,2'-azobisisobutyronitril, 2,2'-azo bis (2,4-dimethyl valeronitrile), dimethyl 2,2-azo bis(2-methyl propionate), benzoyl peroxide, lauroyl peroxide, etc. The polymer can be polymerized preferably at an elevated temperature of 50° C. to 80° C. The reaction time is preferably 2 to 100 hours, more preferably 5-20 hours.

In thus obtained polymer, it is preferable that the repeating unit of a sulfonium salt represented by the above general formula (1) is 90 mole % or less of all the repeating units, more preferably 80 mole % or less, and further preferably 60 mole % or less.

Moreover, besides the polymer according to the present invention, a conventional polymer in which an onium salt of sulfonic acid having a polymerizable unsaturated bond is not copolymerized, in particular, one or more kinds of polymers selected from the following can be further blended: polyacrylic acid and derivatives thereof, copolymer comprising 3, 4 or more types of monomers among cycloolefin derivatives-maleic anhydride alternating polymer, polyacrylic acid and derivatives thereof, cycloolefin derivatives-α trifluoromethylacryl copolymer, polynorbornene and metathesis ring-opening polymer.

Furthermore, when the resist composition is prepared as a chemically amplified positive resist composition, as a base resin, what is insoluble or hardly soluble in a developer (generally an alkaline developer), and is changed by acid to be soluble in the developer is used. Therefore, what comprises an acid labile group (an acid deprotection group) that can be cloven by acid is used as a base resin.

Polyacrylic acid and polymethacrylic acid can be insoluble or hardly soluble in an alkaline developer by substituting a hydrogen atom of a carboxyl group thereof with an acid labile group. Because a polymer according to the present invention comprises a (meth)acrylate having an ester substituted with an acid labile group as a repeating unit, a resist composition using the polymer as a base resin can be preferably used as a chemically amplified positive resist composition.

Although acid labile groups used in this case can be selected variously and not limited, they may be the same or different, and particularly what is substituted with the group represented by the following formulae (A-1)-(A-3) can be given.

In the formula (A-1), $R^{30}$ represents a tertiary alkyl group having 4-20 carbon atoms, preferably 4-15 carbon atoms in which each alkyl group may be independently trialkyl silyl group having 1-6 carbon atoms, an oxoalkyl group having 4-20 carbon atoms, or the group represented by the above-mentioned general formula (A-3). Specific examples of the tertiary alkyl group may include: tert-butyl group, tert-amyl group, 1,1-diethyl propyl group, 1-ethyl cyclopentyl group, 1-butylcyclopentyl group, 1-ethyl cyclohexyl group, 1-butyl-cyclohexyl group, 1-ethyl-2-cyclopentenyl group, 1-ethyl-2-cyclohexenyl group, 2-methyl-2-adamantyl group, etc. Specific examples of the trialkyl silyl group may include: a trimethylsilyl group, a triethylsilyl group, a dimethyl-tert-butylsilyl group, etc. Specific examples of the oxo-alkyl group may include: 3-oxo-cyclohexyl group, 4-methyl-2-oxooxane-4-yl group, 5-methyl-2-oxooxolane-5-yl group, etc. a1 is an integer of 0-6.

Specific examples of the acid labile group represented by the above-mentioned formula (A-1) may include: tert-butoxy carbonyl group, tert-butoxy carbonyl methyl group, tert-amyloxy carbonyl group, tert-amyloxy carbonyl methyl group, 1,1-diethyl propyl oxy-carbonyl group, 1,1-diethyl propyloxy carbonyl methyl group, 1-ethylcyclopentyl oxy-carbonyl group, 1-ethylcyclopentyloxy-carbonyl methyl group, 1-ethyl-2-cyclopentenyloxy-carbonyl group, 1-ethyl-2-cyclopentenyloxy-carbonyl methyl group, 1-ethoxy ethoxy carbonyl methyl group, 2-tetrahydro pyranyl oxy-carbonyl methyl group, 2-tetrahydrofuranyl oxy-carbonyl methyl group, etc.

Furthermore, substituents represented by the following formulae (A-1)-1 to (A-1)-8 can be given.

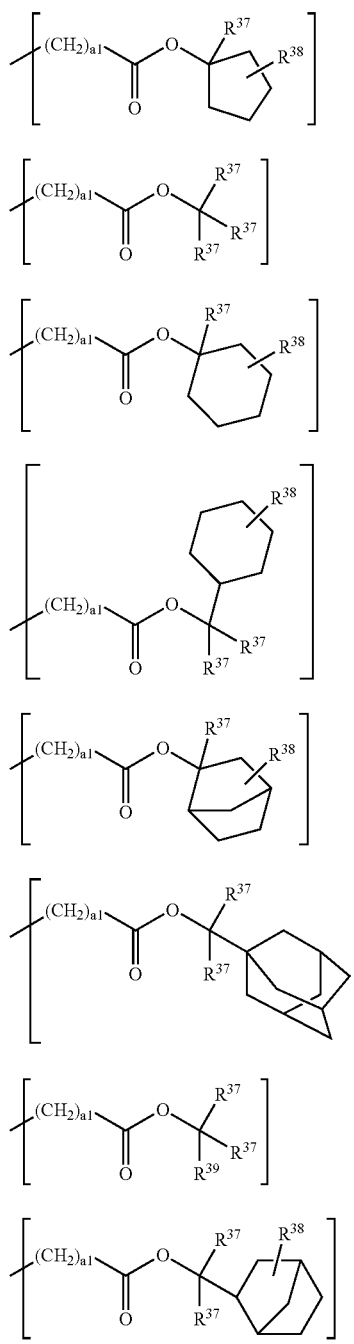

(A-1)-1
(A-1)-2
(A-1)-3
(A-1)-4
(A-1)-5
(A-1)-6
(A-1)-7
(A-1)-8

In the formulae, $R^{37}$ may be the same or different, and represents a linear, branched or cyclic alkyl group having 1-10 carbon atoms, or an aryl group having 6-20 carbon atoms. $R^{38}$ represents a hydrogen atom, or a linear, branched or cyclic alkyl group having 1-10 carbon atoms.

$R^{39}$ may be the same or different, and represents a linear, branched or cyclic alkyl group having 2-10 carbon atoms, or an aryl group having 6-20 carbon atoms.

a1 is an integer of 0-6.

In the formula (A-2), $R^{31}$ and $R^{32}$ represent a hydrogen atom, or a linear, branched or cyclic alkyl group having 1-18 carbon atoms, preferably 1-10 carbon atoms. Illustrative examples thereof may include: a methyl group, an ethyl group, a propyl group, an isopropyl group, n-butyl group, sec-butyl group, tert-butyl group, a cyclopentyl group, a cyclohexyl group, 2-ethylhexyl group, an n-octyl group, etc. $R^{33}$ represents a monovalent hydrocarbon group having 1-18 carbon atoms, preferably 1-10 carbon atoms which may contain a hetero atom like an oxygen atom. Specific examples thereof may include: a linear, branched or cyclic alkyl group or in which a part of hydrogen atoms is substituted with a hydroxyl group, an alkoxy group, an oxo group, an amino group, an alkyl amino group, etc. The following substituted alkyl groups etc. can be given as illustrative examples thereof.

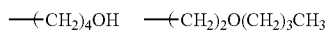
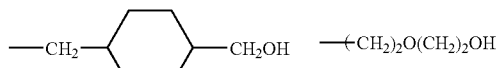
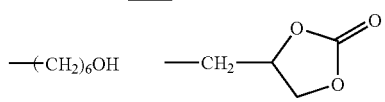

$R^{31}$ and $R^{32}$, $R^{31}$ and $R^{33}$, $R^{32}$ and $R^{33}$ may bond each other and form a ring together with carbon atoms which they bond. In the case that they form a ring, $R^{31}$, $R^{32}$ and $R^{33}$ independently represent a linear or branched alkylene group having 1-18 carbon atoms, preferably 1-10 carbon atoms, and in which the number of carbon atoms of a ring is preferably 3-10, especially 4-10.

Specific examples of a linear or branched group among the acid labile groups represented by the above-mentioned formula (A-2) may include the following formulae (A-2)-1 to (A-2)-35.

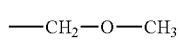 (A-2)-1
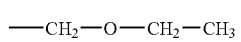 (A-2)-2
 (A-2)-3
 (A-2)-4
 (A-2)-5
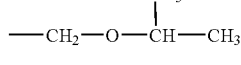 (A-2)-6
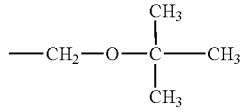
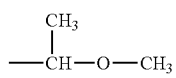 (A-2)-7

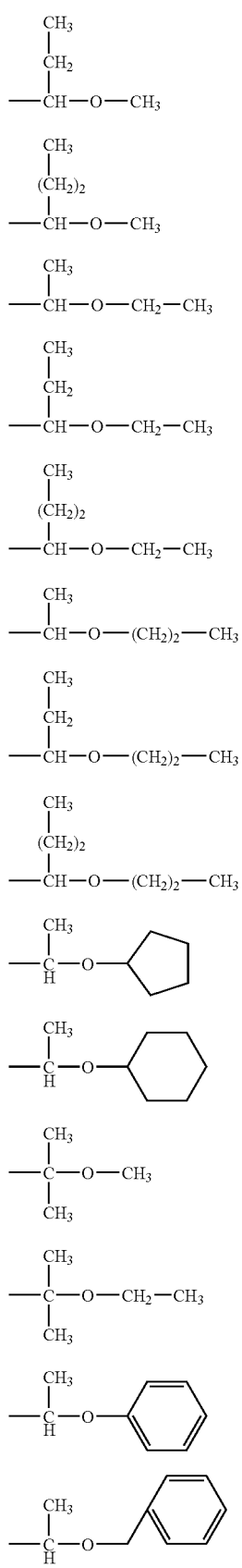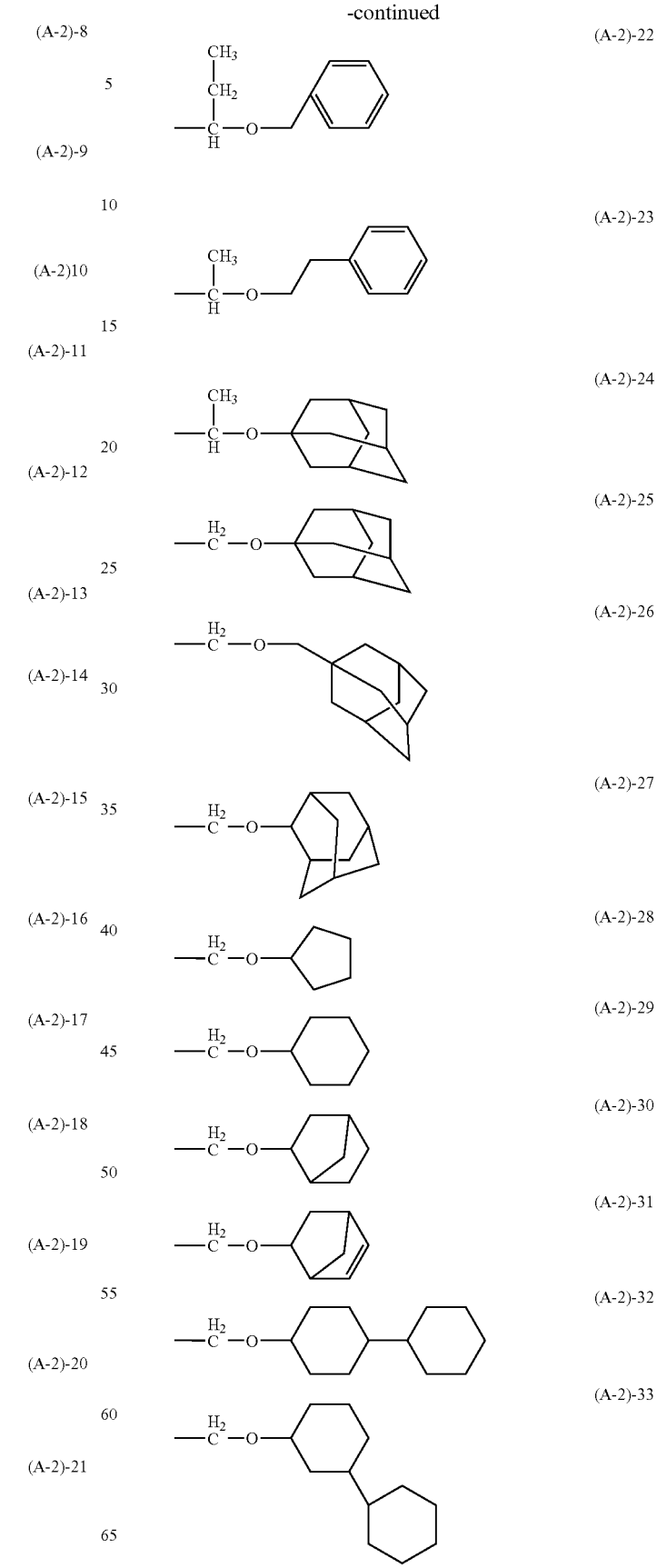

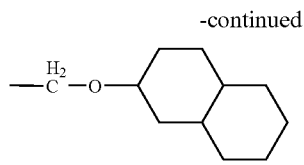
(A-2)-34

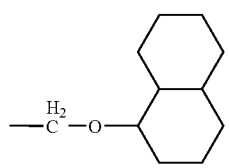
(A-2)-35

Specific examples of a cyclic group among the acid labile groups represented by the above-mentioned formula (A-2) may include: a tetrahydrofuran-2-yl group, 2-methyl tetrahydrofuran-2-yl group, tetrahydropyran-2-yl group, 2-methyl tetrahydropyran-2-yl group, etc.

The polymer may be bridged intermolecularly or molecularly by the acid labile group represented general formulae (A-2a) or (A-2b).

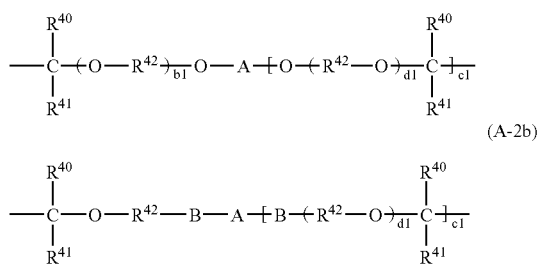
(A-2a)

(A-2b)

In the formulae, $R^{40}$ and $R^{41}$ represent a hydrogen atom, or a linear, branched or cyclic alkyl group having 1-8 carbon atoms. Alternatively, $R^{40}$ and $R^{41}$ may bond each other to form a ring together with carbon atoms they bond. In the case that $R^{40}$ and $R^{41}$ form a ring, they represent a linear or branched alkylene group having 1-8 carbon atoms. $R^{42}$ represents a linear, branched or cyclic alkylene group having 1-10 carbon atoms, b1 and d1 represent an integer of 0 or 1 to 10, preferably an integer of 0 or 1 to 5, and c1 represents an integer of 1 to 7. A represents an aliphatic or alicyclic saturated hydrocarbon group, an aromatic hydrocarbon group or a heterocyclic group of (c1+1) valence having 1 to 50 carbon atoms, these groups may be bonded via a hetero atom, and a part of hydrogen atoms bonded to a carbon atom of these groups may be substituted with a hydroxyl group, a carboxyl group, a carbonyl group or a fluorine atom. B represents —CO—O—, —NHCO—O— or —NHCONH—.

In this case, it is preferable that A represents a 2 to 4 valent linear, branched or cyclic alkylene group, an alkyl-tri-yl group or an alkyl-tetra-yl group having 1-20 carbon atoms, an arylene group having 6-30 carbon atoms. These groups may be bonded via a hetero atom, a part of hydrogen atoms bonded to a carbon atom of these groups may be substituted with a hydroxyl group, a carboxyl group, an acyl group or a halogen atom. c1 preferably represents an integer of 1 to 3.

Illustrative examples of the crosslinked acetal groups represented by the above general formulae (A-2a) and (A-2b) may include: those represented by the following formulae: (A-2)-36 to (A-2)-43.

(A-2)-36

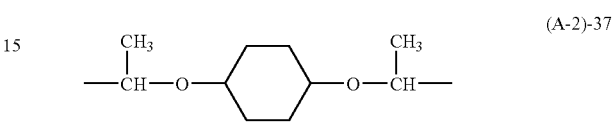
(A-2)-37

(A-2)-38

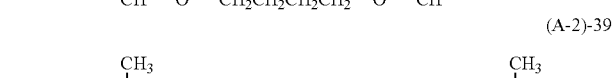
(A-2)-39

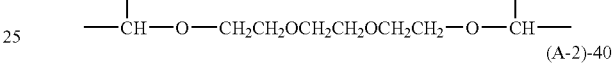
(A-2)-40

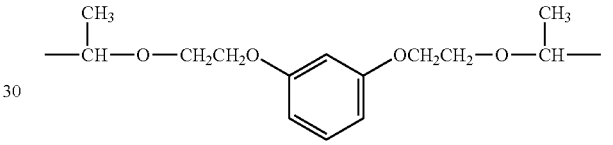
(A-2)-41

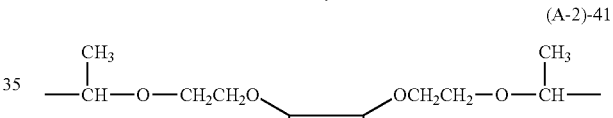
(A-2)-42

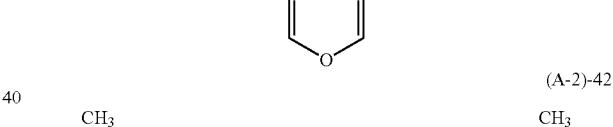
(A-2)-43

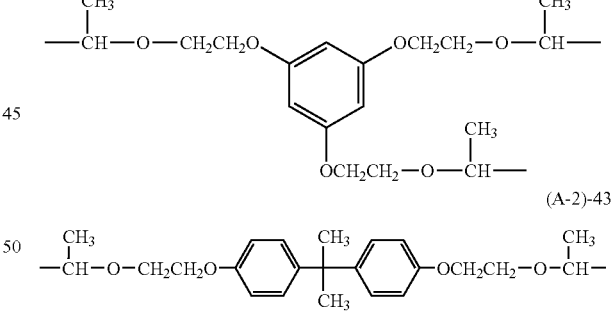

In the above formula (A-3), $R^{34}$, $R^{35}$ and $R^{36}$ represent a monovalent hydrocarbon group like a linear, branched or cyclic alkyl group having 1-20 carbon atoms which may contain a hetero atom like oxygen, sulfur, nitrogen, fluorine, etc. $R^{34}$ and $R^{35}$, $R^{34}$ and $R^{36}$, $R^{35}$ and $R^{36}$ may bond each other and form a ring of 3-20 carbon atoms together with carbon atoms which they bond.

Examples of the tertiary alkyl group shown in the above-mentioned formula (A-3) may include: tert-butyl group, triethyl carbyl group, 1-ethyl norbornyl group, 1-methyl cyclohexyl group, 1-ethyl cyclopentyl group, 2-(2-methyl) adamantyl group, 2-(2-ethyl)adamantyl group, tert-amyl group, etc.

Illustrative examples of the tertiary alkyl group can be also represented by the following formulae (A-3)-1 to (A-3)-18.
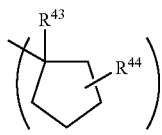 (A-3)-1
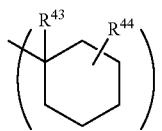 (A-3)-2
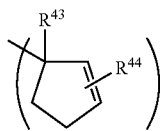 (A-3)-3
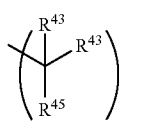 (A-3)-4
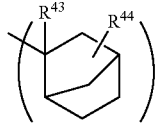 (A-3)-5
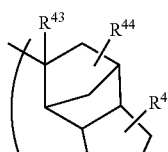 (A-3)-6
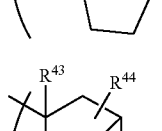 (A-3)-7
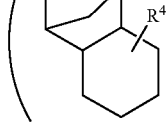 (A-3)-8
-continued
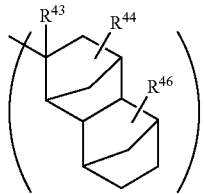 (A-3)-9
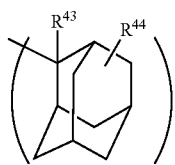 (A-3)-10
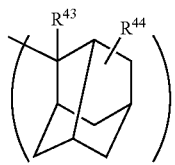 (A-3)-11
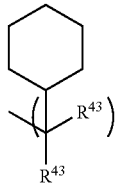 (A-3)-12
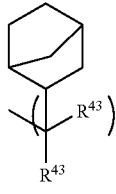 (A-3)-13
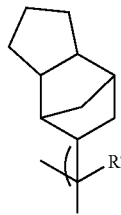 (A-3)-14
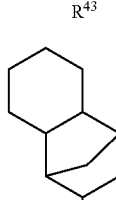 (A-3)-15
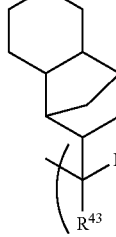

-continued (A-3)-16
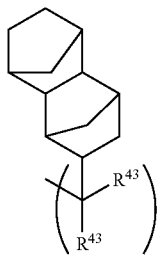

(A-3)-17
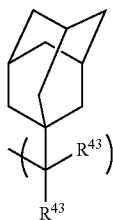

(A-3)-18
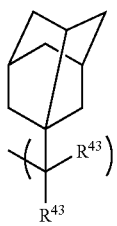

In the formulae (A-3)-1 to (A-3)-18, $R^{43}$ may be the same or different, and represents a linear, branched or cyclic alkyl group having 1-8 carbon atoms, an aryl group having 6-20 carbon atoms like a phenyl group, etc. $R^{44}$ and $R^{46}$ represent a hydrogen atom or a linear, branched or cyclic alkyl group having 1-20 carbon atoms. $R^{45}$ represents an aryl group having 6-20 carbon atoms like a phenyl group, etc.

Furthermore as shown in (A-3)-19 and (A-3)-20, the polymer may be crosslinked intramolecularly or intermolecularly, including $R^{47}$ which is an alkylene group or arylene group of two or more valences.

(A-3)-19
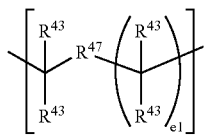

(A-3)-20
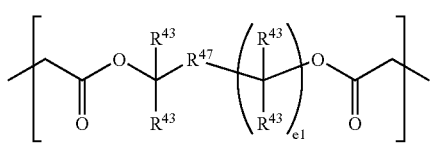

$R^{43}$ in the formulae (A-3)-19 and (A-3)-20 is the same as mentioned above, and $R^{47}$ represents a linear, branched or cyclic alkylene group or an arylene group like a phenylene group, etc. having 1-20 carbon atoms, and may contain a hetero atom such as an oxygen atom, a sulfur atom, a nitrogen atom, etc. e1 is an integer of 1-3.

Here the above-mentioned (A-3)-6 to (A-3)-9 has stereoisomers of endo and exo. The exo isomer is characterized in that because stability of intermediate of an elimination reaction is high, rate of reaction of elimination is high and activation energy in elimination is low. High rate of reaction of elimination leads to high contrast of deprotection and high dissolution contrast can be obtained. Low activation energy leads to reduced size change (post exposure bake [PEB] dependency) when PEB temperature is changed. Examples of an exo form of an acid labile group is shown as below.

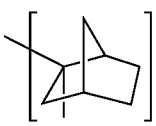 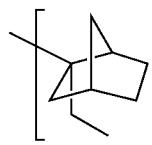

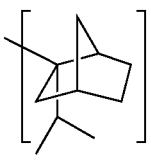 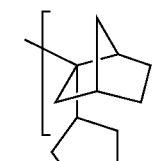

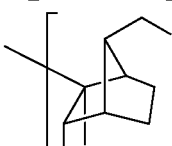 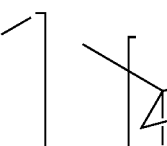

 

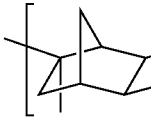 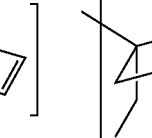

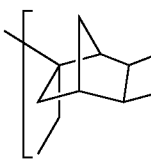 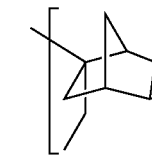

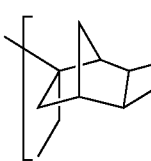 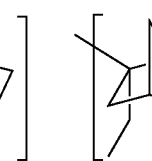

Moreover, $R^{30}$, $R^{33}$ and $R^{36}$ in the formulae (A-1), (A-2) and (A-3) may represent unsubstituted or substituted aryl group like a phenyl group, a p-methylphenyl group, a p-ethylphenyl group, or a phenyl group substituted with an alkoxy group like a p-methoxyphenyl group, etc., an aralkyl group like a benzyl group, a phenethyl group, etc., these groups containing an oxygen atom, or an alkyl group or an oxoalkyl group represented by the following formulae in which a hydrogen atom bonded to a carbon atom is substituted with a hydroxyl group or two hydrogen atoms are substituted with an oxygen atom to form a carbonyl group.

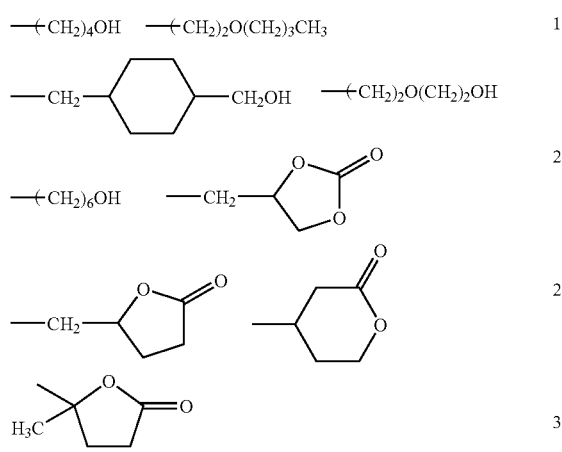

Furthermore, an acid labile group containing an oxygen atom can be given as a tertiary alkyl group. Examples thereof can be represented below.

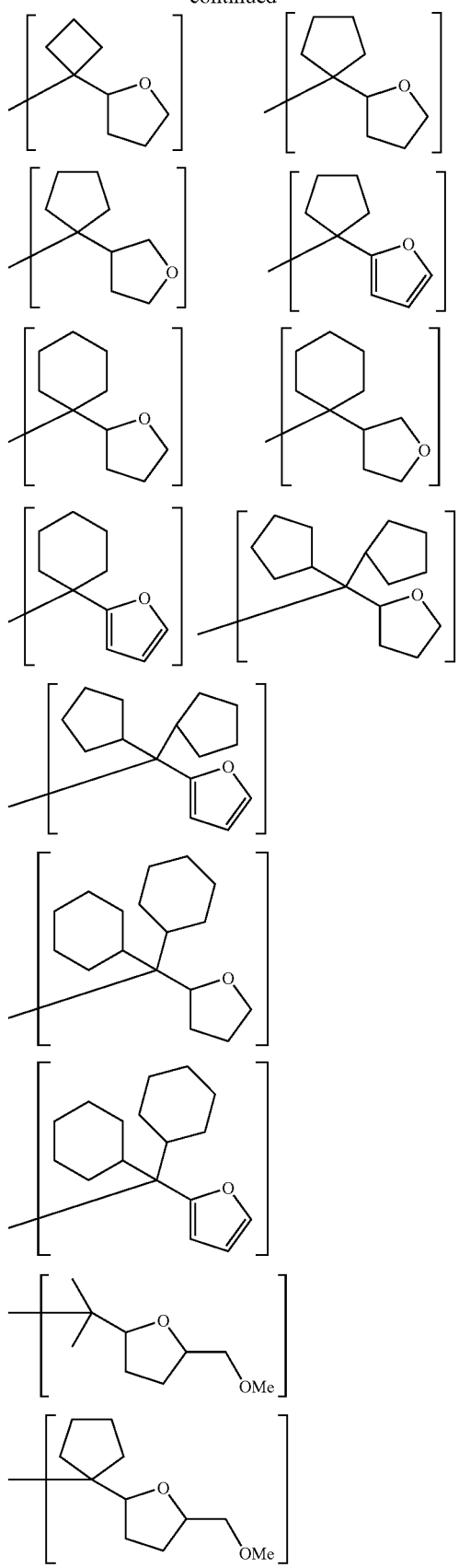

-continued
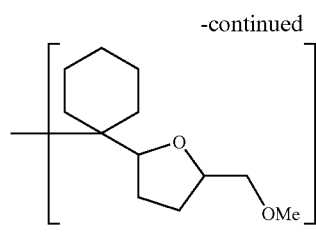
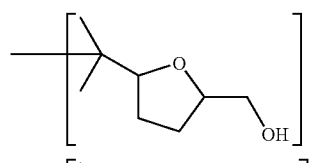
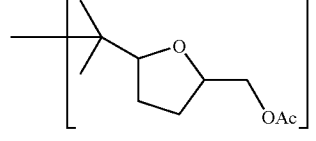
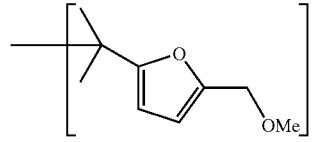
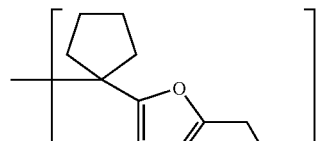
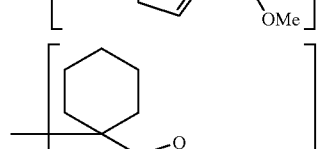
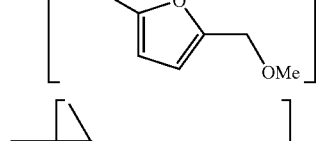
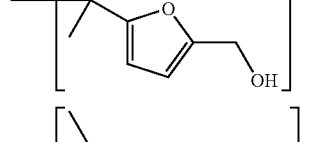
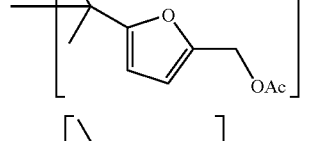
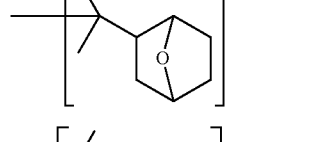
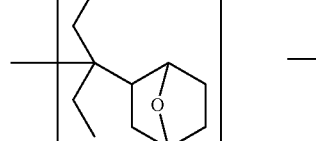
-continued
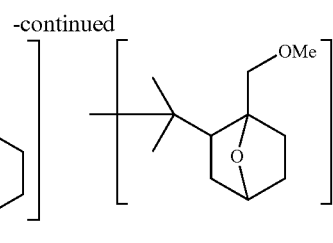
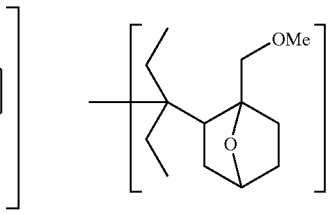
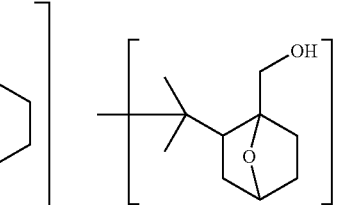
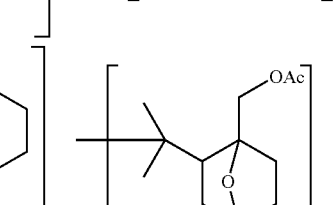
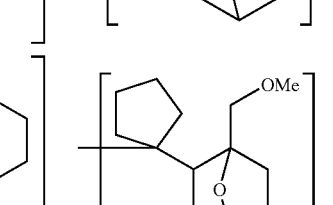
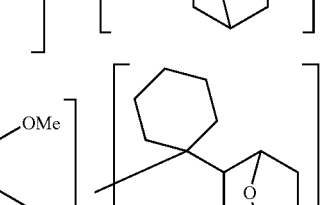
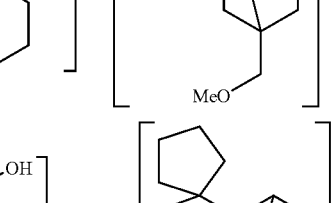
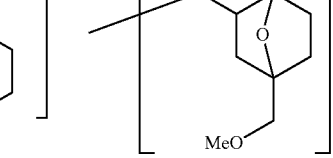

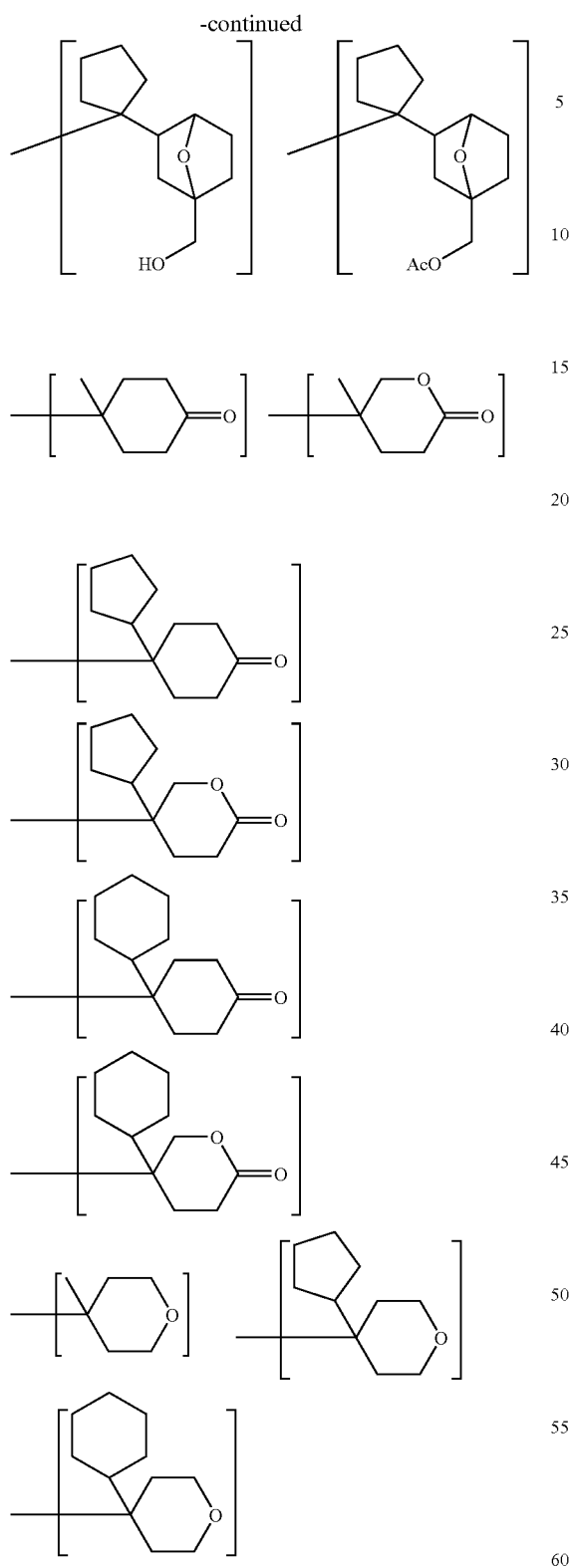
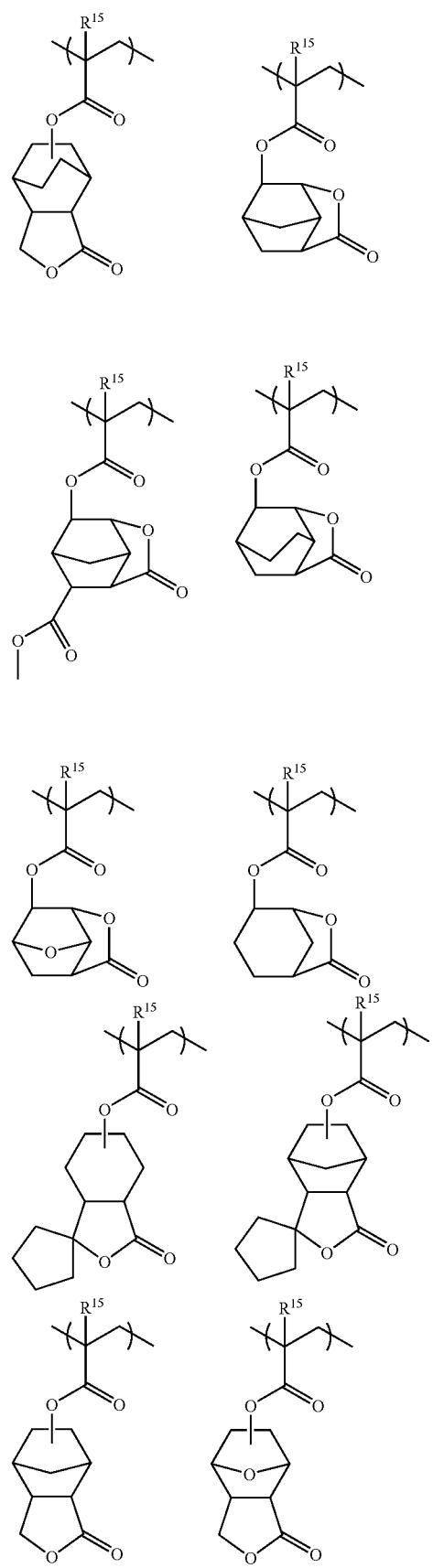
In the above formulae, Me represents a methyl group, and Ac represents an acetyl group.
Next, examples of a repeating unit of a (meth)acrylate having a lactone as an adhesion group which the polymer of the present invention comprises are shown below.

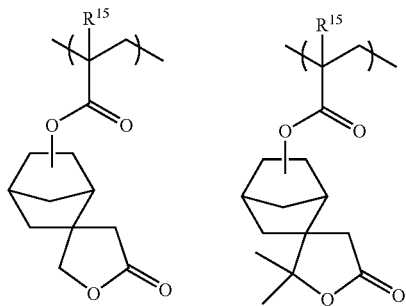
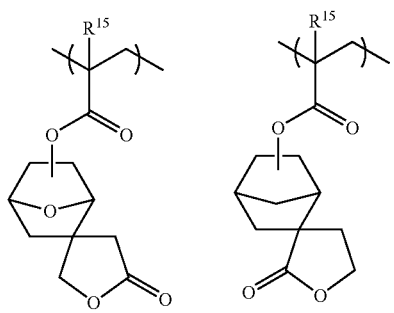
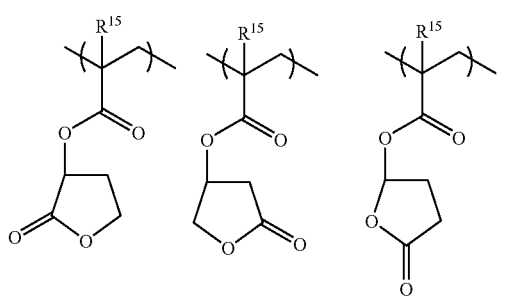
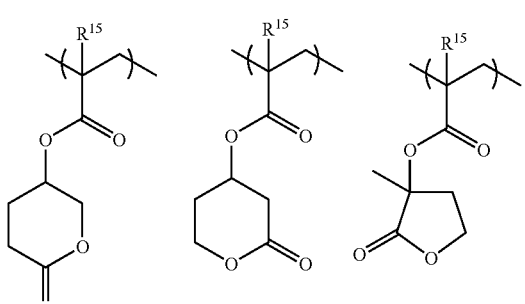
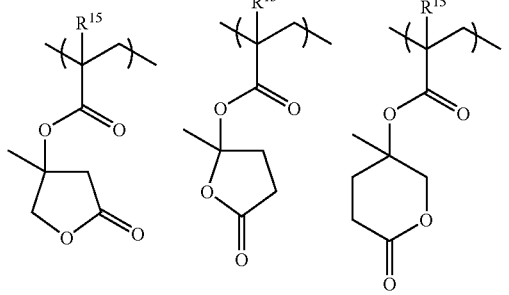
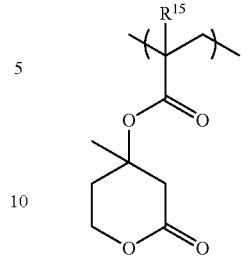
In the above formulae, $R^{15}$ represents a hydrogen atom or a methyl group.
Next, examples of a repeating unit of a (meth)acrylate having a hydroxyl group as an adhesion group which the polymer of the present invention comprises are shown below.
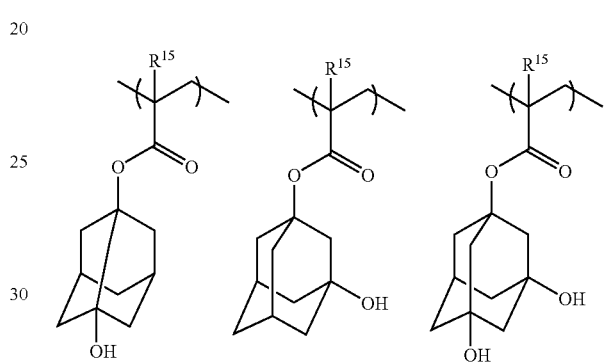
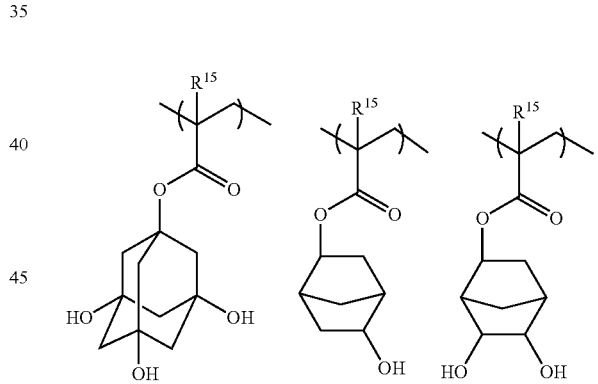
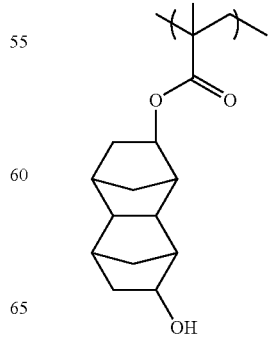

-continued
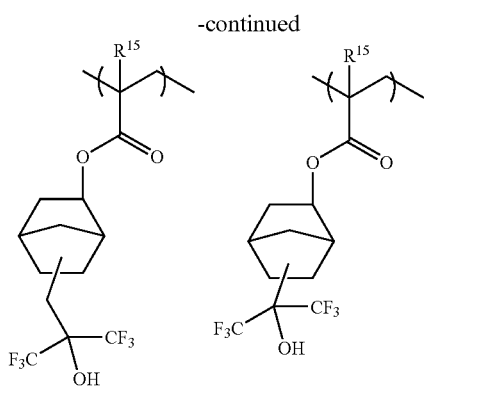
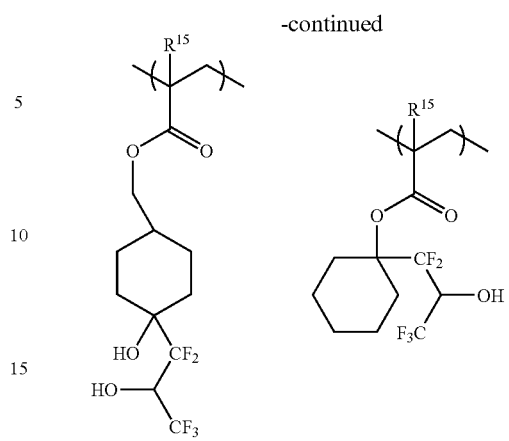
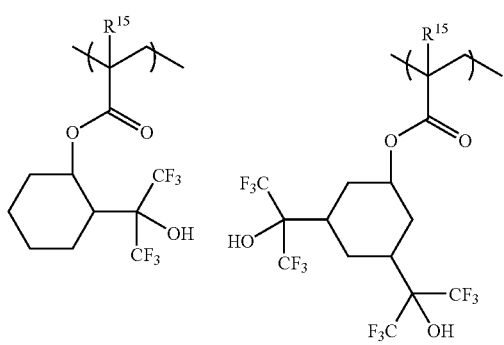
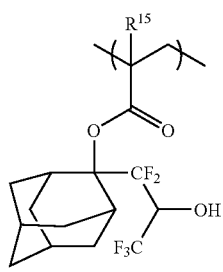
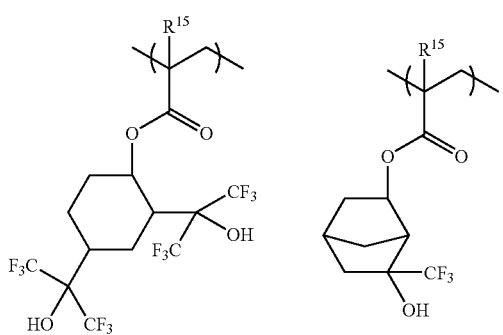
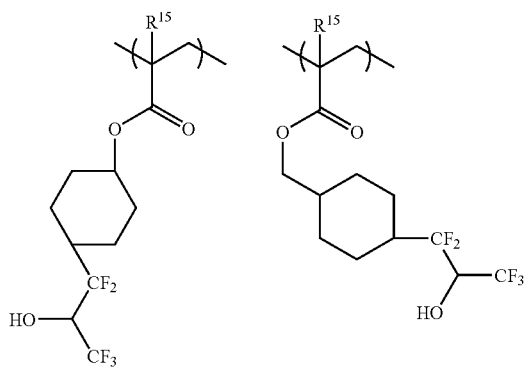
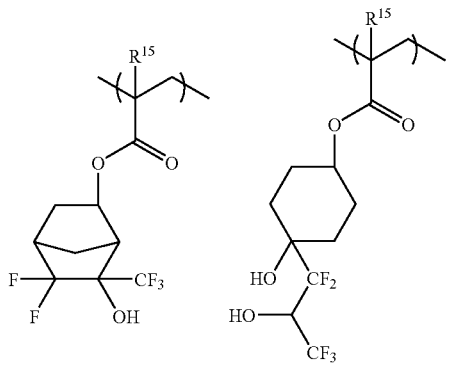
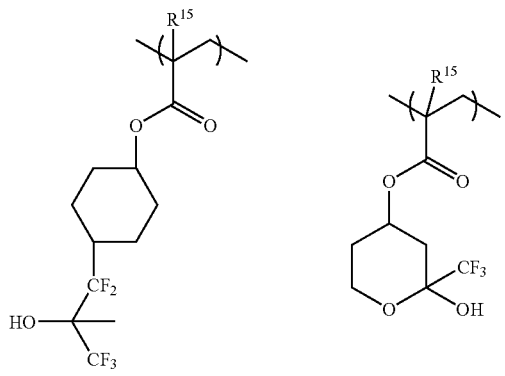

-continued

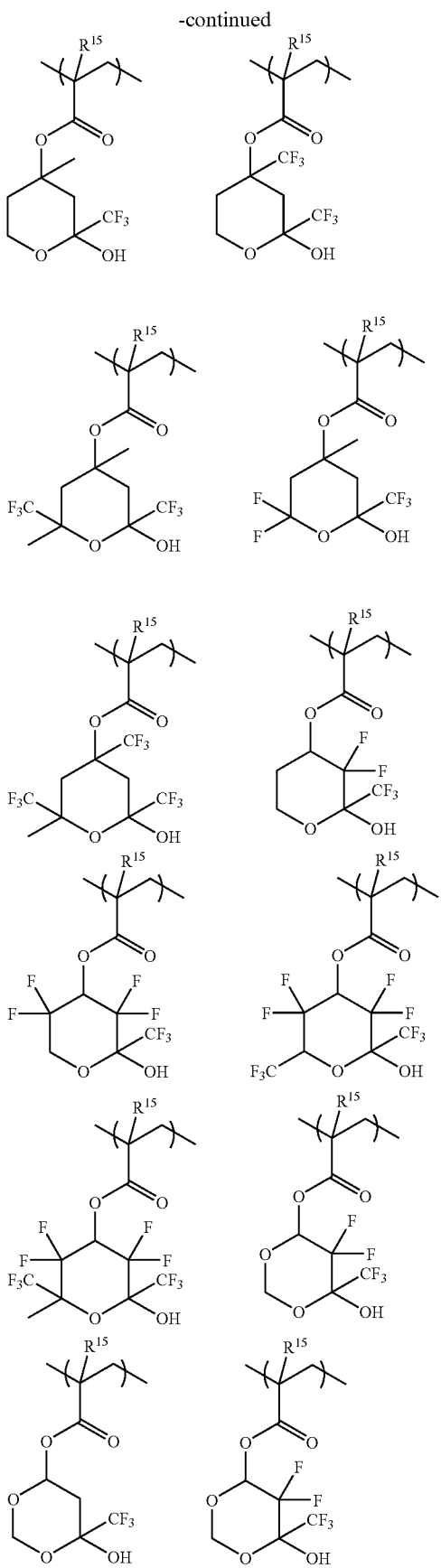

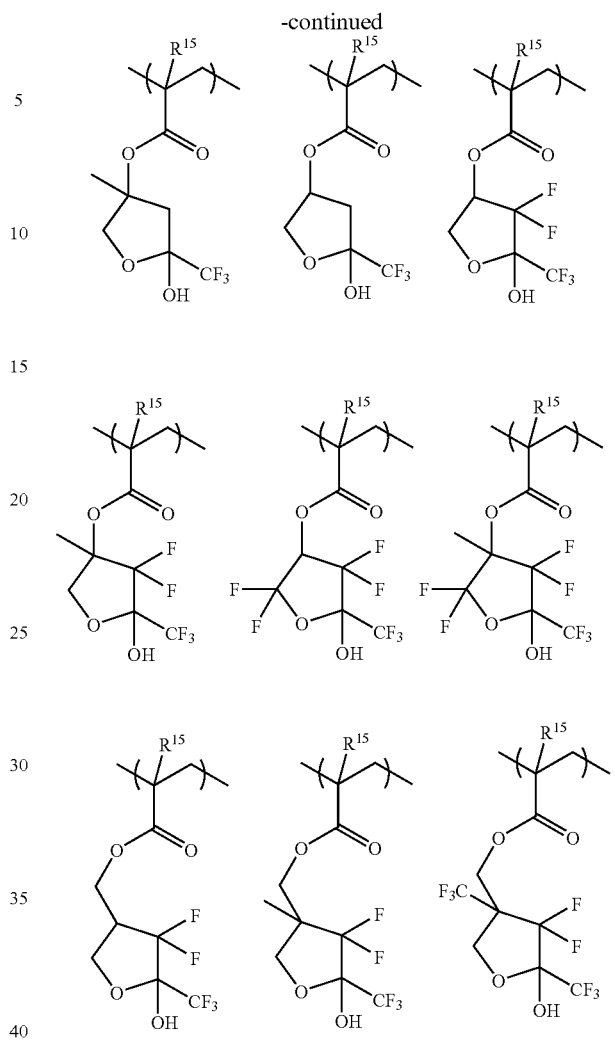

In the above formulae, $R^{15}$ represents a hydrogen atom or a methyl group.

Although the polymer according to the present invention is a copolymer in which at least a sulfonium salt having a polymerizable unsaturated bond, a (meth)acrylate having a lactone or a hydroxyl group as an adhesion group, and a (meth)acrylate having an ester substituted with an acid labile group are copolymerized, the copolymer may further comprise a repeating unit of a (meth)acrylate having an adhesion group shown below.

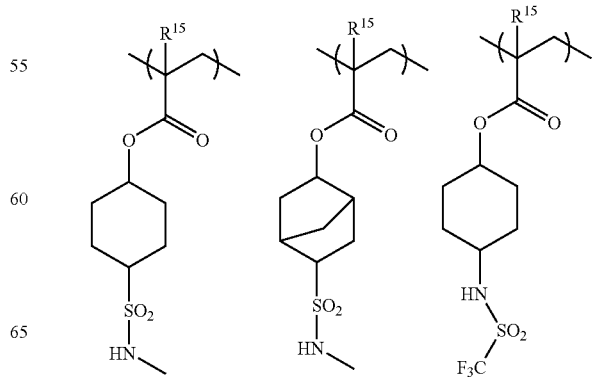

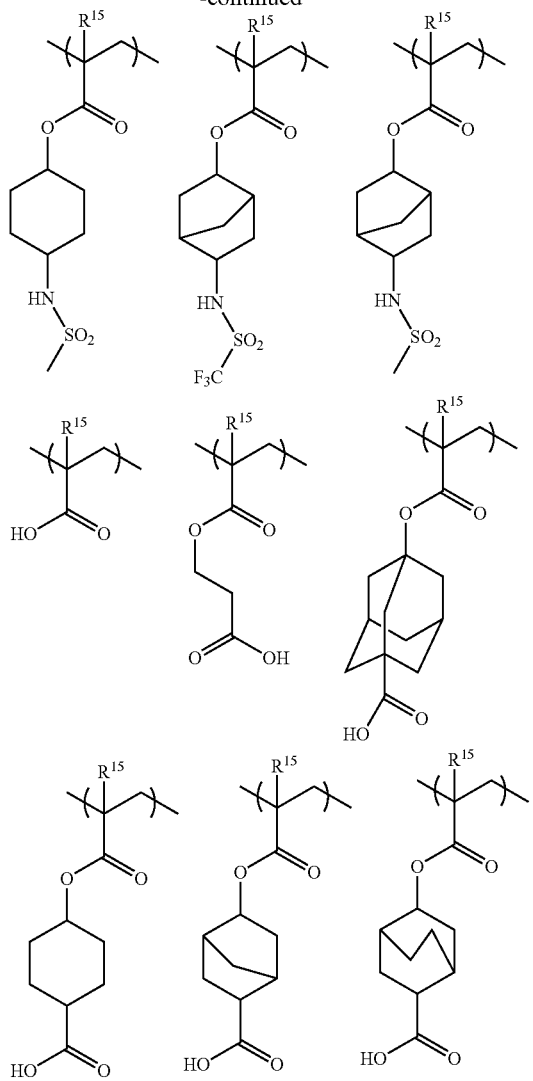

In the above formulae, $R^{15}$ represents a hydrogen atom or a methyl group.

Moreover, the polymer according to the present invention may comprise a repeating unit of styrene type shown below.

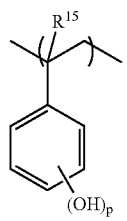

In the above formula, $R^{15}$ represents a hydrogen atom or a methyl group, and p is an integer of 0-2.

Furthermore, the polymer according to the present invention may comprise a repeating unit having an adhesion group obtained by polymerizing a norbornene derivative and maleic anhydride. Examples of the adhesion group obtained by polymerizing norbornene derivatives are shown below.

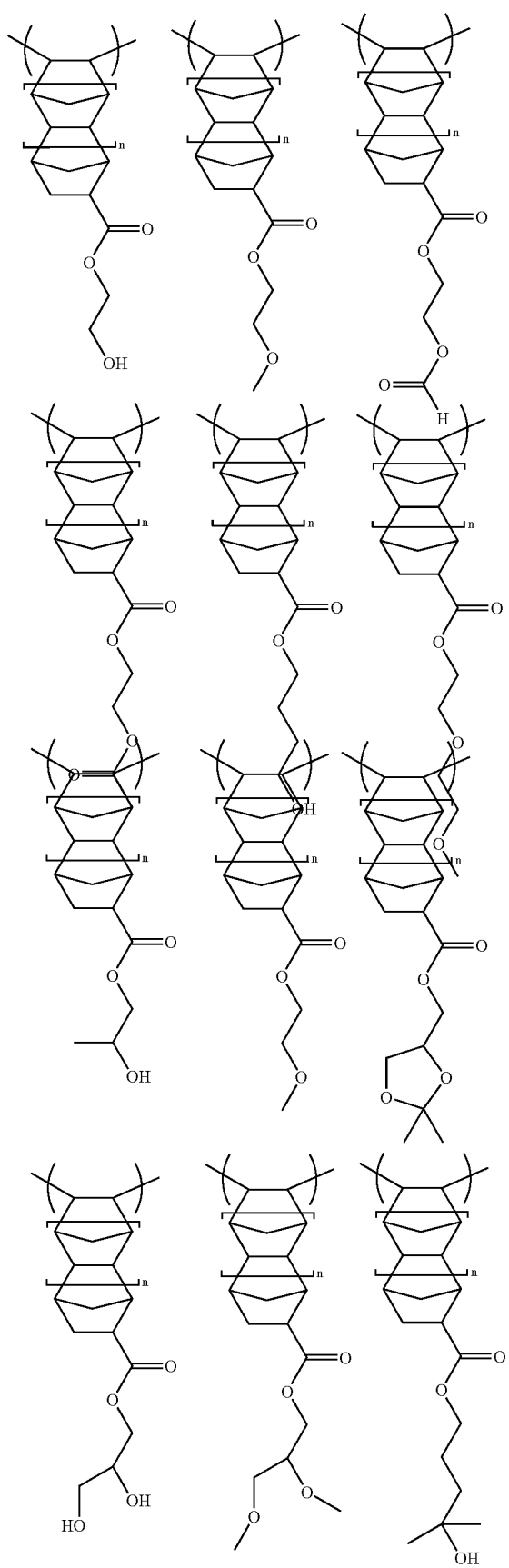

-continued
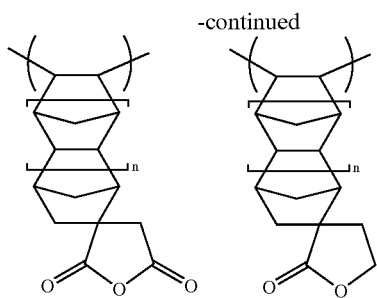
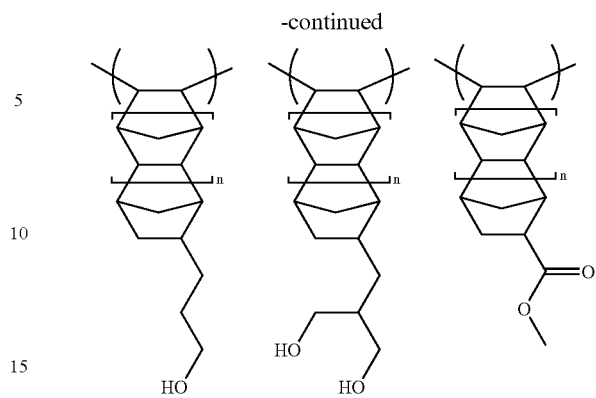
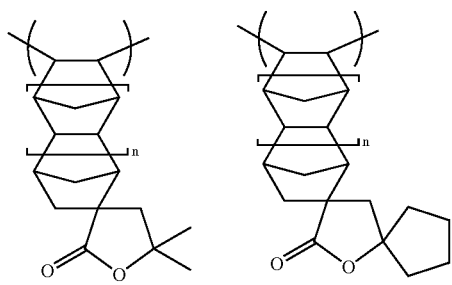
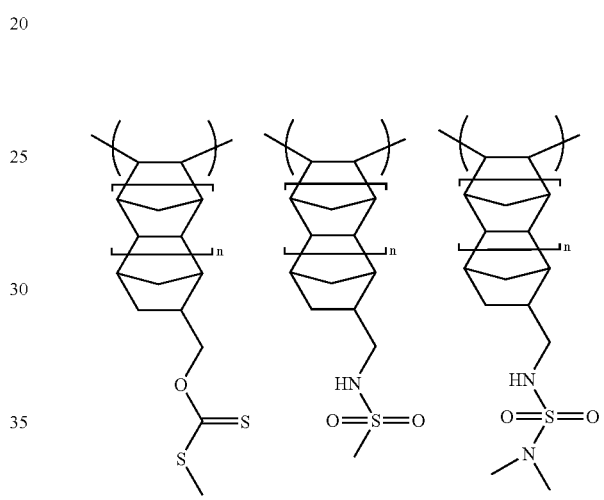
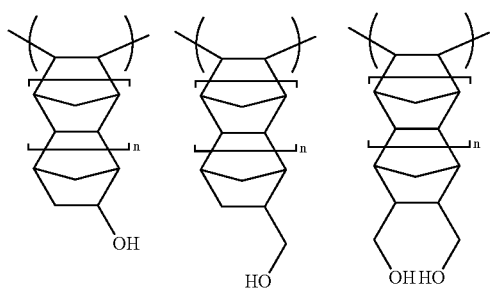
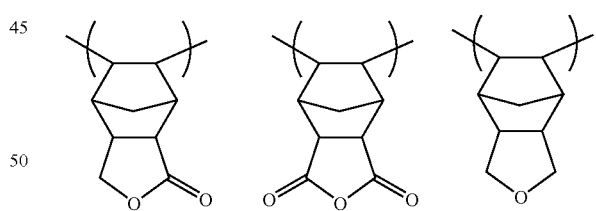
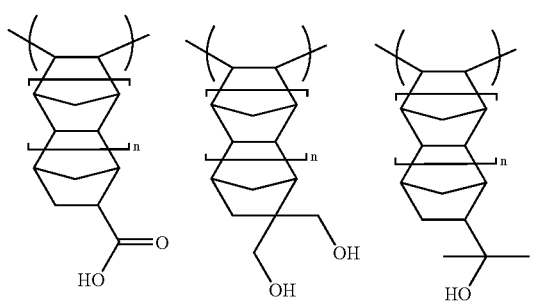
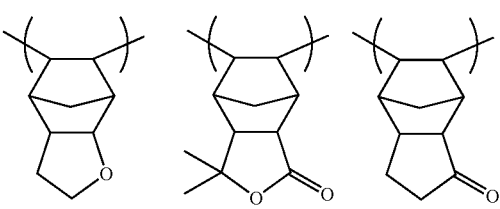

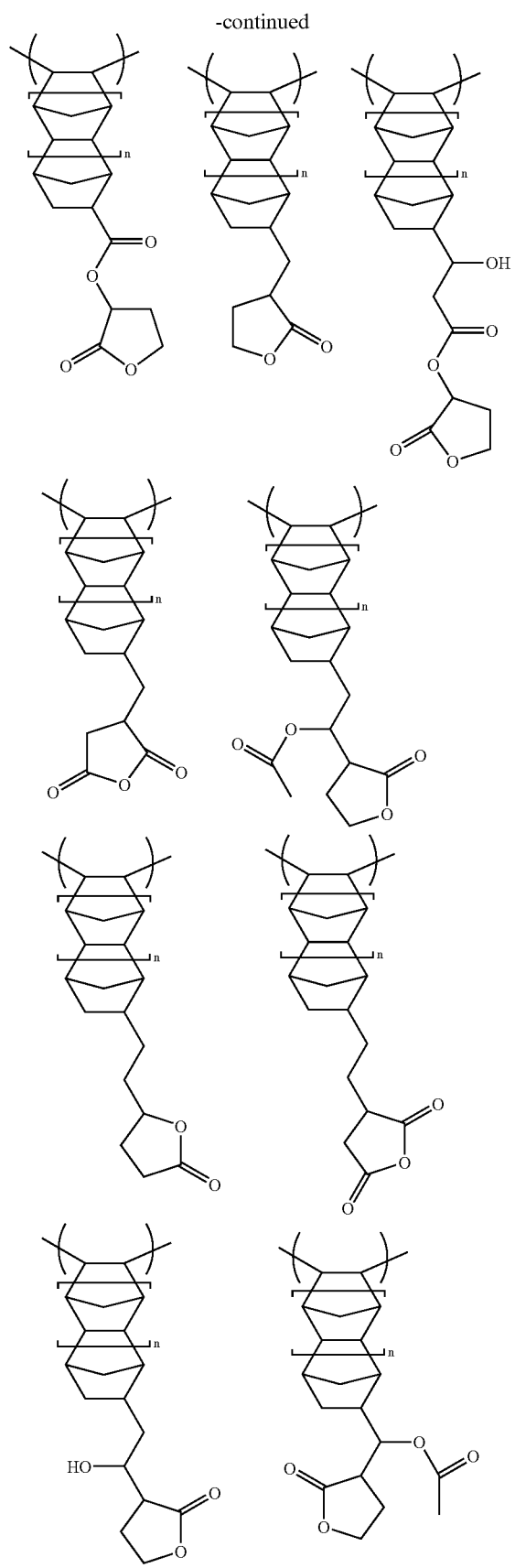
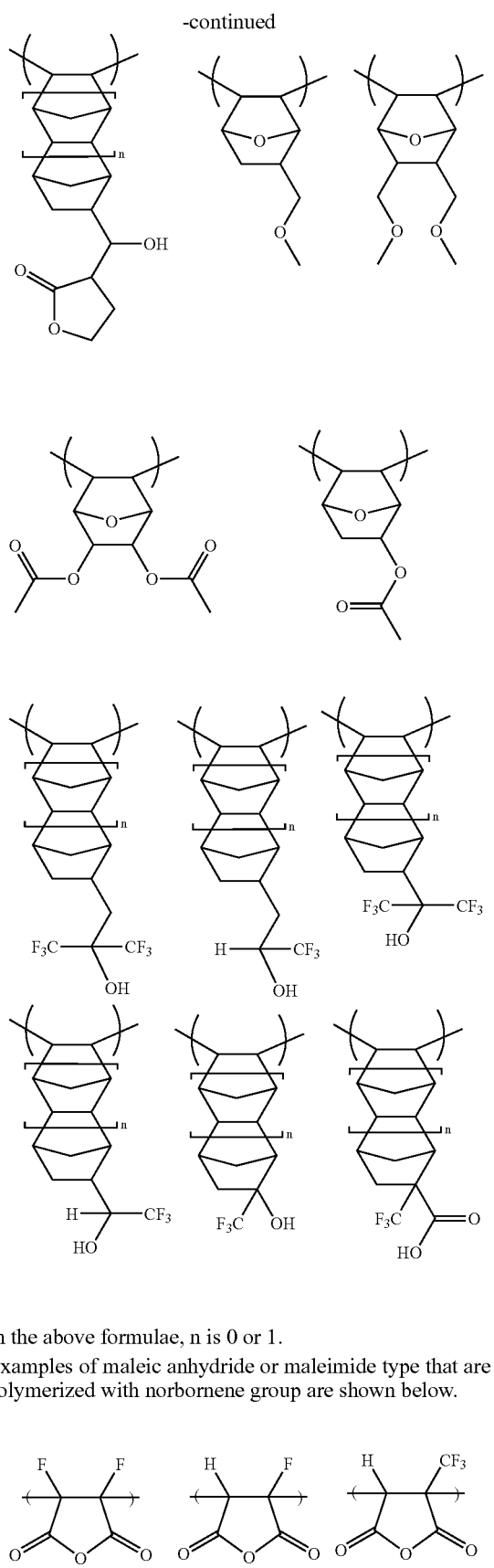
In the above formulae, n is 0 or 1.
Examples of maleic anhydride or maleimide type that are copolymerized with norbornene group are shown below.
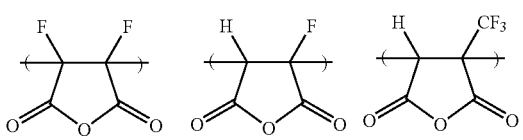

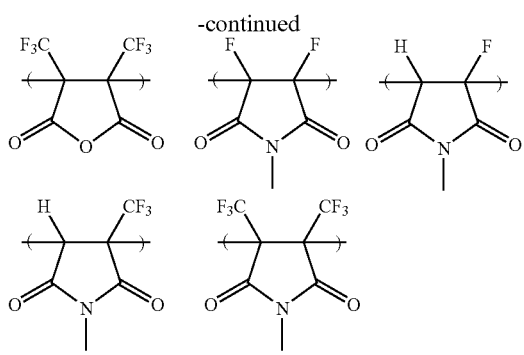

Although the resist composition according to the present invention proposes an acid generator of polymeric sulfonium salt obtained by polymerizing a sulfonium salt having a polymerizable unsaturated bond, a conventional acid generator can be further added.

Examples of the acid generators that can be added to the resist composition according to the present invention are as follow:

i) an onium salt represented by the following general formula (P1a-1), (P1a-2) or (P1b),
ii) a diazomethane derivative represented by the following general formula (P2),
iii) a glyoxime derivative represented by the following general formula (P3),
iv) a bis sulfone derivative represented by the following general formula (P4),
v) a sulfonate of a N-hydroxy imide compound represented by the following general formula (P5),
vi) a β-keto sulfonic acid derivative,
vii) a disulfone derivative,
viii) a nitro benzyl sulfonate derivative,
ix) a sulfonate derivative, etc.

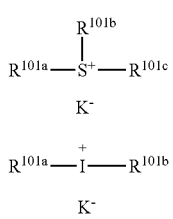

(In the formulae, $R^{101a}$, $R^{101b}$ and $R^{101c}$ independently represent a linear, branched or cyclic alkyl group, alkenyl group, oxoalkyl group or oxoalkenyl group each having 1-12 carbon atoms, an aryl group having 6-20 carbon atoms, an aralkyl group or an aryl oxoalkyl group having 7-12 carbon atoms. Some or all of hydrogen atoms of these groups may be substituted with an alkoxy group etc. $R^{101b}$ and $R^{101c}$ may form a ring. In the case that they form a ring, $R^{101b}$ and $R^{101c}$ represent an alkylene group having 1-6 carbon atoms respectively. $K^-$ represents a non-nucleophilic counter ion.)

The above-mentioned $R^{101a}$, $R^{101b}$ and $R^{101c}$ may be the same or different. Illustrative examples thereof as an alkyl group may include: a methyl group, an ethyl group, a propyl group, an isopropyl group, n-butyl group, sec-butyl group, tert-butyl group, a pentyl group, a hexyl group, a heptyl group, an octyl group, a cyclopentyl group, a cyclohexyl group, a cycloheptyl group, a cyclopropyl methyl group, 4-methyl cyclohexyl group, a cyclohexyl methyl group, a norbornyl group, an adamantyl group, etc. Illustrative examples of an alkenyl group may include: a vinyl group, an allyl group, a propenyl group, a butenyl group, a hexenyl group, a cyclohexenyl group, etc. Examples of an oxoalkyl group may include: 2-oxocyclopentyl group, 2-oxocyclohexyl group, etc. and 2-oxopropyl group, 2-cyclopentyl-2-oxoethyl group, 2-cyclohexyl-2-oxoethyl group, 2-(4-methylcyclohexyl)-2-oxoethyl group, etc. Examples of the oxoalkenyl group may include: 2-oxo-4-cyclohexenyl group, 2-oxo-4-propenyl group, etc. Examples of an aryl group may include: a phenyl group, a naphthyl group, etc., and an alkoxy phenyl groups such as p-methoxyphenyl group, m-methoxyphenyl group, o-methoxyphenyl group, an ethoxyphenyl group, p-tert-butoxyphenyl group, m-tert-butoxy phenyl group, etc., an alkyl phenyl group such as 2-methylphenyl group, 3-methylphenyl group, 4-methylphenyl group, an ethylphenyl group, 4-tert-butylphenyl group, 4-butylphenyl group, a dimethyl phenyl group, etc., an alkyl naphthyl group such as a methylnaphthyl group, an ethyl naphthyl group, etc., an alkoxy naphthyl group such as a methoxy naphthyl group, an ethoxy naphthyl group, etc., a dialkyl naphthyl group such as a dimethyl naphthyl group, a diethyl naphthyl group, etc., a dialkoxy naphthyl group such as a dimethoxy naphthyl group, a diethoxy naphthyl group, etc. Examples of the aralkyl group may include a benzyl group, a phenylethyl group, a phenethyl group, etc. Examples of an aryl oxoalkyl group may include: 2-aryl-2-oxoethyl group such as 2-phenyl-2-oxoethyl group, 2-(1-naphthyl)-2-oxoethyl group, 2-(2-naphthyl)-2-oxoethyl group, etc. Examples of an non-nucleophilic counter ion as $K^-$ may include: a halide ion such as a chloride ion, a bromide ion or the like, a fluoro alkyl sulfonate such as triflate, 1,1,1-trifluoro ethanesulfonate, nonafluoro butane sulfonate or the like, an aryl sulfonate such as tosylate, benzene sulfonate, 4-fluorobenzene sulfonate, 1,2,3,4,5-pentafluoro benzene sulfonate or the like, an alkyl sulfonate such as mesylate, butane sulfonate or the like.

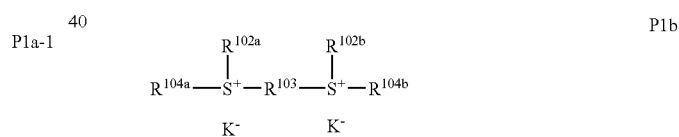

(In the formula, $R^{102a}$ and $R^{102b}$ each represents a linear, branched or cyclic alkyl group having 1-8 carbon atoms. $R^{103}$ represents a linear, branched or cyclic alkylene group having 1-10 carbon atoms. $R^{104a}$ and $R^{104b}$ each represent a 2-oxoalkyl group having 3-7 carbon atoms. $K^-$ represents an non-nucleophilic counter ion.)

Illustrative examples of the above-mentioned $R^{102a}$ and $R^{102b}$ may include: a methyl group, an ethyl group, a propyl group, an isopropyl group, n-butyl group, sec-butyl group, tert-butyl group, a pentyl group, a hexyl group, a heptyl group, an octyl group, a cyclopentyl group, a cyclohexyl group, a cyclopropylmethyl group, 4-methylcyclohexyl group, a cyclohexyl methyl group and the like. Examples of $R^{103}$ may include: a methylene group, an ethylene group, a propylene group, a butylene group, a pentylene group, a hexylene group, a heptylene group, an octylene group, a nonylene group, 1,4-cyclohexylene group, 1,2-cyclohexylene group, 1,3-cyclopentylene group, 1,4-cyclooctylene group, 1,4-cyclohexane dimethylene group and the like. Examples of $R^{104a}$ and $R^{104b}$ may include: 2-oxopropyl group, 2-oxocyclopentyl group, 2-oxocyclohexyl group, 2-oxocycloheptyl group and the like. As K⁻, the same as mentioned in the formulae (P1a-1) and (P1a-2) can be exemplified.

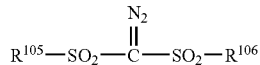

P2

(In the formula, $R^{105}$ and $R^{106}$ represent a linear, branched or cyclic alkyl group or alkyl-halide group having 1-12 carbon atoms, an aryl group or aryl-halide group having 6-20 carbon atoms, or an aralkyl group having 7-12 carbon atoms.)

Examples of an alkyl group as $R^{105}$ and $R^{106}$ may include: a methyl group, an ethyl group, a propyl group, an isopropyl group, n-butyl group, sec-butyl group, tert-butyl group, a pentyl group, a hexyl group, a heptyl group, an octyl group, an amyl group, a cyclopentyl group, a cyclohexyl group, a cycloheptyl group, a norbornyl group, an adamantyl group and the like. Examples of a halogenated alkyl group may include: trifluoromethyl group, 1,1,1-trifluoroethyl group, 1,1,1-trichloroethyl group, a nonafluoro butyl group and the like. Examples of the aryl group may include: a phenyl group, an alkoxyphenyl group such as p-methoxyphenyl group, m-methoxyphenyl group, o-methoxyphenyl group, an ethoxyphenyl group, p-tert-butoxyphenyl group, m-tert-butoxyphenyl group or the like, an alkylphenyl groups such as 2-methylphenyl group, 3-methylphenyl group, 4-methylphenyl group, an ethylphenyl group, 4-tert-butylphenyl group, 4-butylphenyl group, a dimethylphenyl group or the like. Examples of the halogenated aryl group may include: a fluorophenyl group, a chlorophenyl group, 1,2,3,4,5-pentafluoro phenyl group and the like. Examples of the aralkyl group may include: a benzyl group, a phenethyl group, and the like.

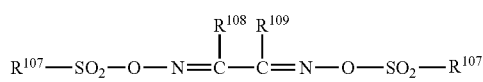

P3

(In the formula, $R^{107}$, $R^{108}$ and $R^{109}$ represent a linear, branched or cyclic alkyl group or halogenated alkyl group having 1 to 12 carbon atoms, an aryl group or a halogenated aryl group having 6 to 20 carbon atoms, or an aralkyl group having 7 to 12 carbon atoms. $R^{108}$ and $R^{109}$ may bond each other to form a cyclic structure. When they form a cyclic structure, $R^{108}$ and $R^{109}$ each represents a linear or branched alkylene group having 1 to 6 carbon atoms.)

Examples of the alkyl group, the halogenated alkyl group, the aryl group, the halogenated aryl group, and the aralkyl group as $R^{107}$, $R^{108}$ and $R^{109}$ may be the same as exemplified for $R^{105}$ and $R^{106}$. In addition, as an alkylene group for $R^{108}$ and $R^{109}$, a methylene group, an ethylene group, a propylene group, a butylene group, a hexylene group and the like may be exemplified.

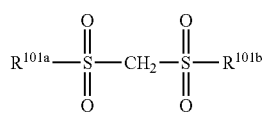

P4

(In the formula, $R^{101a}$ and $R^{101b}$ are the same as explained above.)

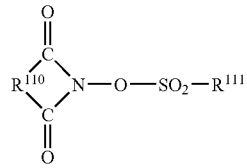

P5

(In the formula, $R^{110}$ represents an arylene group having 6-10 carbon atoms, an alkylene group having 1-6 carbon atoms or an alkenylene group having 2-6 carbon atoms. Some or all of hydrogen atoms of these groups may be further substituted with a linear or branched alkyl group or an alkoxy group having 1-4 carbon atoms, a nitro group, an acetyl group, or a phenyl group. $R^{111}$ represents a linear, branched or substituted alkyl group, alkenyl group or alkoxy alkyl group having 1-8 carbon atoms, a phenyl group or a naphthyl group. Some or all of hydrogen atoms of these groups may be substituted with an alkyl group or an alkoxy group having 1-4 carbon atoms; a phenyl group which may be substituted with an alkyl group or an alkoxy group having 1-4 carbon atoms, a nitro group or an acetyl group; a hetero aromatic group having 3-5 carbon atoms; or a chlorine atom or a fluorine atom.)

Examples of the arylene group as $R^{110}$ may include: 1,2-phenylene group, 1,8-naphtylene group and the like. Examples of the alkylene group may include: a methylene group, a 1,2-ethylene group, a 1,3-propylene group, a 1,4-butylene group, 1-phenyl-1,2-ethylene group, a norbornane-2,3-di-yl group, etc. Examples of the alkenylene group may include: 1,2-vinylene group, 1-phenyl-1,2-vinylene group, 5-norbornene-2,3-di-yl group and the like. Examples of the alkyl group as $R^{111}$ may be the same as exemplified for $R^{101a}$-$R^{101c}$. Examples of the alkenyl group may include: a vinyl group, 1-propenyl group, an allyl group, 1-butenyl group, 3-butenyl group, an isoprenyl group, 1-pentenyl group, 3-pentenyl group, 4-pentenyl group, a dimethyl allyl group, 1-hexenyl group, 3-hexenyl group, 5-hexenyl group, 1-heptenyl group, 3-heptenyl group, 6-heptenyl group, 7-octenyl group and the like. Examples of the alkoxy alkyl group may include: a methoxy methyl group, an ethoxy methyl group, a propoxy methyl group, a butoxy methyl group, a pentyloxy methyl group, a hexyloxy methyl group, a heptyloxy methyl group, a methoxy ethyl group, an ethoxy ethyl group, a propoxy ethyl group, a butoxy ethyl group, a pentyloxy ethyl group, a hexyloxy ethyl group, a methoxy propyl group, an ethoxy propyl group, a propoxy propyl group, a butoxy propyl group, a methoxy butyl group, an ethoxy butyl group, a propoxy butyl group, a methoxy pentyl group, an ethoxy pentyl group, a methoxy hexyl group, a methoxy heptyl group and the like.

In addition, examples of the alkyl group having 1-4 carbon atoms which may be further substituted, a methyl group, an ethyl group, a propyl group, an isopropyl group, n-butyl group, an isobutyl group, a tert-butyl group and the like. Examples of the alkoxy group having 1-4 carbon atoms may include: a methoxy group, an ethoxy group, a propoxy group, an isopropoxy group, n-butoxy group, an isobutoxy group, a tert-butoxy group and the like. Examples of the phenyl group which may be substituted with an alkyl group and an alkoxy group having 1-4 carbon atoms, a nitro group or an acetyl group may include: a phenyl group, a tolyl group, p-tert-butoxy phenyl group, p-acetyl phenyl group, p-nitrophenyl group and the like. Examples of a hetero aromatic group having 3-5 carbon atoms may include: a pyridyl group, a furyl group and the like.

Illustrative examples of an acid generator may include: an onium salt such as diphenyl iodonium trifluoromethane sulfonate, (p-tert-butoxy phenyl)phenyl iodonium trifluoromethane sulfonate, diphenyl iodonium p-toluenesulfonate, (p-tert-butoxy phenyl)phenyl iodonium p-toluenesulfonate, triphenyl sulfonium trifluoromethane sulfonate, (p-tert-butoxy phenyl)diphenyl sulfonium trifluoromethane sulfonate, bis(p-tert-butoxy phenyl)phenyl sulfonium trifluoromethane sulfonate, tris(p-tert-butoxy phenyl)sulfonium trifluoromethane sulfonate, triphenyl sulfonium p-toluenesulfonate, (p-tert-butoxy phenyl)diphenyl sulfonium p-toluenesulfonate, bis(p-tert-butoxy phenyl)phenyl sulfonium p-toluenesulfonate, tris(p-tert-butoxy phenyl)sulfonium p-toluenesulfonate, triphenyl sulfonium nonafluoro butane sulfonate, triphenyl sulfonium butane sulfonate, trimethyl sulfonium trifluoromethane sulfonate, trimethyl sulfonium p-toluenesulfonate, cyclohexyl methyl(2-oxocyclohexyl)sulfonium trifluoromethane sulfonate, cyclohexyl methyl(2-oxo cyclohexyl)sulfonium p-toluenesulfonate, dimethyl phenyl sulfonium trifluoromethane sulfonate, dimethyl phenyl sulfonium p-toluenesulfonate, dicyclohexyl phenyl sulfonium trifluoromethane sulfonate, dicyclohexyl phenyl sulfonium p-toluenesulfonate, trinaphthylsulfonium trifluoromethane sulfonate, (2-norbonyl)methyl(2-oxocyclohexyl)sulfonium trifluoromethane sulfonate, ethylene bis[methyl(2-oxocyclopentyl)sulfonium trifluoromethane sulfonate], 1,2'-naphthyl carbonyl methyl tetrahydro thiophenium triflate and the like.

Examples of a diazomethane derivative may include: bis (benzene sulfonyl)diazomethane, bis(p-toluene sulfonyl)diazomethane, bis(xylene sulfonyl)diazomethane, bis(cyclohexyl sulfonyl)diazomethane, bis(cyclopentyl sulfonyl) diazomethane, bis(n-butylsulfonyl)diazomethane, bis (isobutyl sulfonyl)diazomethane, bis(sec-butylsulfonyl) diazomethane, bis(n-propylsulfonyl)diazomethane, bis (isopropyl sulfonyl)diazomethane, bis(tert-butyl sulfonyl) diazomethane, bis(n-amylsulfonyl)diazomethane, bis (isoamylsulfonyl)diazomethane, bis(sec-amylsulfonyl) diazomethane, bis(tert-amylsulfonyl)diazomethane, 1-cyclohexylsulfonyl-1-(tert-butyl sulfonyl)diazomethane, 1-cyclohexyl sulfonyl-1-(tert-amyl sulfonyl)diazomethane, 1-tert-amyl sulfonyl-1-(tert-butyl-sulfonyl)diazomethane and the like.

Examples of a glyoxime derivative may include: bis-O-(p-toluene sulfonyl)-α-dimethylglyoxime, bis-O-(p-toluene sulfonyl)-α-diphenyl glyoxime, bis-O-(p-toluene sulfonyl)-α-dicyclohexyl glyoxime, bis-O-(p-toluene sulfonyl)-2,3-pentanedione glyoxime, bis-O-(p-toluene sulfonyl)-2-methyl-3,4-pentanedione glyoxime, bis-O-(n-butane sulfonyl)-α-dimethylglyoxime, bis-O-(n-butane sulfonyl)-α-diphenyl glyoxime, bis-O-(n-butane sulfonyl)-α-dicyclohexyl glyoxime, bis-O-(n-butane sulfonyl)-2,3-pentanedione glyoxime, bis-O-(n-butane sulfonyl)-2-methyl-3,4-pentanedione glyoxime, bis-O-(methane sulfonyl)-α-dimethylglyoxime, bis-O-(trifluoromethane sulfonyl)-α-dimethylglyoxime, bis-O-(1,1,1-trifluoro ethane sulfonyl)-α-dimethylglyoxime, bis-O-(tert-butane sulfonyl)-α-dimethylglyoxime, bis-O-(perfluoro octane sulfonyl)-α-dimethylglyoxime, bis-O-(cyclohexane sulfonyl)-α-dimethylglyoxime, bis-O-(benzene sulfonyl)-α-dimethylglyoxime, bis-O-(p-fluorobenzene sulfonyl)-α-dimethylglyoxime, bis-O-(p-tert-butylbenzene sulfonyl)-α-dimethylglyoxime, bis-O-(xylene sulfonyl)-α-dimethylglyoxime, bis-O-(camphor sulfonyl)-α-dimethylglyoxime and the like.

Examples of a bissulfone derivative may include: bis naphthyl sulfonyl methane, bis-trifluoro methyl sulfonyl methane, bis methyl sulfonyl methane, bis ethyl sulfonyl methane, bis propyl sulfonyl methane, bis isopropyl sulfonyl methane, bis-p-toluene sulfonyl methane, bis benzene sulfonyl methane and the like.

Examples of the β-ketosulfone derivative may include: 2-cyclohexyl carbonyl-2-(p-toluene sulfonyl)propane, 2-isopropyl carbonyl-2-(p-toluene sulfonyl)propane and the like.

Examples of the disulfone derivative may include: diphenyl disulfone, a dicyclohexyl disulfone and the like.

Examples of the nitro benzyl sulfonate derivative may include: 2,6-dinitro benzyl p-toluenesulfonate, 2,4-dinitro benzyl p-toluenesulfonate, and the like.

Examples of the sulfonate derivative may include: 1,2,3-tris(methane sulfonyloxy)benzene, 1,2,3-tris(trifluoromethane sulfonyloxy)benzene, 1,2,3-tris(p-toluene sulfonyloxy)benzene, and the like.

Examples of the sulfonate derivative of N-hydroxy imide compound may include: N-hydroxy succinimide methane sulfonate, N-hydroxy succinimide trifluoromethane sulfonate, N-hydroxy succinimide ethane sulfonate, N-hydroxy succinimide 1-propane sulfonate, N-hydroxy succinimide 2-propane sulfonate, N-hydroxy succinimide 1-pentane sulfonate, N-hydroxy succinimide 1-octane sulfonate, N-hydroxy succinimide p-toluenesulfonate, N-hydroxy succinimide p-methoxybenzene sulfonate, N-hydroxy succinimide 2-chloroethane sulfonate, N-hydroxy succinimide benzenesulfonate, N-hydroxy succinimide-2,4,6-trimethyl benzene sulfonate, N-hydroxy succinimide 1-naphthalene sulfonate, N-hydroxy succinimide 2-naphthalene sulfonate, N-hydroxy-2-phenyl succinimide methane sulfonate, N-hydroxy maleimide methane sulfonate, N-hydroxy maleimide ethane sulfonate, N-hydroxy-2-phenyl maleimide methane sulfonate, N-hydroxy glutarimide methane sulfonate, N-hydroxy glutarimide benzenesulfonate, N-hydroxy phthalimide methane sulfonate, N-hydroxy phthalimide benzenesulfonate, N-hydroxy phthalimide trifluoromethane sulfonate, N-hydroxy phthalimide p-toluenesulfonate, N-hydroxy naphthalimide methane sulfonate, N-hydroxy naphthalimide benzenesulfonate, N-hydroxy-5-norbornene-2,3-dicarboxyimido methane sulfonate, N-hydroxy-5-norbornene-2,3-dicarboxyimido trifluoromethane sulfonate, N-hydroxy-5-norbornene-2,3-dicarboxyimid p-toluenesulfonate and the like. In addition an acid generator of oxime type disclosed in WO2004/074242 A2 can be represented.

Preferable examples thereof may include: an onium salt such as triphenyl sulfonium trifluoromethane sulfonate, (p-tert-butoxy phenyl)diphenyl sulfonium trifluoromethane sulfonate, tris(p-tert-butoxy phenyl)sulfonium trifluoromethane sulfonate, triphenyl sulfonium p-toluenesulfonate, (p-tert-butoxy phenyl)diphenyl sulfonium p-toluenesulfonate, tris(p-tert-butoxy phenyl)sulfonium p-toluenesulfonate, trinaphthylsulfonium trifluoromethane sulfonate, cyclohexyl methyl(2-oxocyclohexyl)sulfonium trifluoromethane sulfonate, (2-norbonyl)methyl(2-oxocyclohexyl)sulfonium trifluoromethane sulfonate, 1,2'-naphthyl carbonylmethyl tetrahydrothiophenium triflate, and the like;

a diazomethane derivative such as bis(benzene sulfonyl) diazomethane, bis(p-toluene sulfonyl)diazomethane, bis(cyclohexyl sulfonyl)diazomethane, bis(n-butylsulfonyl)diazomethane, bis(isobutyl sulfonyl)diazomethane, bis(sec-butylsulfonyl)diazomethane, bis(n-propyl sulfonyl) diazomethane, bis(isopropyl sulfonyl)diazomethane, bis (tert-butylsulfonyl)diazomethane and the like;

a glyoxime derivative, such as bis-O-(p-toluene sulfonyl)-α-dimethylglyoxime and bis-O-(n-butane sulfonyl)-α-dimethylglyoxime and the like;

a bissulfone derivative, such as bisnaphthyl sulfonyl methane and the like;

a sulfonate derivative of N-hydroxyimide compounds, such as N-hydroxy succinimide methane sulfonate, N-hydroxy succinimide trifluoromethane sulfonate, N-hydroxy succinimide 1-propane sulfonate, N-hydroxy succinimide 2-propane sulfonate, N-hydroxy succinimide 1-pentane sulfonate, N-hydroxy succinimide p-toluene sulfonate, N-hydroxy naphthalimide methane sulfonate and N-hydroxy naphthalimide benzene sulfonate and the like.

The above-mentioned acid generator may be used alone or in admixture. The onium salt is excellent to achieve straight wall profiles. The diazomethane derivative and the glyoxime derivative are excellent in an effect of reducing standing wave. Therefore, if both of them are combined, minute control of profile can be conducted.

An amount of the acid generator to be added is preferably 0 to 15 parts (parts by mass, hereinafter represents the same meaning), more preferably 0 to 8 parts to 100 parts of a base resin comprising a polymeric acid generator as a total amount with an acid generator generating polymeric acid, especially with the sulfonium salt represented by the above formula (1). If it is 15 parts or less, there is little possibility that transmittance of the resist is lowered, resolution of a resist composition is degraded, or dissolution amount of an acid generator to water in the liquid immersion exposure increases.

An organic solvent which can be used in the resist composition of the present invention is not limited, as far as a base resin, an acid generator and other additives can be dissolved therein. Examples of such an organic solvent may include: ketones such as cyclohexanone, methyl-2-amyl ketone and the like; alcohols such as 3-methoxy butanol, 3-methyl-3-methoxy butanol, 1-methoxy-2-propanol, 1-ethoxy-2-propanol and the like; ethers such as propylene glycol monomethyl ether, ethylene glycol monomethyl ether, propyleneglycol monoethyl ether, ethylene glycol monoethyl ether, propylene-glycol dimethyl ether, diethylene-glycol dimethyl ether and the like; esters such as propylene-glycol-monomethyl-ether acetate, propylene-glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene-glycol mono-tert-butyl-ether acetate. They can be used alone or as a mixture of two or more of them. However, they are not limited thereto.

In a resist composition of the present invention, diethyleneglycol dimethyl ether and 1-ethoxy-2-propanol which have the most excellent solubility of a base polymer and an acid generator in resist components among these organic solvents, in addition, propylene glycol monomethyl ether acetate of a safety solvent or a mixture thereof can be preferably used.

An amount of the organic solvent to be added is 200 to 1,000 parts, more preferably 400 to 800 parts to 100 parts of a base resin.

Furthermore, a dissolution inhibitor can be added to the resist composition of the present invention. Preferable examples of the dissolution inhibitor may be a compound having an average molecular weight of 100-1,000, preferably 150-800, wherein there are two or more of phenolic hydroxyl groups in a molecule, and hydrogen atoms of the phenolic hydroxyl groups are substituted with an acid labile group at a ratio of 0-100 mole % on average as a whole, or there are carboxyl groups in a molecule, and hydrogen atoms of the carboxyl groups are substituted with an acid labile group at a ratio of 80-100 mole % on average as a whole.

The substitution rate with an acid labile group of hydrogen atoms of the phenolic hydroxyl group or the carboxyl group is more than 0 mole % of the whole phenolic hydroxyl groups or the carboxyl groups on average, preferably 30 mole % or more, and the upper limit thereof is 100 mole %, preferably 80 mole %.

In this case, the compound which has two or more of phenolic hydroxyl groups and the compound which has a carboxyl group are preferably the compounds represented by the following formulae (D1)-(D14).

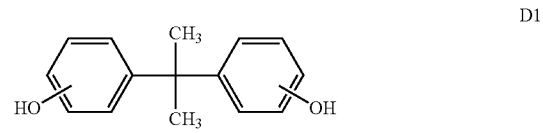

D1

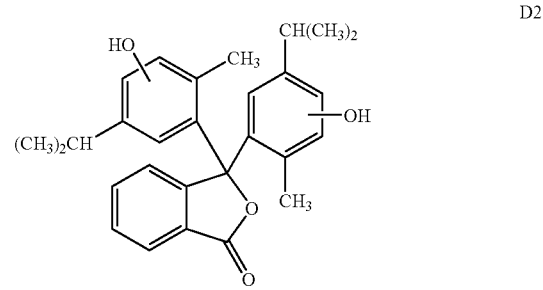

D2

D3

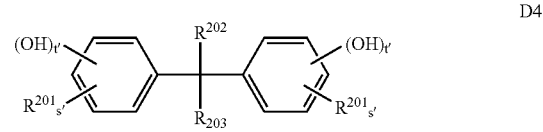

D4

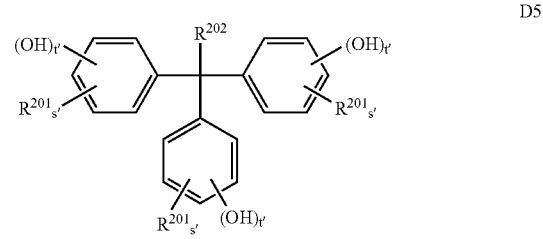

D5

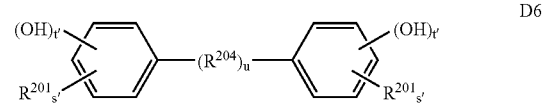

D6

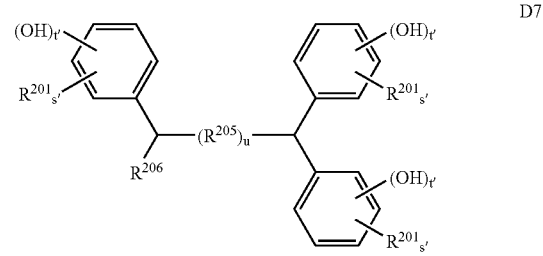

D7

-continued

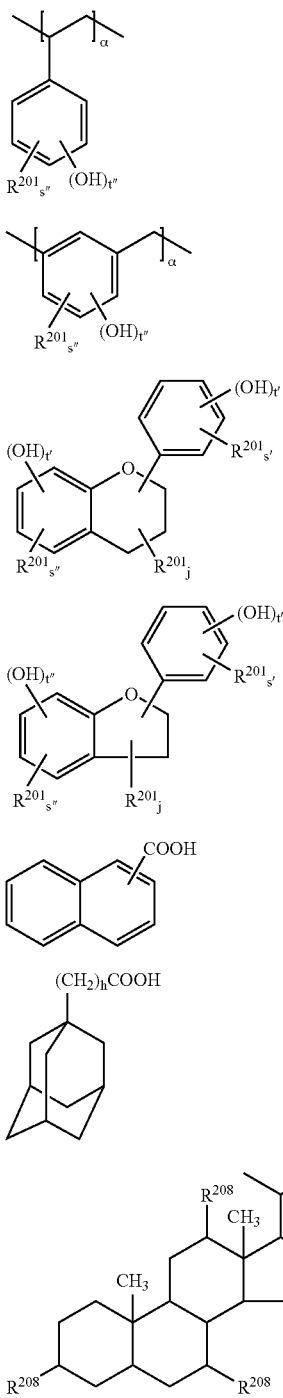

(In the formulae, each of $R^{201}$ and $R^{202}$ represents a hydrogen atom or a linear or branched alkyl group or alkenyl group having 1-8 carbon atoms. $R^{203}$ represents a hydrogen atom or a linear or branched alkyl group or alkenyl group having 1-8 carbon atoms, or —$(R^{207})_h$COOH. $R^{204}$ represents —$(CH_2)_i$- (i=2-10), an arylene group having 6-10 carbon atoms, a carbonyl group, a sulfonyl group, an oxygen atom, or a sulfur atom. $R^{205}$ represents an alkylene group having 1-10 carbon atoms, an arylene group having 6-10 carbon atoms, a carbonyl group, a sulfonyl group, an oxygen atom, or a sulfur atom.

$R^{206}$ represents a hydrogen atom, a linear or branched alkyl group or alkenyl group having 1-8 carbon atoms, a phenyl group or a naphthyl group each substituted with a hydroxyl group. $R^{207}$ represents a linear or branched alkylene group having 1-10 carbon atoms. $R^{208}$ represents a hydrogen atom or a hydroxyl group. j is an integer of 0-5. u and h are 0 or 1. s, t, s', t', s", t" satisfy s+t=8, s'+t'=5, s"+t"=4, and are the number so that each of the phenyl skeleton may have at least one hydroxyl group. α is the number so that the molecular weight of the compounds of the formulae (D8) and (D9) may be 100 to 1,000.) In the above formulae, $R^{201}$ and $R^{202}$ may represent a hydrogen atom, a methyl group, an ethyl group, a butyl group, a propyl group, an ethynyl group and a cyclohexyl group. $R^{203}$ may represent the same group as $R^{201}$ and $R^{202}$, —COOH or —CH$_2$COOH, and $R^{204}$ may represent an ethylene group, a phenylene group, a carbonyl group, a sulfonyl group, an oxygen atom, a sulfur atom, etc. $R^{205}$ may represent a methylene group, or the same group as $R^{204}$. $R^{206}$ may represent a hydrogen atom, a methyl group, an ethyl group, a butyl group, a propyl group, an ethynyl group, a cyclohexyl group, a phenyl group subsituted with a hydroxyl group, or a naphthyl group subsituted with a hydroxyl group, etc.

The acid labile group of the dissolution inhibitor can be various groups. Specific examples thereof may include: the groups represented by the following general formulae (L1)-(L5), tertiary alkyl group having 4-20 carbon atoms, a trialkylsilyl group wherein the carbon number of each alkyl group is 1-6, and an oxoalkyl group having 4-20 carbon atoms.

 (L1)

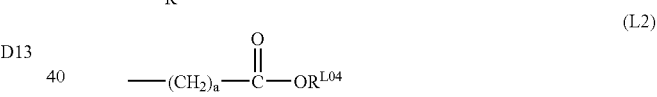 (L2)

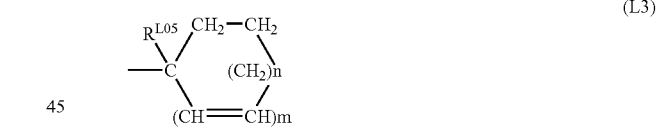 (L3)

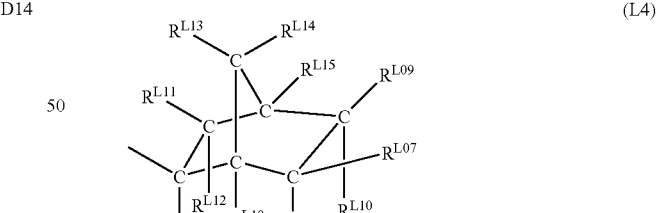 (L4)

 (L5)

(In the formulae, $R^{L01}$ and $R^{L02}$ represent a hydrogen atom or a linear, branched or cyclic alkyl group having 1-18 carbon atoms. $R^{L03}$ represents a monovalent hydrocarbon group having 1-18 carbon atoms which may have hetero atoms such as an oxygen atom. $R^{L01}$ and $R^{L02}$, $R^{L01}$ and $R^{L03}$, $R^{L02}$ and $R^{L03}$ may form a ring. In the case that they form a ring, $R^{L01}$, $R^{L02}$ and $R^{L03}$ independently represent a linear or branched alkylene group having 1-18 carbon atoms. $R^{L04}$ represents tertiary alkyl group having 4-20 carbon atoms, a trialkylsilyl group wherein each of the alkyl groups has 1-6 carbon atoms, an oxoalkyl group having 4-20 carbon atoms, or a group represented by the above-mentioned general formula (L1). $R^{L05}$ represents a monovalent hydrocarbon group having 1-8 carbon atoms which may contain a hetero atom, or an aryl group having 6-20 carbon atoms which may be substituted. $R^{L06}$ represents a monovalent hydrocarbon group having 1-8 carbon atoms which may contain a hetero atom, or an aryl group having 6-20 carbon atoms which may be substituted. $R^{L07}$ to $R^{L16}$ independently represent a hydrogen atom or a monovalent hydrocarbon group having 1-15 carbon atoms which may contain a hetero atom. $R^{L07}$ to $R^{L16}$ may form a ring. In that case, they represent a divalent hydrocarbon group having 1-15 carbon atoms which may contain a hetero atom. Moreover, $R^{L07}$-$R^{L16}$ which bond adjacent carbon atoms may bond each other without anything between them to form a double bond. a is an integer of 0-6. m is 0 or 1, and n is any one of 0, 1, 2 or 3, and m and n are the number satisfying 2m+n=2 or 3.)

The blending amount of the above-mentioned dissolution inhibitor is 0 to 50 parts, preferably 5 to 50 parts, more preferably 10 to 30 parts to 100 parts of a base resin. They can be used alone or as a mixture of two or more of them.

If the blending amount is 5 parts or more, resolution further improves. If the blending amount is 50 parts or less, there is little possibility that film decrease in a pattern is caused, and resolution is lowered.

In addition, the above-mentioned dissolution inhibitor can be prepared by introducing an acid labile group to a compound which has a phenolic hydroxyl group or a carboxyl group using an organic chemical method.

Furthermore, a basic compound to improve preservation stability can be blended in the resist composition of the present invention.

A basic compound which can suppress a diffusion rate when the acid generated by an acid generator in the resist film is preferable. By blending the basic compound, a diffusion rate of the acid in the resist film can be suppressed, and thereby resolution is improved, change of sensitivity after exposure is suppressed, dependency on a substrate or atmosphere can be decreased, and exposure margin or pattern profile and the like can be improved.

Examples of such a basic compound may include: a primary, secondary and tertiary aliphatic amines, a mixed amine, an aromatic amine, a heterocyclic amine, a compound containing nitrogen which has a carboxyl group, a compound containing nitrogen which has a sulfonyl group, a compound containing nitrogen which has a hydroxyl group, a compound containing nitrogen which has a hydroxy phenyl group, an alcohol compound containing nitrogen, an amide derivative, an imido derivative and the like.

Specific examples of the primary aliphatic amine may include: ammonia, methylamine, ethylamine, n-propylamine, isopropylamine, n-butylamine, isobutyl amine, sec-butyl-amine, tert-butylamine, pentylamine, tert-amylamine, cyclopentyl amine, hexylamine, cyclohexyl amine, heptylamine, octylamine, nonylamine, decyl amine, dodecylamine, cetylamine, methylene diamine, ethylenediamine, tetraethylene pentamine and the like. Examples of the secondary aliphatic amine may include: dimethylamine, diethylamine, di-n-propylamine, diisopropyl amine, di-n-butylamine, diisobutyl amine, di-sec-butylamine, dipentylamine, dicyclopentyl amine, dihexyl amine, dicyclohexyl amine, diheptylamine, dioctylamine, dinonylamine, didecylamine, didodecylamine, dicetylamine, N,N-dimethyl methylenediamine, N,N-dimethyl ethylenediamine, N,N-dimethyl tetraethylene pentamine and the like. Examples of the tertiary aliphatic amine may include: trimethylamine, triethylamine, tri-n-propylamine, triisopropyl amine, tri-n-butyl amine, triisobutyl amine, tri-sec-butyl amine, tripentyl amine, tricyclopentyl amine, trihexyl amine, tricyclohexyl amine, triheptyl amine, trioctyl amine, trinonyl amine, tridecyl amine, tridodecyl amine, tricetyl amine, N,N,N',N'-tetra methyl methylene diamine, N,N,N',N'-tetramethyl ethylenediamine, N,N,N',N'-tetramethyl tetraethylene pentamine and the like.

Moreover, examples of the mixed amines may include: a dimethyl ethylamine, methyl ethyl propyl amine, benzylamine, phenethyl amine, benzyl dimethylamine, and the like.

Examples of the aromatic amines and the heterocyclic amines may include: an aniline derivative (for example, aniline, N-methyl aniline, and N-ethyl aniline, N-propyl aniline, N,N-dimethylaniline, 2-methyl aniline, 3-methyl aniline, 4-methyl aniline, ethyl aniline, propyl aniline, trimethyl aniline, 2-nitroaniline, 3-nitroaniline, 4-nitroaniline, 2,4-dinitro aniline, 2,6-dinitro aniline, 3,5-dinitro aniline, N,N-dimethyl toluidine and the like), diphenyl(p-tolyl) amine, methyl diphenylamine, triphenylamine, phenylenediamine, naphthylamine, diamino naphthalene, a pyrrole derivative (for example, pyrrole, 2H-pyrrole, 1-methyl pyrrole, 2,4-dimethyl pyrrole, 2,5-dimethyl pyrrole, N-methyl pyrrole, and the like), oxazole derivative (for example, oxazole, isoxazole and the like), a thiazole derivative (for example, thiazole, isothiazole, and the like), an imidazole derivative (for example, imidazole, 4-methyl imidazole, 4-methyl-2-phenyl imidazole and the like), a pyrazole derivative, a furazan derivative, a pyrroline derivative (for example, pyrroline, 2-methyl-1-pyrroline and the like), a pyrrolidine derivative (for example, pyrrolidine, N-methyl pyrrolidine, pyrrolidinone, N-methyl pyrolidone and the like), an imidazoline derivative, an imidazolidine derivative, a pyridine derivative (for example, pyridine, methyl pyridine, ethyl pyridine, propyl pyridine, butyl pyridine, 4-(1-butyl pentyl)pyridine, dimethyl pyridine, trimethyl pyridine, triethyl pyridine, phenyl pyridine, 3-methyl-2-phenyl pyridine, 4-tert-butyl pyridine, diphenyl pyridine, benzyl pyridine, methoxy pyridine, butoxy pyridine, dimethoxy pyridine, 1-methyl-2-pyridone, 4-pyrrolidino pyridine, 1-methyl-4-phenyl pyridine, 2-(1-ethylpropyl)pyridine, amino pyridine, dimethyl amino pyridine and the like), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (for example, quinoline, 3-quinoline carbonitrile, and the like), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, 1,10-phenanthroline derivative, an adenine derivative, an adenosine derivative, a guanine derivative, a guanosine derivative, an uracil derivative, an uridine derivative and the like.

Furthermore, examples of a compound containing nitrogen which has a carboxyl group may include: aminobenzoic acid, indole carboxylic acid, and an amino acid derivative (for example, nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, methoxy alanine) and the like.

Examples of a compound containing nitrogen which has a sulfonyl group may include: 3-pyridine sulfonic acid, p-toluenesulfonic acid pyridinium and the like. Examples of a compound containing nitrogen which has a hydroxyl group, a compound containing nitrogen which has a hydroxy phenyl group, and an alcohol compound containing nitrogen may include: 2-hydroxy pyridine, amino cresol, 2,4-quinoline diol, 3-Indole methanol hydrate, monoethanolamine, diethanolamine, triethanolamine, N-ethyl diethanolamine, N,N-diethyl ethanolamine, triisopropanol amine, 2,2'-iminodiethanol, 2-amino ethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxy ethyl)pyrrolidine, 1-(2-hydroxyethyl)-2-pyrrolidinone, 3-piperidinone-1,2-propanediol, 3-pyrrolidino-1,2-propanediol, 8-hydroxy julolidine, 3-quinuclidinol, 3-tropanol, 1-methyl-2-pyrrolidine ethanol, 1-aziridine ethanol, N-(2-hydroxyethyl)phthalimide, N-(2-hydroxyethyl)isonicotinamide, and the like.

Examples of an amide derivative may include: formamide, N-methyl formamide, N,N-dimethylformamide, acetamide, N-methyl acetamide, N,N-dimethylacetamide, propione amide, benzamide, and the like.

Examples of an imido derivative may include: phthalimide, succinimide, maleimide, or the like.

Furthermore, one or more selected from the basic compound represented by following general formula (B)-1 can also be added.

$$N(X)_n(Y)_{3-n} \quad (B)\text{-}1$$

(In the formula, n is 1, 2, or 3. The side chain X may be the same or different, and represent the following general formulae (X)-1 to (X)-3. The side chain Y may be the same or different, and represent a hydrogen atom or a linear, branched or cyclic alkyl group having 1-20 carbon atoms which may contain an ether group or a hydroxyl group. Moreover, X may bond each other and form a ring.)

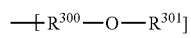  (X)-1

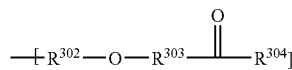  (X)-2

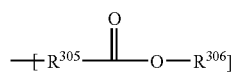  (X)-3

In the formulae, $R^{300}$, $R^{302}$, and $R^{305}$ represent a linear or branched alkylene group having 1-4 carbon atoms, and $R^{301}$ and $R^{304}$ represent a hydrogen atom or a linear, branched or cyclic alkyl group having 1-20 carbon atoms, or an aryl group having 6-20 carbon atoms, which may contain one or more of a hydroxy group, an ether group, an ester group, and a lactone ring.

$R^{303}$ represents a single bond, or a linear or branched alkylene group having 1-4 carbon atoms, $R^{306}$ represents a linear, branched or cyclic alkyl group having 1-20 carbon atoms, which may contain one or more of a hydroxy group, an ether group, an ester group, and a lactone ring.

Examples of the compound represented by the general formula (B)-1 may be as follows:

Tris(2-methoxy methoxy ethyl)amine, tris{2-(2-methoxy ethoxy)ethyl}amine, tris{2-(2-methoxy ethoxy methoxy)ethyl}amine, tris{2-(1-methoxyethoxy)ethyl}amine, tris{2-(1-ethoxy ethoxy)ethyl}amine, tris{2-(1-ethoxy propoxy)ethyl}amine, tris[2-{2-(2-hydroxy ethoxy)ethoxy}ethyl]amine, 4,7,13,16,21,24-hexaoxa-1,10-diazabicyclo[8.8.8] hexacosane, 4,7,13,18-tetraoxa-1,10-diazabicyclo[8.5.5] eicosane, 1,4,10,13-tetraoxa-7,16-diazabicyclo octadecane, 1-aza-12-crown-4, 1-aza-15-crown-5, 1-aza-18-crown-6, tris(2-formyloxy-ethyl)amine, tris(2-formyloxy-ethyl)amine, tris(2-acetoxy ethyl)amine, tris(2-propionyloxy-ethyl)amine, tris(2-butylyloxy-ethyl)amine, tris(2-isobutyryl oxyethyl)amine, tris(2-valeryloxy-ethyl)amine, tris(2-pivaloyloxy-ethyl)amine, N,N-bis(2-acetoxy ethyl)2-(acetoxyacetoxy)ethylamine, tris(2-methoxycarbonyl oxyethyl)amine, tris(2-tert-butoxy carbonyl oxy-ethyl)amine, tris[2-(2-oxo propoxy)ethyl]amine, tris[2-(methoxycarbonyl methyl)oxy-ethyl]amine, tris[2-(tert-butoxycarbonylmethyloxy)ethyl]amine, tris[2-(cyclohexyloxy carbonylmethyloxy)ethyl]amine, tris(2-methoxycarbonyl ethyl)amine, tris (2-ethoxy carbonyl ethyl)amine, N,N-bis(2-hydroxy ethyl)2-(methoxycarbonyl)ethylamine, N,N-bis(2-acetoxyethyl)2-(methoxycarbonyl)ethylamine, N,N-bis(2-hydroxy ethyl)2-(ethoxy carbonyl)ethylamine, N,N-bis(2-acetoxy ethyl)2-(ethoxy carbonyl)ethylamine, N,N-bis(2-hydroxy ethyl)2-(2-methoxy ethoxy carbonyl)ethylamine, N,N-bis(2-acetoxy ethyl)2-(2-methoxy ethoxy carbonyl)ethylamine, N,N-bis(2-hydroxy ethyl)2-(2-hydroxy ethoxy carbonyl)ethylamine, N,N-bis(2-acetoxy ethyl)2-(2-acetoxy ethoxy carbonyl)ethylamine, N,N-bis(2-hydroxy ethyl)2-[(methoxycarbonyl)methoxycarbonyl]ethylamine, N,N-bis(2-acetoxy ethyl)2-[(methoxycarbonyl)methoxycarbonyl]ethylamine, N,N-bis (2-hydroxy ethyl)-2-(2-oxo propoxy carbonyl)ethylamine, N,N-bis(2-acetoxy ethyl)-2-(2-oxo propoxy carbonyl)ethylamine, N,N-bis(2-hydroxy ethyl)2-(tetrahydro furfuryl oxycarbonyl)ethylamine, N,N-bis(2-acetoxy ethyl)2-(tetrahydro furfuryl oxy-carbonyl)ethylamine, N,N-bis(2-hydroxy ethyl) 2-[(2-oxo tetrahydrofuran-3-yl )oxy-carbonyl]ethylamine, N,N-bis(2-acetoxy ethyl)2-[(2-oxo-tetrahydrofuran-3-yl) oxy-carbonyl]ethylamine, N,N-bis(2-hydroxy ethyl)2-(4-hydroxy butoxy carbonyl)ethylamine, N,N-bis(2-formyl oxyethyl)2-(4-formyloxybutoxy carbonyl)ethylamine, N,N-bis (2-formyl oxy-ethyl)2-(2-formyloxy ethoxy carbonyl) ethylamine, N,N-bis(2-methoxy ethyl)2-(methoxycarbonyl) ethylamine, N-(2-hydroxy ethyl)bis[2-(methoxycarbonyl) ethyl]amine, N-(2-acetoxy ethyl)bis[2-(methoxycarbonyl) ethyl]amine, N-(2-hydroxy ethyl)bis[2-(ethoxy carbonyl) ethyl]amine, N-(2-acetoxy ethyl)bis[2-(ethoxycarbonyl) ethyl]amine, N-(3-hydroxy-1-propyl)bis[2-(methoxycarbonyl)ethyl]amine, N-(3-acetoxy-1-propyl)bis [2-(methoxycarbonyl)ethyl]amine, N-(2-methoxy ethyl)bis [2-(methoxycarbonyl)ethyl]amine, N-butylbis[2-(methoxycarbonyl)ethyl]amine, N-butylbis[2-(2-methoxy ethoxy carbonyl)ethyl]amine, N-methyl bis(2-acetoxy ethyl) amine, N-ethyl bis(2-acetoxy ethyl)amine, N-methyl bis(2-pivaloyloxy-ethyl)amine, N-ethyl bis[2-(methoxy carbonyloxy)ethyl]amine, N-ethyl bis[2-(tert-butoxycarbonyloxy) ethyl]amine, tris(methoxycarbonyl methyl)amine, tris (ethoxy carbonyl methyl)amine, N-butyl bis (methoxycarbonyl methyl)amine, N-hexyl bis (methoxycarbonyl methyl)amine, and β-(diethylamino)-δ-valerolactone. However they are not limited thereto.

Furthermore, one or more kinds of a basic compound with the cyclic structure represented in the following general formula (B)-2 can also be added.

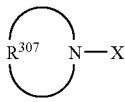
(B)-2

(In the formula, X represents the same as explained above, $R^{307}$ represents a linear or branched alkylene group having 2-20 carbon atoms, which may contain one or more of a carbonyl group, an ether group, an ester group, or a sulfide.)

Specific examples of (B)-2 may include: 1-[2-(methoxy methoxy)ethyl]pyrrolidine, 1-[2-(methoxy methoxy)ethyl]piperidine, 4-[2-(methoxy methoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidino ethyl acetate, 2-morpholino ethyl acetate, 2-(1-pyrrolidinyl)ethyl formate, 2-piperidino ethyl propionate, 2-morpholino ethyl acetoxy acetate, 2-(1-pyrrolidinyl)ethyl methoxy acetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidino propionate, methyl 3-morpholino propionate, methyl 3-(thiomorpholino)propionate, methyl 2-methyl-3-(1-pyrrolidinyl)propionate, ethyl 3-morpholino propionate, methoxycarbonyl methyl 3-piperidino propionate, 2-hydroxy ethyl 3-(1-pyrrolidinyl)propionate, 2-acetoxy ethyl 3-morpholino propionate, 2-oxo tetrahydrofuran-3-yl 3-(1-pyrrolidinyl)propionate, tetrahydrofurfuryl 3-morpholino propionate, glycidyl 3-piperidino propionate, 2-methoxy ethyl 3-morpholino propionate, 2-(2-methoxyethoxy)ethyl 3-(1-pyrrolidinyl)propionate, butyl 3-morpholino propionate, cyclohexyl 3-piperidino propionate, α-(1-pyrrolidinyl)methyl-γ-butyrolactone, β-piperidino-γ-butyrolactone, β-morpholino-δ-valerolactone, methyl 1-pyrrolidinyl acetate, methyl piperidino acetate, methyl morpholino acetate, methyl thio morpholino acetate, ethyl 1-pyrrolidinyl acetate, 2-methoxy ethyl morpholino acetate, and the like.

Furthermore, the basic compound containing a cyano group represented by the general formula (B)-3 to (B)-6 can be added.

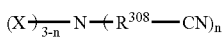
(B)-3

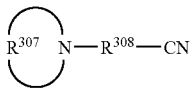
(B)-4

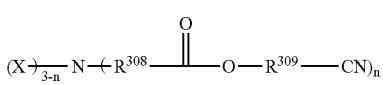
(B)-5

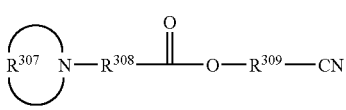
(B)-6

(In the formulae, X, $R^{307}$, and n are the same as explained above, and $R^{308}$ and $R^{309}$ are the same or different, and represent a linear or branched alkylene group having 1-4 carbon atoms.)

Examples of the basic compound comprising a cyano group may include: 3-(diethylamino)propiononitrile, N,N-bis(2-hydroxy ethyl)-3-amino propiononitrile, N,N-bis(2-acetoxy ethyl)-3-amino propiononitrile, N,N-bis(2-formyl oxy-ethyl)-3-amino propiononitrile, N,N-bis(2-methoxy ethyl)-3-amino propiononitrile, N,N-bis[2-(methoxy methoxy)ethyl]-3-amino propiononitrile, methyl N-(2-cyanoethyl)-N-(2-methoxy ethyl)-3-amino propionate, methyl N-(2-cyanoethyl)-N-(2-hydroxy ethyl)-3-amino propionate, methyl N-(2-acetoxy ethyl)-N-(2-cyanoethyl)-3-amino propionate, N-(2-cyanoethyl)-N-ethyl-3-amino propiononitrile, N-(2-cyanoethyl)-N-(2-hydroxy ethyl)-3-amino propiononitrile, N-(2-acetoxy ethyl)-N-(2-cyanoethyl)-3-amino propiononitrile, N-(2-cyanoethyl)-N-(2-formyl oxy-ethyl)-3-amino propiononitrile, N-(2-cyanoethyl)-N-(2-methoxy ethyl)-3-amino propiononitrile, N-(2-cyanoethyl)-N-[2-(methoxy methoxy)ethyl]-3-amino propiononitrile, N-(2-cyanoethyl)-N-(3-hydroxy-1-propyl)-3-amino propiononitrile, N-(3-acetoxy-1-propyl)-N-(2-cyanoethyl)-3-amino propiononitrile, N-(2-cyanoethyl)-N-(3-formyloxy-1-propyl)-3-amino propiononitrile, N-(2-cyanoethyl)-N-tetrahydrofurfuryl-3-amino propiononitrile, N,N-bis(2-cyanoethyl)-3-amino propiononitrile, diethyl amino acetonitrile, N,N-bis(2-hydroxy ethyl)amino acetonitrile, N,N-bis(2-acetoxy ethyl)amino acetonitrile, N,N-bis(2-formyl oxy-ethyl) amino acetonitrile, N,N-bis(2-methoxy ethyl)amino acetonitrile, N,N-bis[2-(methoxy methoxy)ethyl]amino acetonitrile, methyl N-cyanomethyl-N-(2-methoxy ethyl)-3-amino propionate, methyl N-cyanomethyl-N-(2-hydroxy ethyl)-3-amino propionate, methyl N-(2-acetoxy ethyl)-N-cyanomethyl-3-amino propionate, N-cyanomethyl-N-(2-hydroxy ethyl) amino acetonitrile, N-(2-acetoxy ethyl)-N-(cyanomethyl) amino acetonitrile, N-cyanomethyl-N-(2-formyloxy-ethyl) amino acetonitrile, N-cyanomethyl-N-(2-methoxy ethyl) amino acetonitrile, N-cyanomethyl-N-[2-(methoxy methoxy)ethyl]amino acetonitrile, N-(cyanomethyl)-N-(3-hydroxy-1-propyl)amino acetonitrile, N-(3-acetoxy-1-propyl)-N-(cyanomethyl)amino acetonitrile, N-cyanomethyl-N-(3-formyloxy-1-propyl)amino acetonitrile, N,N-bis (cyanomethyl)amino acetonitrile, 1-pyrrolidine propionitrile, 1-piperidine propiononitrile, 4-morpholine propiononitrile, 1-pyrrolidine acetonitrile, 1-piperidine acetonitrile, 4-morpholine acetonitrile, cyanomethyl 3-diethyl amino propionate, cyanomethyl N,N-bis(2-hydroxy-ethyl)-3-amino propionate, cyanomethyl N,N-bis(2-acetoxy ethyl)-3-amino propionate, cyanomethyl N,N-bis(2-formyloxy-ethyl)-3-amino propionate, cyanomethyl N,N-bis(2-methoxy ethyl)-3-amino propionate, cyanomethyl N,N-bis[2-(methoxy methoxy)ethyl]-3-amino propionate, (2-cyanoethyl)3-diethyl amino propionate, (2-cyanoethyl)N,N-bis(2-hydroxy ethyl)-3-amino propionate, (2-cyanoethyl) N,N-bis(2-acetoxyethyl)-3-amino propionate, (2-cyanoethyl)N,N-bis(2-formyl oxy-ethyl)-3-amino propionate, (2-cyanoethyl)N,N-bis(2-methoxy ethyl)-3-amino propionate, (2-cyanoethyl)N,N-bis[2-(methoxy methoxy)ethyl]-3-amino propionate, cyanomethyl 1-pyrrolidine propionate, cyanomethyl 1-piperidine propionate, cyanomethyl 4-morpholine propionate, (2-cyanoethyl)1-pyrrolidine propionate, (2-cyanoethyl)1-piperidine propionate, (2-cyanoethyl)4-morpholine propionate, and the like.

The blending amount of the basic compound in the resist composition of the present invention is preferably 0.001 to 10 parts, especially 0.01 to 1 parts to 1 part of an acid generator. If the amount is 0.001 parts or more, the blending effects is sufficiently achived. If the blending amount is 10 parts or less, there is little possibility that resolution or sensitivity may be lowered.

A dissolution accelerator can be further added as a resist composition of the present invention. As the dissolution accelerator, a compound comprising a fluoroalcohol group like hexafluoro alcohol is preferably used. Examples of the dissolution accelerator can be shown below.

Furthermore, a dissolution inhibitor can be further added as a resist composition of the present invention. As the dissolution inhibitor, a compound in which a hydroxyl group of alcohol of the dissolution accelerator shown below is substituted with an acid labile group is preferably used. As an acid labile group, above-mentioned groups can be used.

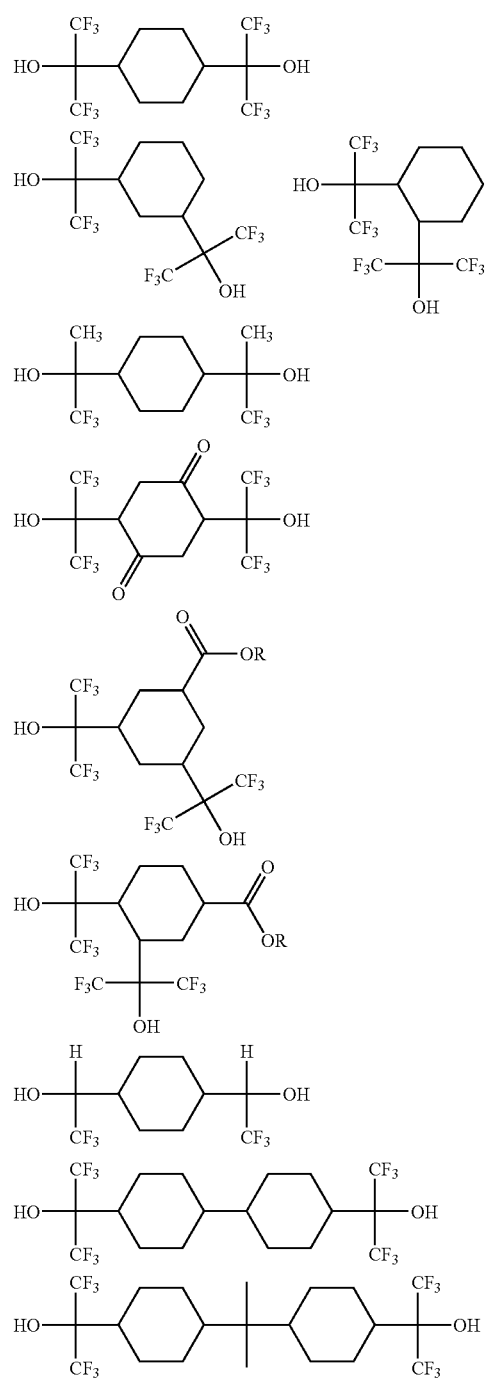

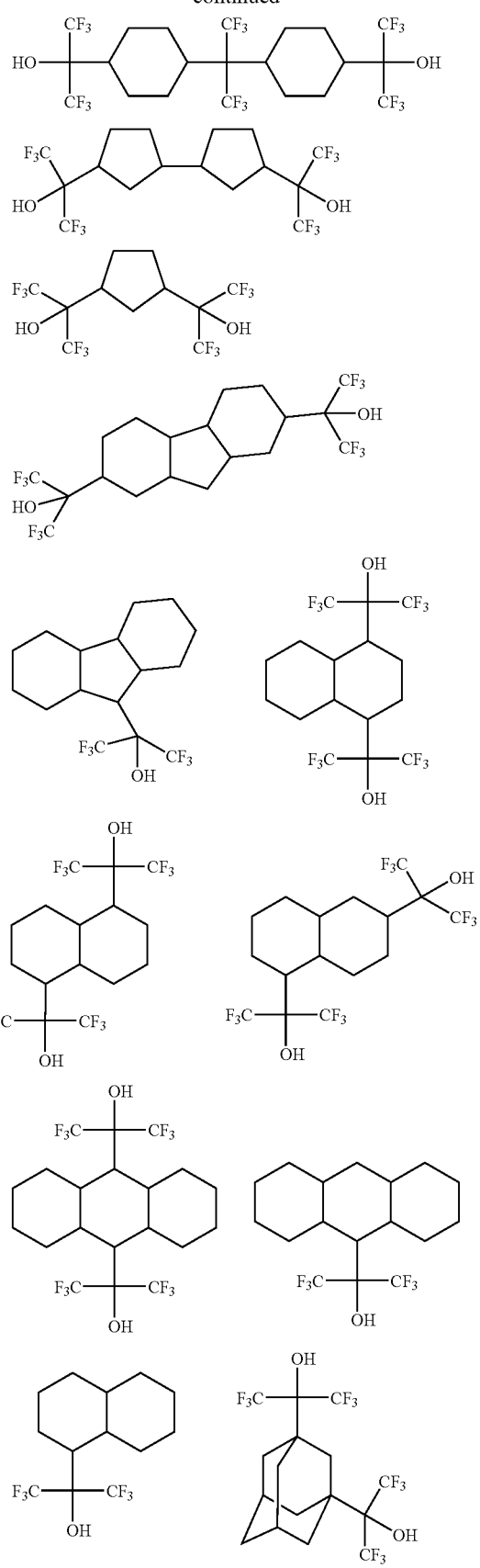

-continued

-continued
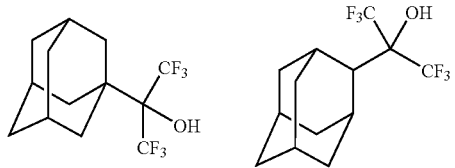
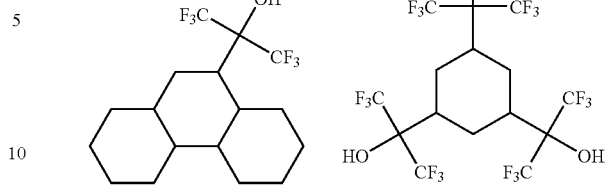
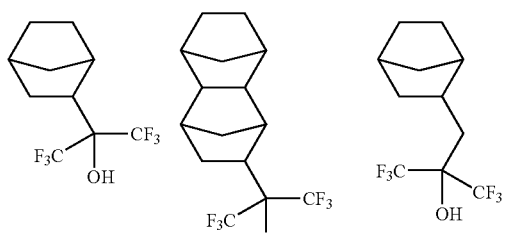
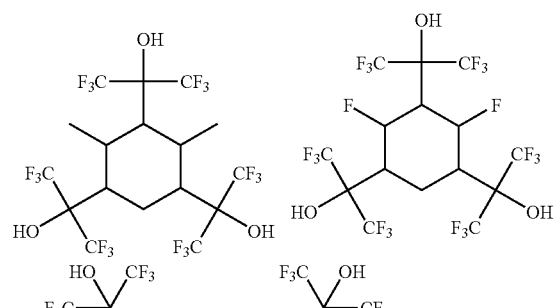
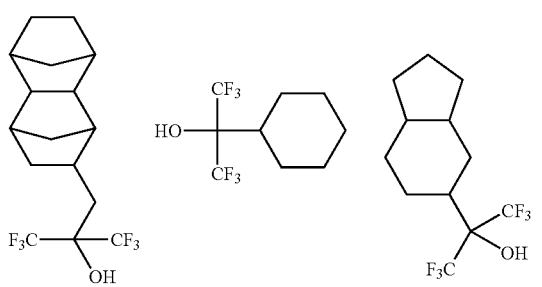
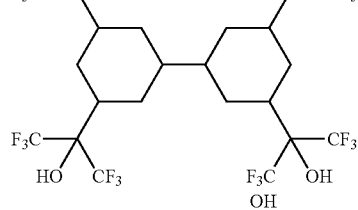
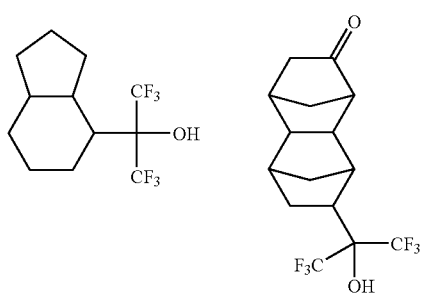
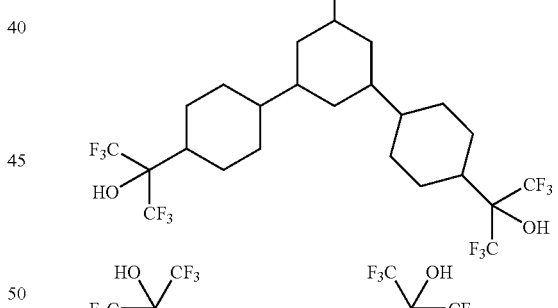
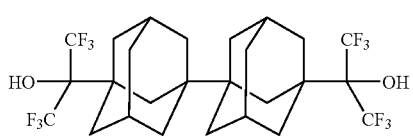
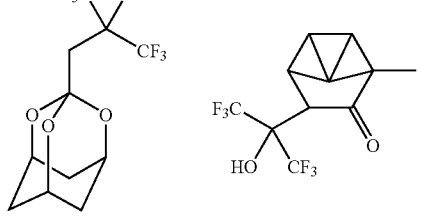
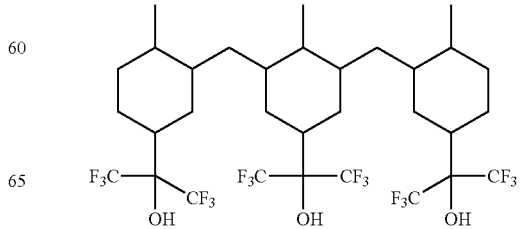

-continued
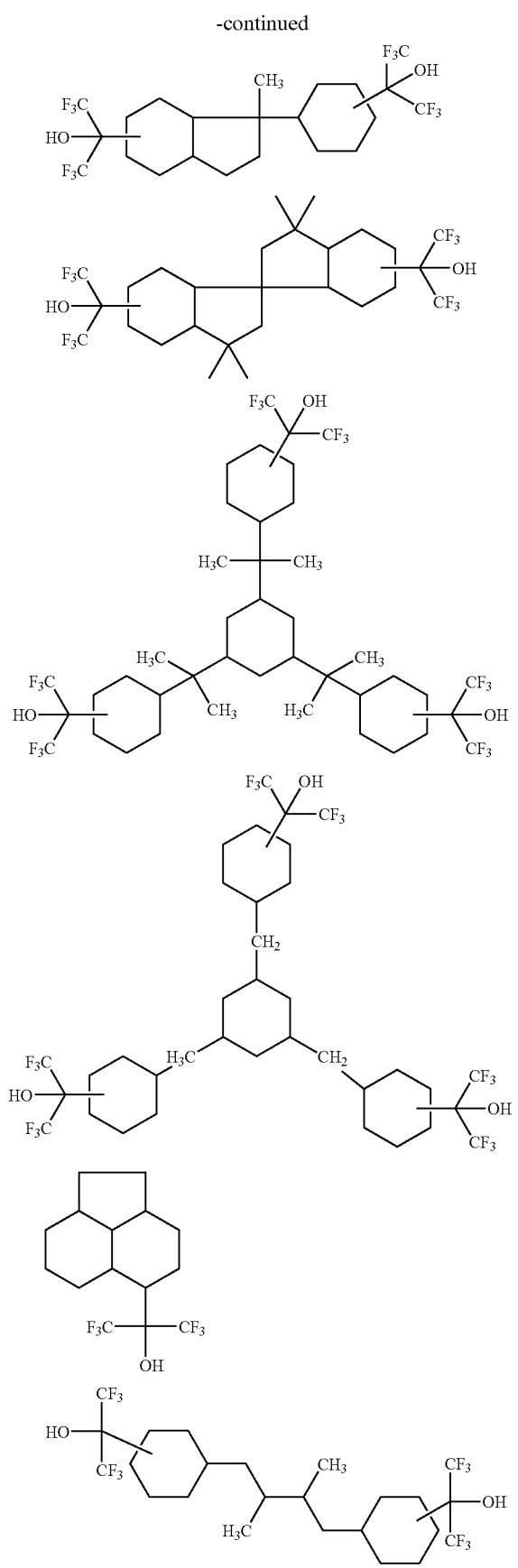
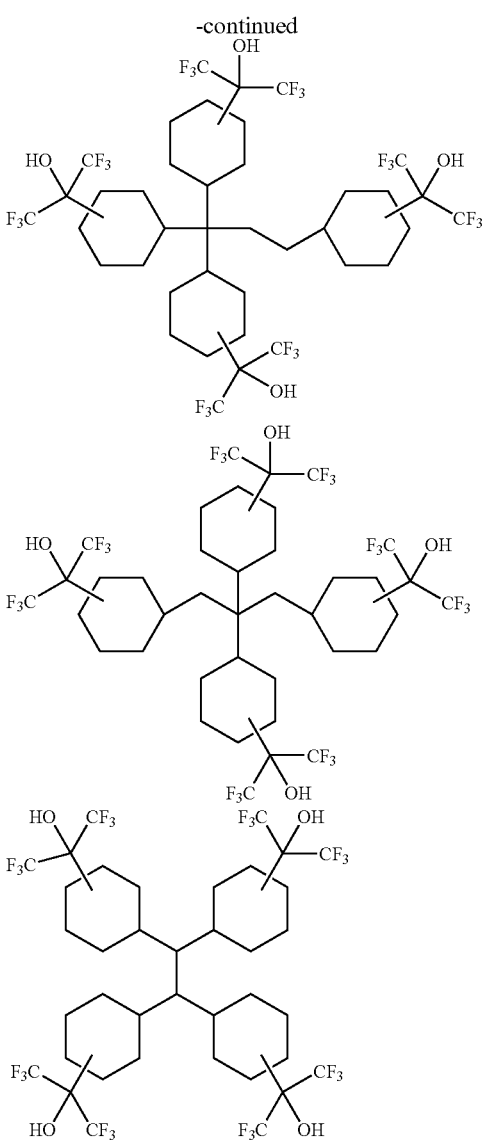
Furthermore, an acetylene alcohol derivative can be blended in the resist composition of the present invention as an additive, and thereby, preservation stability can be improved.
As the acetylene alcohol derivative, compounds represented by the following general formulae (S1) and (S2) can be used suitably.
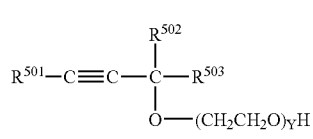
S1
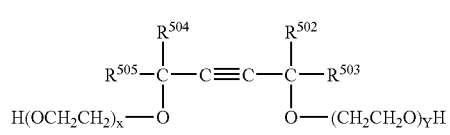
S2

(In the formulae, $R^{501}$, $R^{502}$, $R^{503}$, $R^{504}$, and $R^{505}$ are independently a hydrogen atom or a linear, branched or cyclic alkyl group having 1-8 carbon atoms, and X and Y represent 0 or positive numbers, which satisfy the following equation: $0 \leq X \leq 30$, $0 \leq Y \leq 30$, and $0 \leq X+Y \leq 40$.)

Examples of acetylene alcohol derivative may include: Surfynol 61, Surfynol 82, Surfynol 104, Surfynol 104E, Surfynol 104H, Surfynol 104A, Surfynol TG, Surfynol PC, Surfynol 440, Surfynol 465, Surfynol 485 (manufactured by Air Products and Chemicals Inc.), Surfynol E1004 (manufactured by Nisshin Kagaku Kogyo corporation) and the like.

The amount of addition of the above-mentioned acetylene alcohol derivative is preferably 0.01 to 2 mass %, more preferably 0.02 to 1 mass % in 100 mass % of the resist composition. If the amount is 0.01 mass % or more, the improvement effect of an application property and a preservation stability is achieved sufficiently. If the amount is 2 mass % or less, there is little possibility that the resolution of resist composition may be lowered.

A surfactant commonly used in order to improve application property can be added in the resist composition of the present invention as an arbitrary component in addition to the above-mentioned component. The amount of addition of the arbitrary component is in the range the effect of the present invention is not impeded.

The surfactant is preferably non-ionic one. Examples thereof may include: perfluoro alkyl polyoxyethylene ethanol, fluorinated alkyl ester, perfluoro alkylamine, oxide, perfluoro alkyl EO addition product, a fluorine-containing organosiloxane compound, and the like. For example, Fluorad "FC-430", "FC-431", "FC-4430" (all are manufactured by Sumitomo 3M), Surflon "S-141", "S-145", "KH-20", "KH-40" (all are manufactured by Asahi Glass Co., Ltd.), Unidyne "DS-401", "DS-403", "DS-451" (all are manufactured by Daikin Industries, LTD.), MEGAFACE "F-8151" (manufactured by Dainippon Ink Industry), "X-70-092", "X-70-093" (all are manufactured by Shin-Etsu Chemical Co., Ltd.), and the like can be exemplified. Preferably, Fluorad "FC-430", "FC-4430" (manufactured by Sumitomo 3M), "X-70-093" (manufactured by Shin-Etsu Chemical Co., Ltd.) and "KH-20" (manufactured by Asahi Glass Co., Ltd.) are exemplified.

Furthermore, an acid amplifier can be added in the resist composition of the present invention. Because acid diffusion of a polymeric acid generator is considerably restricted, there is a drawback in positive resist composition that contrast of deprotection reaction tends to be lowered. Then, it is effective to improve contrast by adding an acid amplifier as disclosed in Japanese Patent Application Laid-open (KOKAI) No. 2000-34272 and in Japanese Patent Application Laid-open (KOKAI) No. 2002-6481.

The amount of addition of the above-mentioned acid amplifier is preferably 0 to 20 parts by mass, more preferably 0-15 parts by mass to 100 parts by mass of a polymeric acid generator. If the amount is 20 parts or less, there is little possibility that the transparency may be lowered and the resolution may be lowered because acid diffusion is amplified.

In order to form a pattern using the resist composition of the present invention, a well-known lithography technology can be adopted.

For example, the resist composition is applied on substrates such as a silicon wafer so that a thickness may be 0.03-1.0 μm by technique such as spin coating, it is then pre-baked at 60-180° C. for 20 seconds-10 minutes, preferably at 80-150° C. for 30 seconds-5 minutes on a hot plate, and thereby a resist film is formed. Subsequently, a mask for forming a target pattern is held above the above-mentioned resist film, irradiated with high-energy beams such as an ArF excimer laser, far ultraviolet rays, an X-ray, and an electron ray, so that an exposure dose may be about 1-100 mJ/cm$^2$, preferably about 5-80 mJ/cm$^2$, and then is subjected to postexposure bake (PEB) on a hot plate, at 60-150° C. for 20 seconds-5 minutes, preferably at 80-130° C. for 30 seconds-3 minutes.

Next, the target pattern is formed on the substrate by developing for 10 seconds-3 minutes, preferably for 15 seconds-2 minutes using a developer of an alkali solution such as 0.1 to 5%, preferably 2 to 3% tetramethyl ammonium hydroxide (TMAH), according to a conventional method, such as a dip method, a puddle method, and a spray method. The composition of the present invention is extremely suitable especially for micropatterning using ArF excimer laser at the wavelength of 193 nm among high-energy beam.

Moreover, the resist composition according to the present invention can be applicable to the liquid immersion lithography. In the liquid immersion lithography, a gap between a projection lens and a wafer is filled with a liquid of which refractive index is high, and a substrate is exposed through the liquid. In the liquid immersion lithography using ArF excimer laser light, water has been under review as the liquid. In addition, as the liquid with higher refractive index, alcohols like ethylene glycol, phosphoric acid, alumina dispersion water, etc. are under review. By employing the resist composition using polymeric sulfonium salt as a base resin according to the present invention, an excellent resist pattern can be obtained because an acid generator is insoluble in water, thus the resist composition is preferably applicable to the liquid immersion lithography in particular.

EXAMPLE

Although Synthetic examples, Polymer synthetic examples, Examples, and Comparative example will be shown and the present invention will be explained in detail hereafter, the present invention is not restricted to the following Examples.

Synthetic Example 1

Synthesis of 4-tert-butoxyphenyl diphenyl sulfonium, perfluoro-4-ethylcyclohexyl sulfonate 20.1 g (0.040 mole) of 4-tert-butoxyphenyl diphenyl sulfonium p-toluene sulfonate and 19.8 g (0.040 mole) of potassium perfluoro-4-ethylcyclohexane sulfonate were added to 200 g of dichloromethane and 200 g of water and the solution was stirred for 2 hours at room temperature. Insoluble was filtered and an organic layer was extracted. Next, the organic layer was washed with 200 g of water 5 times. Dichloromethane was removed by evaporation under reduced pressure using a rotary evaporator. Diethyl ether was added to the obtained 36 g of residue and recrystallization was performed. Filtration under reduced pressure and drying under reduced pressure were performed to obtain 22.5 g of white crystal of desired product (Yield: 71.2%).

The result of time-of-flight mass spectrometer (TOFMS) and nuclear magnetic resonance spectrum (1H-NMR) in respect to the obtained compound is shown below.

TOFMS (MALDI)
    POSITIVE M+335 (corresponding to 4-tert-BuOPhS+(Ph)2)
    M+279 (corresponding to 4-HOPhS+(Ph)2; a tert-butoxy group was severed on analysis)

NEGATIVE M−461 (corresponding to 4-C2F5-C6F10-SO3-)

1H-NMR (CDC13: ppm) 1.48 (9H, singlet, Ha), 7.22-7.25 (2H, doublet, Hb) 7.65-7.76 (12H, multiplet, Hc)

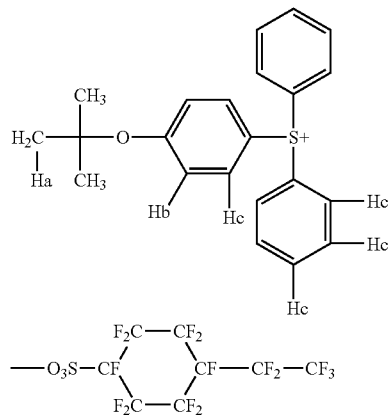

Synthetic Example 2

Synthesis of oxyphenyl diphenyl sulfonium 4-methacrylate, perfluoro-4-ethylcyclohexyl sulfonate 20 g (0.025 mole) of 4-tert-butoxyphenyl diphenyl sulfonium, perfluoro-4-ethylcyclohexyl sulfonate obtained in the Synthetic Example 1 was dissolved into 200 g of dichloromethane, further 0.6 g (0.0025 mole) of 10-camphorsulfonic acid was added thereto and the solution was stirred on heating for 4 hours at 40° C. The resulting solution was cooled with ice, 2.7 g (0.026 mole) of methacryloylchloride was added thereto and 2.8 g (0.028 mole) of triethylamine was added at a temperature of less than 10° C. 2.0 g of 10-camphorsulfonic acid was added to the solution, further 100 g of water was added, and the organic layer was extracted. Next, the organic layer was washed with 200 g of water 5 times. Dichloromethane was removed by evaporation under reduced pressure using a rotary evaporator. Diethyl ether was added to the obtained residue and recrystallization was performed. Filtration under reduced pressure and drying under reduced pressure were performed to obtain 9.6 g of white crystal of desired product (Yield: 47%).

The result of time-of-flight mass spectrometer (TOFMS) and nuclear magnetic resonance spectrum (1H-NMR) in respect to the obtained compound is shown below.

TOFMS (MALDI)
POSITIVE M+347 (corresponding to 4-(CH2=C(CH3)—CO—O PhS+(Ph)2)
NEGATIVE M−461 (corresponding to 4-C2F5-C6F10-SO3-)

1H-NMR (CDC13: ppm)
2.046-2.050 (3H, triplet, Ha) 5.840-5.859 (1H, multiplet, Hb), 6.373-6.387 (1H, multiplet, Hc), 7.482-7.512 (2H, doublet, Hd), 7.65-7.86 (12H, multiplet, He)

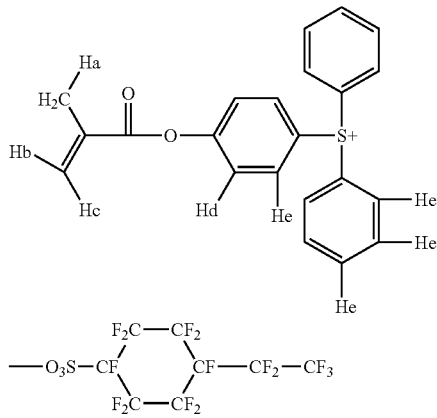

The sulfonium salt having a polymerizable unsaturated bond obtained at the Synthetic Example 2 was used to synthesize polymers according to the present invention hereafter.

Polymer Synthetic Example 1

To 100 mL flask were added 4.0 g of oxyphenyl diphenyl sulfonium 4-methacrylate, perfluoro-4-ethylcyclohexyl sulfonate obtained at the Synthetic Example 2, 7.4 g of 2-adamantylethyl methacrylate, 9.7 g of 5-oxo-4-oxatricyclo [4.2.1.0$^{3,7}$]nonan-2-yl methacrylate, 4.2 g of 3-hydroxy-1-adamantyl methacrylate, and 30 g of tetrahydrofuran as a solvent. This vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 18.1 g of white polymer was obtained.

The obtained polymer was analyzed by $^{13}$C, $^1$H-NMR and GPC measurement, and the following results were obtained.
Copolymerization Ratio
a11:b11:c11:d11=0.05:0.30:0.45:0.20
Mass average-molecular-weight (Mw)=9,200
This polymer is defined as Polymer 1.

(polymer1)

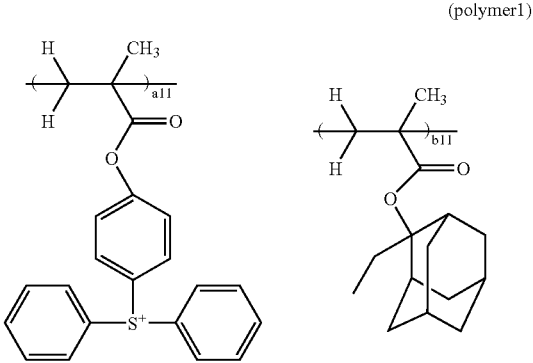

-continued

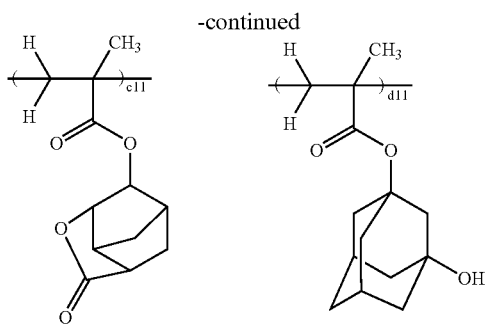

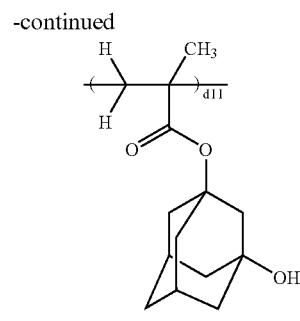

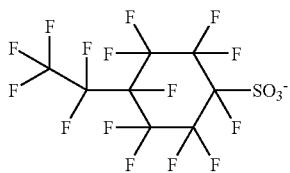

Polymer Synthetic Example 2

To 100 mL flask were added 4.0 g of oxyphenyl diphenyl sulfonium 4-methacrylate, perfluoro-4-ethylcyclohexyl sulfonate obtained at the Synthetic Example 2, 7.4 g of 2-adamantylethyl methacrylate, 7.6 g of 5-oxo-4-oxatricyclo [4.2.1.0$^{3,7}$]nonan-2-yl methacrylate, 4.2 g of 3-hydroxy-1-adamantyl methacrylate, 5.0 g of 3,5-bis[3,3,3-trifluoro-2-hydroxy-2-trifluoroethylpropyl]cyclohexyl methacrylate and 30 g of tetrahydrofuran as a solvent. This vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 19.9 g of white polymer was obtained.

The obtained polymer was analyzed by $^{13}$C, $^{1}$H-NMR and GPC measurement, and the following results were obtained.
Copolymerization Ratio
a11:b11:c11:d11:d12=0.050:0.30:0.35:0.20:0.10
Mass average-molecular-weight (Mw)=8,700
This polymer is defined as Polymer 2.

(polymer2)

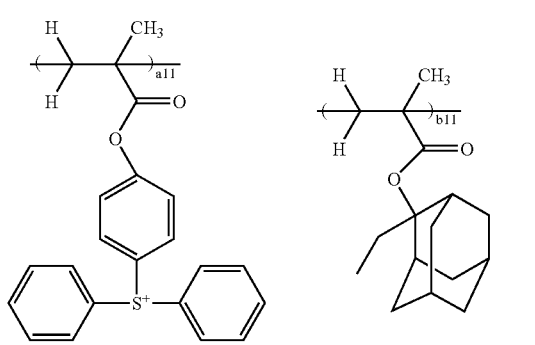

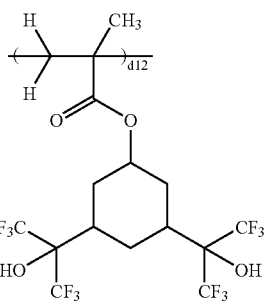

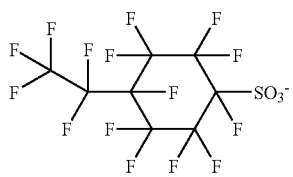

Polymer Synthetic Example 3

To 100 mL flask were added 4.0 g of oxyphenyl diphenyl sulfonium 4-methacrylate, perfluoro-4-ethylcyclohexyl sulfonate, 7.4 g of 2-adamantylethyl methacrylate, 6.5 g of 5-oxo-4-oxatricyclo[4.2.1.0$^{3,7}$]nonan-2-yl methacrylate, 4.2 g of 3-hydroxy-1-adamantyl methacrylate, 5.4 g of 5,6-[3,3, 3-trifluoro-2-hydroxy-2-trifluoromethylpropyl]bicyclo [2.2.1]hept-2-yl methacrylate and 30 g of tetrahydrofuran as a solvent. This vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 mL of isopropyl alcohol, the obtained white solid was taken by filtration and then dried under reduced pressure at 60° C., and 17.5 g of white polymer was obtained.

The obtained polymer was analyzed by $^{13}C$, $^1H$-NMR and GPC measurement, and the following results were obtained.

Copolymerization Ratio a11:b11:c11:d11:d13=0.05:0.30:0.30:0.20:0.15 (polymer3)

Mass average-molecular-weight (Mw)=9,800

This polymer is defined as Polymer 3.

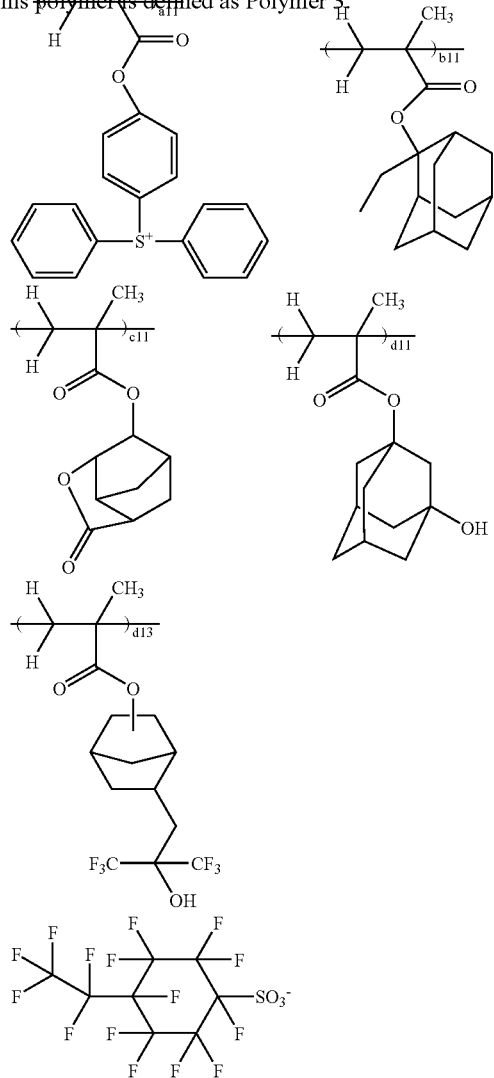

Polymer Synthetic Example 4

To 100 mL flask were added 4.0 g of oxyphenyl diphenyl sulfonium 4-methacrylate, perfluoro-4-ethylcyclohexyl sulfonate, 8.2 g of 3-ethyl-3-exotetracyclo[4.4.0.1$^{2,5}$.1$^{7,10}$] dodecanyl methacrylate, 8.9 g of 3-oxo-2,7-dioxatricyclo [4.2.1.0$^{4,8}$]-9-nonyl methacrylate, 5.9 g of 3-hydroxy-1-adamantyl methacrylate and 30 g of tetrahydrofuran as a solvent. This vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 19.4 g of white polymer was obtained.

The obtained polymer was analyzed by $^{13}C$, $^1H$-NMR and GPC measurement, and the following results were obtained.

Copolymerization Ratio a11:b12:c12:d11=0.05:0.30:0.40:0.25

Mass average-molecular-weight (Mw)=7,600

This polymer is defined as Polymer 4.

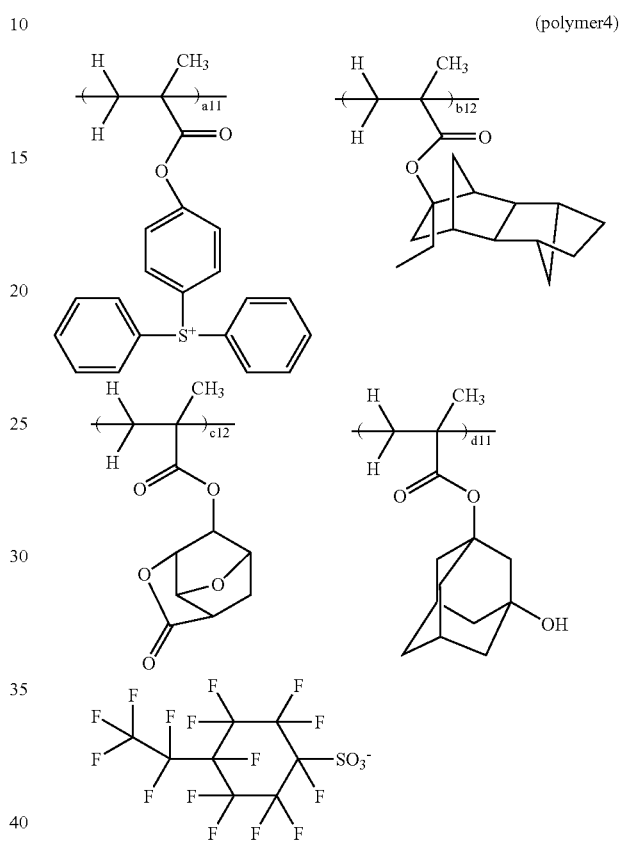

(polymer4)

Polymer Synthetic Example 5

To 100 mL flask were added 8.0 g of oxyphenyl diphenyl sulfonium 4-methacrylate, perfluoro-4-ethylcyclohexyl sulfonate, 8.2 g of 3-ethyl-3-exotetracyclo[4.4.0.1$^{2,5}$.1$^{7,10}$] dodecanyl methacrylate, 7.8 g of 3-oxo-2,7-dioxatricyclo [4.2.1.0$^{4,8}$]-9-nonyl methacrylate, 5.1 g of 3-hydroxy-1-adamantyl methacrylate and 30 g of tetrahydrofuran as a solvent. This vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 20.9 g of white polymer was obtained.

The obtained polymer was analyzed by $^{13}C$, $^1H$-NMR and GPC measurement, and the following results were obtained.

Copolymerization Ratio a11:b12:c12:d11=0.10:0.30:0.40:0.20

Mass average-molecular-weight (Mw)=8,400

This polymer is defined as Polymer 5.

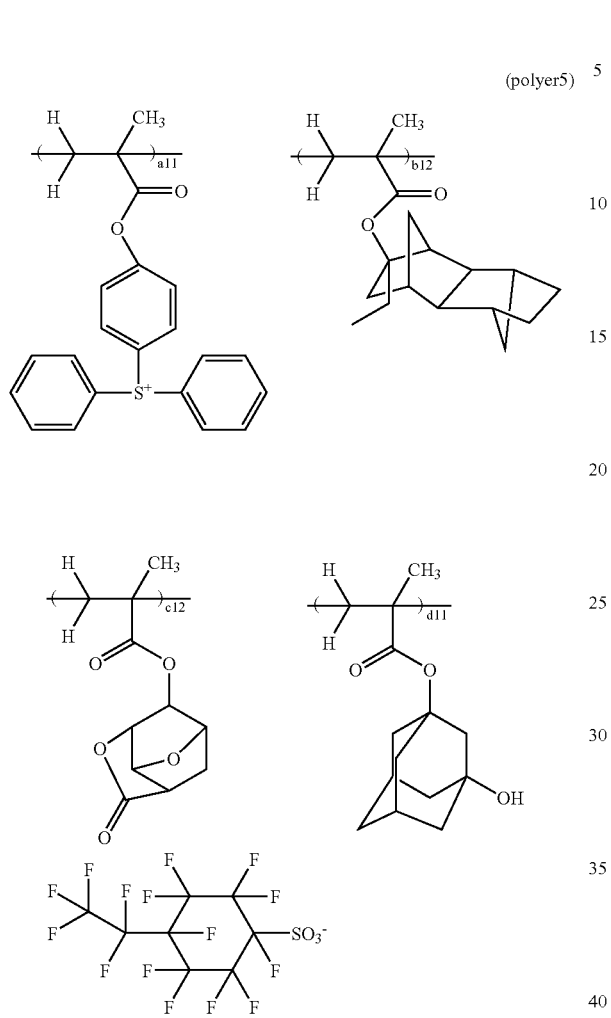

(polyer5)

This polymer is defined as Polymer 6.

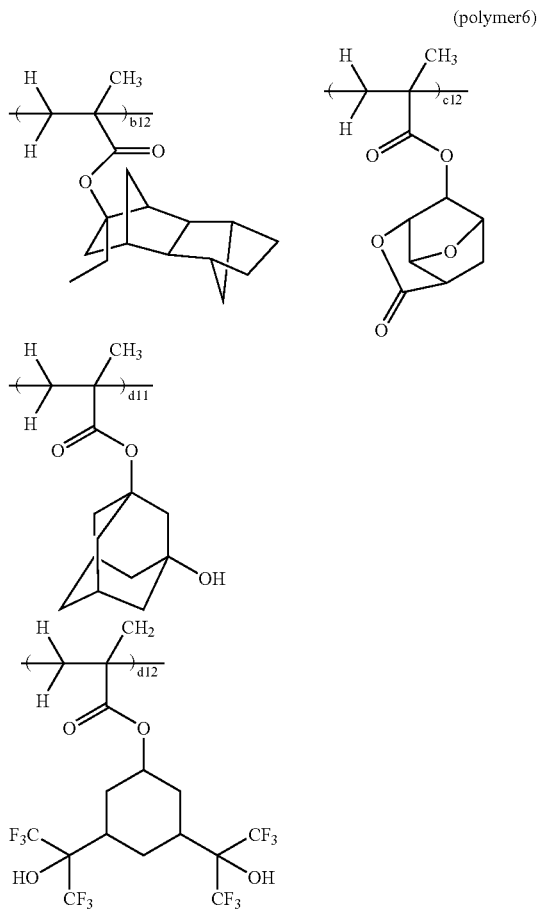

(polymer6)

Polymer Synthetic Example 6

To 100 mL flask were added 8.2 g of 3-ethyl-3-exotetracyclo[4.4.0.1$^{2,5}$.1$^{7,10}$]dodecanyl methacrylate, 7.8 g of 3-oxo-2,7-dioxatricyclo[4.2.1.0$^{4,8}$]-9-nonyl methacrylate, 5.9 g of 3-hydroxy-1-adamantyl methacrylate, 5.0 g of 3,5-bis[3,3,3-trifluoro-2-hydroxy-2-trifluoroethylpropyl]cyclohexyl methacrylate and 30 g of tetrahydrofuran as a solvent. This vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 19.3 g of white polymer was obtained.

The obtained polymer was analyzed by $^{13}$C, $^{1}$H-NMR and GPC measurement, and the following results were obtained.

Copolymerization Ratio
b12:c12:d11:d12=0.30:0.35:0.25:0.10
Mass average-molecular-weight (Mw)=8,300

Polymer Synthetic Example 7

Metathesis polymer (ROMP-E) manufactured by Mitsui Chemical is defined as Polymer 7.

Copolymerization Ratio
h1:i1:j1=0.35:0.15:0.50
Mass average-molecular-weight (Mw)=8,100

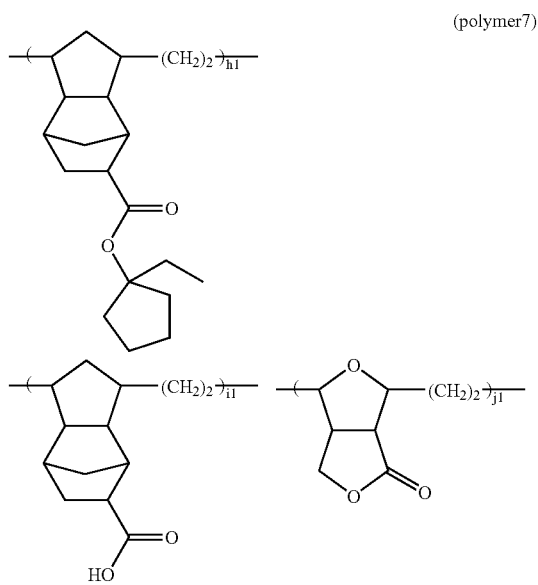

(polymer7)

Polymer Synthetic Example 8

To 100 mL flask were added 8.0 g of oxyphenyl diphenyl sulfonium 4-methacrylate, perfluoro-4-ethylcyclohexyl sulfonate, 7.4 g of 2-adamantylethyl methacrylate, 9.2 g of 3-hydroxy-1-adamantyl methacrylate, 11.0 g of 3,5-bis[3,3,3-trifluoro-2-hydroxy-2-trifluoroethylpropyl]cyclohexyl methacrylate and 30 g of tetrahydrofuran as a solvent. This vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 39.8 g of white polymer was obtained.

The obtained polymer was analyzed by $^{13}C$, $^1H$-NMR and GPC measurement, and the following results were obtained.
Copolymerization Ratio
a11:b11:d11:d12=0.10:0.30:0.40:0.20
Mass average-molecular-weight (Mw)=8,500
This polymer is defined as Polymer 8.

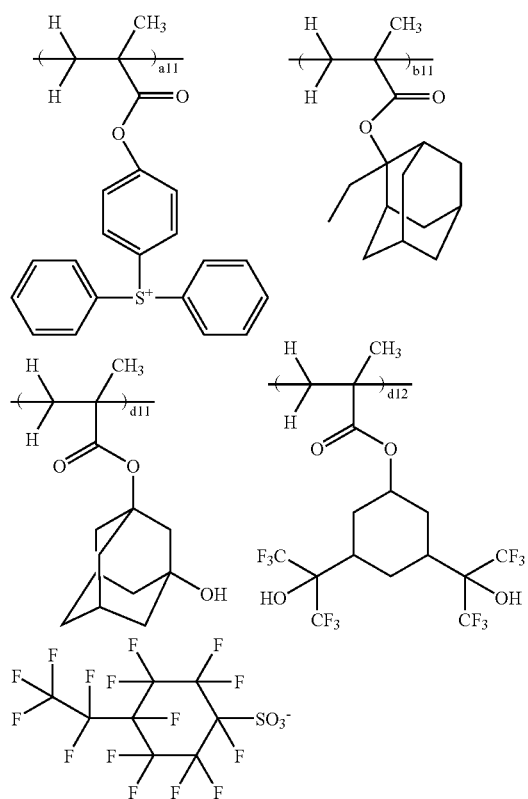

(polymer8)

Polymer Synthetic Example 9

To 100 mL flask were added 12.0 g of oxyphenyl diphenyl sulfonium 4-methacrylate, perfluorobutane sulfonate, 7.4 g of 2-adamantylethyl methacrylate, 9.8 g of 3-oxo-2,7-dioxatricyclo[4.2.1.0$^{4,8}$]-9-nonyl methacrylate, 15.0 g of 4-hydroxystyrene and 30 g of tetrahydrofuran as a solvent. This vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 39.8 g of white polymer was obtained.

The obtained polymer was analyzed by $^{13}C$, $^1H$-NMR and GPC measurement, and the following results were obtained.
Copolymerization Ratio
a12:b11:c12:d14=0.15:0.25:0.20:0.40
Mass average-molecular-weight (Mw)=7,900
This polymer is defined as Polymer 9.

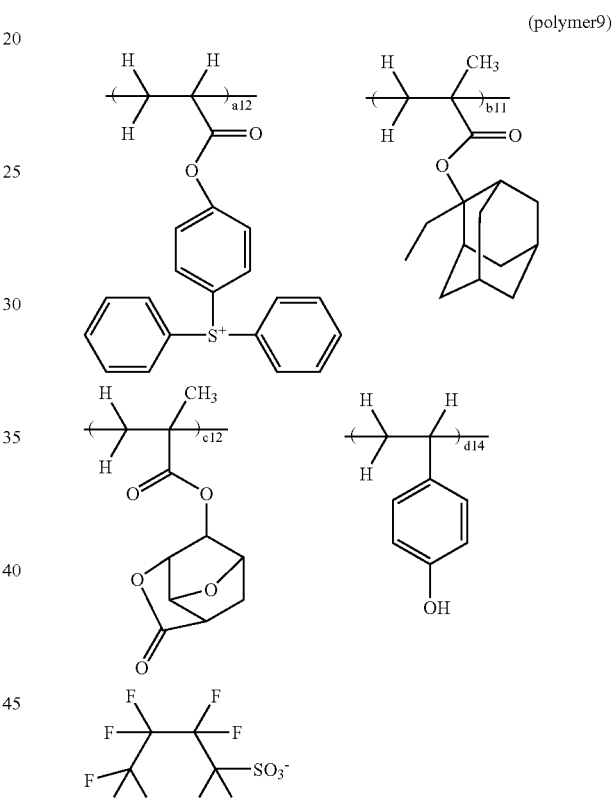

(polymer9)

Polymer Synthetic Example 10

To 100 mL flask were added 7.4 g of 2-adamantylethyl methacrylate, 9.8 g of 3-oxo-2,7-dioxatricyclo[4.2.1.0$^{4,8}$]-9-nonyl methacrylate, 19.0 g of 4-hydroxystyrene and 30 g of tetrahydrofuran as a solvent. This vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 39.8 g of white polymer was obtained.

The obtained polymer was analyzed by $^{13}C$, $^{1}H$-NMR and GPC measurement, and the following results were obtained.

Copolymerization Ratio
b11:c12:d14=0.25:0.30:0.45
Mass average-molecular-weight (Mw)=7,800
This polymer is defined as Polymer 10.

(polymer10)

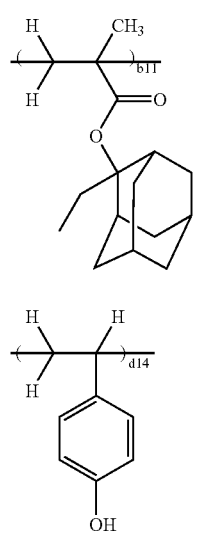
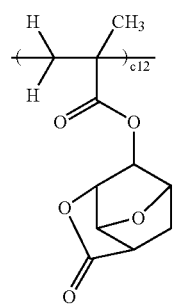

EXAMPLES, COMPARATIVE EXAMPLES
[Preparation of Resist Composition]

Polymers synthesized above Polymer Synthetic Examples 1-8, an acid generator (PAG1, PAG2 and PAG3), an acid amplifier (PAAG1), a dissolution inhibitor (DRI-1), a dissolution accelerator (DRR-1) and a basic compound (2NapMp and AdMp) represented in the following formulae were dissolved into a solvent containing 0.01 mass % of FC-430 (manufactured by Sumitomo 3M) at composition shown in the following Table 1, and the solutions were filtered through a 0.2 μm Teflon(trademark) filter to prepare resist solutions, respectively.

Each composition in the Table 1 is as follows. Polymer 1-Polymer 8: obtained from Polymer Synthetic Examples 1-8

Acid generator: PAG1, PAG2 and PAG3 (refer to the following structural formulae)

PAG 1

PAG 2

PAG 3

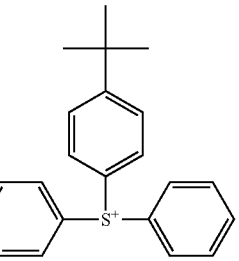
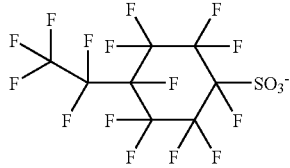
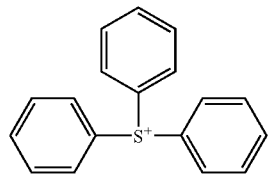
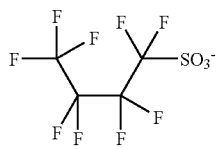

Acid amplifier: PAAG1 (refer to the following structural formula)

(PAAG 1)

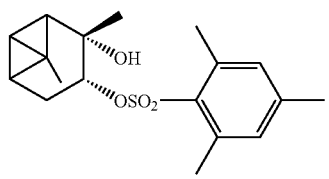

Dissolution inhibitor: DRI-1 (refer to the following structural formula)

(DRI-1)

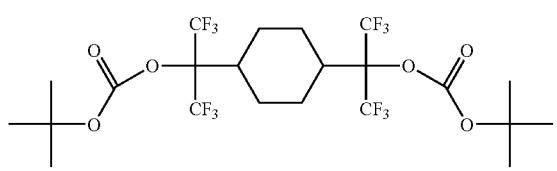

Dissolution accelerator: DRR-1 (refer to the following structural formula)

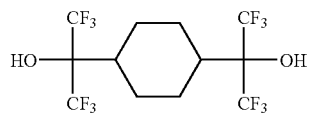

(DRR-1)

Basic compound: 2NapMp and AdMp (refer to the following structural formulae)

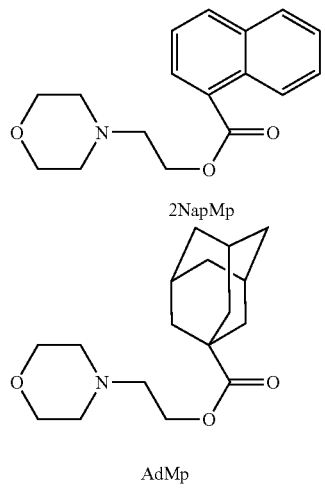

2NapMp

AdMp

Organic-solvent: PGMEA (propylene glycol methyl ether acetate), CyHO(cyclohexanone)

[Evaluation of Exposure Patterning]

A solution of antireflection coating (ARC-29A manufactured by Nissan Chemical Industries, Ltd.) was coated on a silicon substrate and was baked at 200° C. for 60 seconds to give an antireflection coating (78 nm thick). Each of the resist composition prepared above (Examples 1-13 and Comparative examples 1-3) was spin-coated onto the antireflection coating formed on the substrate, and was baked (prebaked) at 120° C. for 60 seconds on a hot plate to give a 200 nm thick resist film.

The substrates were exposed using the ArF excimer laser micro stepper (S305B, NA=0.68, σ0.85, ⅔ annular illumination, Cr mask, manufactured by Nikon), baked (PEB) at 120° C. for 90 seconds, and developed for 60 seconds in 2.38% aqueous solution of tetramethylammonium hydroxide, to give positive pattern (Examples 1-13 and Comparative examples 1-3).

The obtained resist pattern was evaluated as follows and the results were shown in the Table 1.

An exposure dose when 0.12 μm group of line and space pattern was resolved in 1:1 was determined as an optimum exposure dose (Eop, mJ/cm$^2$), and the minimum line and space pattern size (μm) which could be resolved at the exposure dose was determined as resolution of the resist to be evaluated.

TABLE 1

| resist composition | polymer (parts by mass) | acid generator/ acid amplifier (parts by mass) | dissolution inhibitor/ dissolution accelerator (parts by mass) | basic compounds (parts by mass) | organic solvent (parts by wmass) | Sensitivity (mJ/cm$^2$) | resolution (um) |
|---|---|---|---|---|---|---|---|
| example 1 | polymer 1 (80) | — | — | 2NapMp (0.60) | PGMEA (800) | 48.0 | 0.11 |
| example 2 | polymer 2 (80) | — | — | 2NapMp (0.60) | PGMEA (800) | 43.0 | 0.11 |
| example 3 | polymer 3 (80) | — | — | 2NapMp (0.60) | PGMEA (800) | 42.0 | 0.11 |
| example 4 | polymer 4 (80) | — | — | 2NapMp (0.60) | PGMEA (800) | 43.0 | 0.11 |
| example 5 | polymer 5 (40) polymer 6 (40) | — | — | 2NapMp (0.60) | PGMEA (800) | 38.0 | 0.11 |
| example 6 | polymer 5 (40) polymer 7 (40) | — | — | 2NapMp (0.60) | PGMEA (600) CyHo (200) | 26.0 | 0.12 |
| example 7 | polymer 1 (40) polymer 6 (40) | PAG1 (2.0) | — | 2NapMp (0.60) | PGMEA (800) | 38.0 | 0.10 |
| example 8 | polymer 1 (40) polymer 6 (40) | PAG2 (2.0) | — | 2NapMp (0.60) | PGMEA (800) | 38.0 | 0.10 |
| example 9 | polymer 8 (40) polymer 6 (40) | — | — | 2NapMp (0.60) | PGMEA (800) | 40.0 | 0.12 |

TABLE 1-continued

| resist composition | polymer (parts by mass) | acid generator/ acid amplifier (parts by mass) | dissolution inhibitor/ dissolution accelerator (parts by mass) | basic compounds (parts by mass) | organic solvent (parts by wmass) | Sensitivity (mJ/cm$^2$) | resolution (um) |
|---|---|---|---|---|---|---|---|
| example 10 | polymer 1 (80) | — | — | AdMp (0.70) | PGMEA (800) | 39.0 | 0.11 |
| example 11 | polymer 1 (80) | PAAG1 (1.2) | — | 2NapMp (0.60) | PGMEA (800) | 31.0 | 0.11 |
| example 12 | polymer 1 (80) | — | DRR-1 (8) | 2NapMp (0.60) | PGMEA (800) | 41.0 | 0.11 |
| example 13 | polymer 1 (80) | — | DRI-1 (8) | 2NapMp (0.60) | PGMEA (800) | 39.0 | 0.11 |
| comparative example 1 | polymer 6 (80) | PAG1 (5.5) | — | 2NapMp (0.6) | PGMEA (800) | 28.0 | 0.11 |
| comparative example 2 | polymer 6 (80) | PAG2 (5.5) | — | 2NapMp (0.6) | PGMEA (800) | 38.0 | 0.10 |
| comparative example 3 | polymer 6 (80) | PAG3 (3.5) | — | 2NapMp (0.6) | PGMEA (800) | 22.0 | 0.10 |

[Observation of a Resist Pattern Profile Through Pseudo Liquid Immersion Exposure]

Next, using each of the solution of resist composition prepared above (Examples 1-13 and Comparative examples 1-3), resist film was formed, exposed and developed according to the same way as mentioned above, and 110 nm line and space pattern profile after development was observed.

Moreover, resist film was formed, exposed and developed according to the same way as mentioned above, except that a rinse of 300 seconds using pure water was performed between prebake and exposure (before exposure), and/or between exposure and PEB (after exposure), and 110 nm line and space pattern profile after development was observed.

The obtained results were shown in the Table 2.

TABLE 2

| resist composition | ordinary process | rinse before exposure | rinse after exposure | rinse before exposure + rinse after exposure |
|---|---|---|---|---|
| example 1 | rectangle | rectangle | rectangle | rectangle |
| example 2 | rectangle | rectangle | rectangle | rectangle |
| example 3 | rectangle | rectangle | rectangle | rectangle |
| example 4 | rectangle | rectangle | rectangle | rectangle |
| example 5 | rectangle | rectangle | rectangle | rectangle |
| example 6 | rectangle | rectangle | rectangle | rectangle |
| example 7 | rectangle | rectangle | rectangle | rectangle |
| example 8 | rectangle | rectangle | rectangle | rectangle |
| example 9 | rectangle | rectangle | rectangle | rectangle |
| example 10 | rectangle | rectangle | rectangle | rectangle |
| example 11 | rectangle | rectangle | rectangle | rectangle |
| example 12 | rectangle | rectangle | rectangle | rectangle |
| example 13 | rectangle | rectangle | rectangle | rectangle |
| comparative example 1 | rather taper | rather taper | rather T-top and taper | rather T-top and taper |
| comparative example 2 | rectangle | rectangle | rather T-top | rather T-top |
| comparative example 3 | rectangle | rather T-top | intense T-top | intense T-top |

[Evaluation of electron beam lithography]

In the Evaluation of lithography, polymers shown in the Polymer Synthetic Examples 9 and 10 were dissolved into a solvent according to the composition shown in the Table 3, and the solutions were filtered through a 0.2 μm filter to prepare positive resist compositions, respectively.

Obtained positive resist compositions were spin-coated on a silicon substrate 6 inches across by Clean Track Mark 5(Manufactured by Tokyo Electron Limited), and were baked at 110° C. for 90 seconds on a hot plate to give a 100 nm thick resist film. Lithography was performed on the resist film in a vacuum chamber by HL-800D manufactured by Hitach Ltd. at 50 keV of HV voltage.

Post exposure bake (PEB) was performed immediately after lithography using Clean Track Mark 5(Manufactured by Tokyo Electron Limited) at 110° C. for 90 seconds on a hot plate. And the puddle development was performed for 30 seconds in 2.38 mass % aqueous solution of TMAH, to give positive pattern.

The obtained resist pattern was evaluated as follows.

An exposure dose when 0.12 μm line and space pattern was resolved in 1:1 was determined as sensitivity of resist, and the minimum line and space pattern size which could be resolved at the exposure dose was determined as resolution of the resist to be evaluated.

The resist compositions and the results of sensitivity and resolution at electron beam exposure were shown in the Table 3.

TABLE 3

| resist composition | polymer (parts by mass) | acid generator (parts by mass) | basic compounds (parts by mass) | dissolution inhibitor (parts by mass) | organic solvent (parts by mass) | sensitivity (uC) | resolution (um) |
|---|---|---|---|---|---|---|---|
| example 14 | polymer 9 (100) | — | triethanol amine (0.2) | — | PGMEA (1000) | 6 | 0.07 |

TABLE 3-continued

| resist composition | polymer (parts by mass) | acid generator (parts by mass) | basic compounds (parts by mass) | dissolution inhibitor (parts by mass) | organic solvent (parts by mass) | sensitivity (uC) | resolution (um) |
|---|---|---|---|---|---|---|---|
| comparative example 4 | polymer 10 (100) | PAG3 (10.0) | triethanol amine (0.2) | — | PGMEA (1000) | 12 | 0.09 |

The acid generator PAG3 and the organic solvent PGMEA in the Table 3 was the same as those in the Table 1.

From the results of the Tables 1 and 2, it has been confirmed that the resist composition according to the present invention (Examples 1-13) have high sensitivity and high resolution, deformation doesn't occur after long rinse of water in comparison with the Comparative Examples 1-3, thus they are adequately applicable to the liquid immersion exposure.

From the results of the Table 3, it has been confirmed that the resist composition according to the present invention (Examples 14) has high sensitivity and high resolution in electron beam exposure, and the resist composition provides higher performance than the case in which only a monomeric acid generator is added (Comparative Example 4).

The present invention is not limited to the above-described embodiments. The above-described embodiments are mere examples, and those having the substantially same structure as that described in the appended claims and providing the similar action and effects are included in the scope of the present invention.

What is claimed is:

1. A resist composition comprising a polymer in which:
   a sulfonium salt having a polymerizable unsaturated double bond,
   a (meth)acrylate having a lactone or a hydroxyl group as adhesion group, and
   a (meth)acrylate having an ester substituted with an acid labile group are copolymerized;
   wherein the repeating unit formed from the sulfonium salt having a polymerizable unsaturated bond is represented by the following general formula (1)

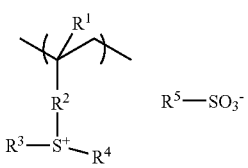

(1)

where:
   $R^1$ represents a hydrogen atom or a methyl group,
   $R^2$ represents any one of:
   —O—$R^6$—,
   —C(=O)—$X^1$—$R^6$—,
   —C(=O)—O—$C_2H_4$—O—$Y^1$—,
   —C(=O)—O-$Z^1$-C(=O)—$CH_2$—,
   —$Z^1$—C(=O)—$CH_2$—,
   —C(=O)—O—$Z^1$—$CH_2$—,
   —C(=O)—O—$CH_2$—C(=O)—O—$Z^1$-, and
   —C(=O)—O—$C_2H_4$—C(=O)—O—$Z^1$-,
   where:
      $X^1$ represents an oxygen atom or NH,
      $R^6$ represents a linear, branched or cyclic alkylene group having 1-6 carbon atoms or a phenylene group which may contain a carbonyl group, an ester group or an ether group,
      $Y^1$ represents any one of a phenylene group, a naphthylene group, and an anthrylene group, and
      $Z^1$ represents a phenylene group,
   $R^3$ and $R^4$ each independently represents:
      a linear, branched or cyclic alkyl group having 1-12 carbon atoms which may contain a carbonyl group, an ester group or an ether group,
      an aryl group having 6-12 carbon atoms,
      an aralkyl group having 7-20 carbon atoms or a thiophenyl group, or
   $R^3$ and $R^4$ may bond each other to form a ring, and
   $R^5$ represents a perfluoro-4-ethylcyclohexyl group.

2. The resist composition according to claim 1 wherein the resist composition is a chemically amplified positive resist composition.

3. The resist composition according to claim 1 which further contains any one of or more of an organic solvent, a basic compound and a dissolution inhibitor.

4. The resist composition according to claim 2 which further contains any one of or more of an organic solvent, a basic compound and a dissolution inhibitor.

5. A patterning process comprising, at least, a step of applying the resist composition according to claim 1 on a substrate, a step of exposing the applied resist composition to high energy beam after heat-treatment, and a step of developing the exposed resist composition by using a developer.

6. A patterning process comprising, at least, a step of applying the resist composition according to claim 2 on a substrate, a step of exposing the applied resist composition to high energy beam after heat-treatment, and a step of developing the exposed resist composition by using a developer.

7. A patterning process comprising, at least, a step of applying the resist composition according to claim 3 on a substrate, a step of exposing the applied resist composition to high energy beam after heat-treatment, and a step of developing the exposed resist composition by using a developer.

8. A patterning process comprising, at least, a step of applying the resist composition according to claim 4 on a substrate, a step of exposing the applied resist composition to high energy beam after heat-treatment, and a step of developing the exposed resist composition by using a developer.

9. The patterning process according to claim 5, wherein, in the step of exposing the applied resist composition to high energy beam, an ArF excimer laser with a wavelength of 193 nm is used as a light source, a gap between the substrate on which the resist composition is applied and a projection lens is filled with a liquid, and liquid immersion exposure in which the substrate is exposed through the liquid is performed.

10. The patterning process according to claim 6, wherein, in the step of exposing the applied resist composition to high energy beam, an ArF excimer laser with a wavelength of 193 nm is used as a light source, a gap between the substrate on which the resist composition is applied and a projection lens is filled with a liquid, and liquid immersion exposure in which the substrate is exposed through the liquid is performed.

11. The patterning process according to claim 7, wherein, in the step of exposing the applied resist composition to high energy beam, an ArF excimer laser with a wavelength of 193 nm is used as a light source, a gap between the substrate on which the resist composition is applied and a projection lens is filled with a liquid, and liquid immersion exposure in which the substrate is exposed through the liquid is performed.

12. The patterning process according to claim 8, wherein, in the step of exposing the applied resist composition to high energy beam, an ArF excimer laser with a wavelength of 193 nm is used as a light source, a gap between the substrate on which the resist composition is applied and a projection lens is filled with a liquid, and liquid immersion exposure in which the substrate is exposed through the liquid is performed.

* * * * *